(12) United States Patent
Lee et al.

(10) Patent No.: US 11,011,516 B2
(45) Date of Patent: May 18, 2021

(54) INTEGRATED CIRCUIT DEVICE AND METHOD OF MANUFACTURING THE SAME

(71) Applicant: Samsung Electronics Co., Ltd., Suwon-si (KR)

(72) Inventors: Jung-han Lee, Anyang-si (KR); Sun-ghil Lee, Hwaseong-si (KR); Myung-il Kang, Yongin-si (KR); Jeong-yun Lee, Yongin-si (KR); Seung-hun Lee, Hwaseong-si (KR); Hyun-jung Lee, Suwon-si (KR); Sun-wook Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/705,799

(22) Filed: Dec. 6, 2019

(65) Prior Publication Data
US 2020/0111784 A1 Apr. 9, 2020

Related U.S. Application Data

(62) Division of application No. 16/288,727, filed on Feb. 28, 2019, now Pat. No. 10,559,565, which is a (Continued)

(30) Foreign Application Priority Data

Dec. 27, 2016 (KR) ........................ 10-2016-0180140

(51) Int. Cl.
*H01L 27/088* (2006.01)
*H01L 27/11* (2006.01)
(Continued)

(52) U.S. Cl.
CPC .. *H01L 27/0886* (2013.01); *H01L 21/823418* (2013.01); *H01L 27/0207* (2013.01);
(Continued)

(58) Field of Classification Search
CPC ............ H01L 27/0886; H01L 27/1116; H01L 27/0207; H01L 27/0924; H01L 29/0649
See application file for complete search history.

(56) References Cited

U.S. PATENT DOCUMENTS 8,574,995 B2  11/2013  Jeng
8,946,029 B2   2/2015  Wong et al.
(Continued)

FOREIGN PATENT DOCUMENTS

KR   20150125333 A   11/2015

*Primary Examiner* — Christine A Enad
(74) *Attorney, Agent, or Firm* — Harness, Dickey & Pierce, P.L.C.

(57) ABSTRACT

An integrated circuit (IC) device includes a first and a second fin-type active region protruding from a first region and a second region, respectively, of a substrate, a first and a second gate line, and a first and a second source/drain region. The first fin-type active region has a first top surface and a first recess has a first depth from the first top surface. The first source/drain region fills the first recess and has a first width. The second fin-type active region has a second top surface and a second recess has a second depth from the second top surface. The second depth is greater than the first (Continued)

depth. The second source/drain region fills the second recess and has a second width. The second width is greater than the first width.

20 Claims, 43 Drawing Sheets

Related U.S. Application Data division of application No. 15/656,377, filed on Jul. 21, 2017, now Pat. No. 10,256,237.

(51) Int. Cl.
  *H01L 29/06*   (2006.01)
  *H01L 27/02*   (2006.01)
  *H01L 21/8234*   (2006.01)
  *H01L 27/092*   (2006.01)
  *H01L 29/66*   (2006.01)

(52) U.S. Cl.
  CPC ...... *H01L 27/0924* (2013.01); *H01L 27/1104* (2013.01); *H01L 27/1116* (2013.01); *H01L 29/0649* (2013.01); *H01L 29/66545* (2013.01)

(56) References Cited

U.S. PATENT DOCUMENTS

| | | | |
|---|---|---|---|
| 9,147,682 B2 | 9/2015 | Ching et al. | |
| 9,349,836 B2 | 5/2016 | Alptekin et al. | |
| 9,391,201 B2 | 7/2016 | Huang et al. | |
| 9,418,994 B1* | 8/2016 | Chao | H01L 27/0886 |
| 9,431,478 B2 | 8/2016 | Jeong et al. | |
| 9,679,978 B2 | 6/2017 | Kim et al. | |
| 9,728,542 B1 | 8/2017 | Balakrishnan et al. | |
| 2009/0309162 A1* | 12/2009 | Baumgartner | H01L 29/7856 |
| | | | 257/368 |
| 2015/0091059 A1* | 4/2015 | Hung | H01L 29/66795 |
| | | | 257/192 |
| 2015/0171085 A1 | 6/2015 | Fumitake et al. | |
| 2015/0221654 A1* | 8/2015 | Kim | H01L 21/02639 |
| | | | 257/77 |
| 2015/0228762 A1 | 8/2015 | He et al. | |
| 2016/0020150 A1 | 1/2016 | You et al. | |
| 2016/0268312 A1 | 9/2016 | Wang et al. | |
| 2017/0133487 A1 | 5/2017 | Chiang et al. | |

\* cited by examiner

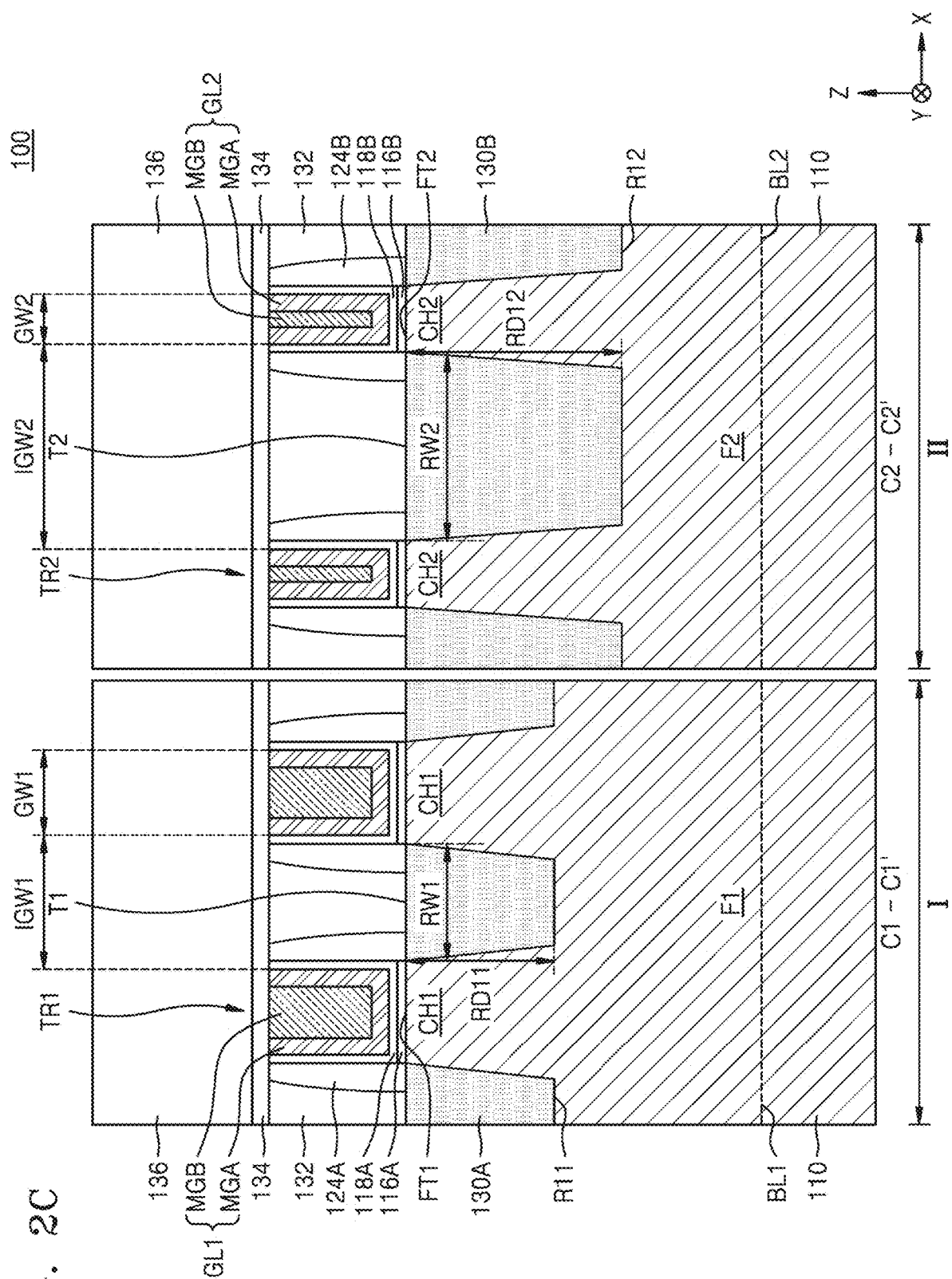

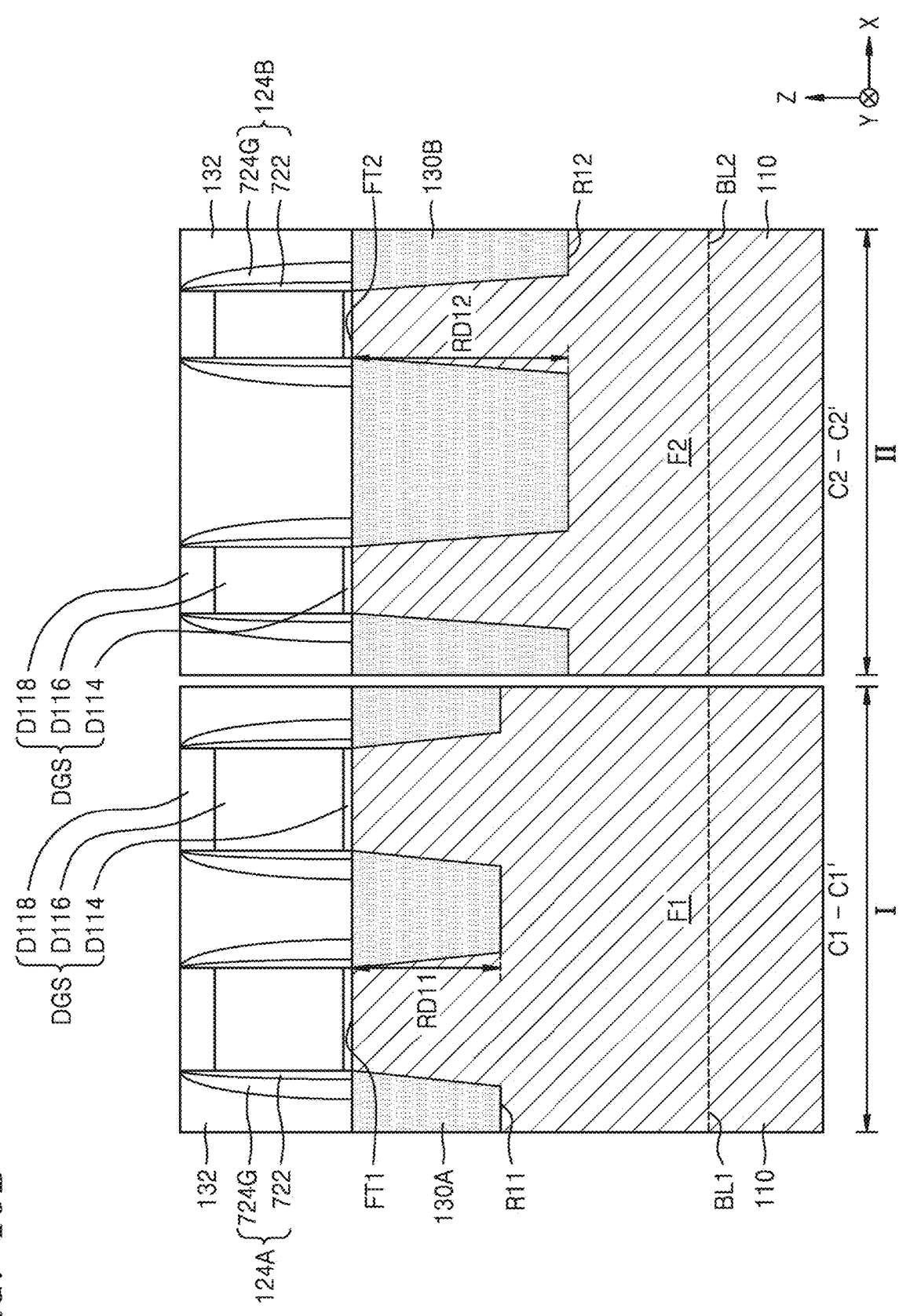

INTEGRATED CIRCUIT DEVICE AND METHOD OF MANUFACTURING THE SAME

CROSS-REFERENCE TO RELATED APPLICATION

This application is a divisional of U.S. application Ser. No. 16/288,727, filed Feb. 28, 2019, which is a divisional of U.S. application Ser. No. 15/656,377, filed on Jul. 21, 2017, which claims the benefit of Korean Patent Application No. 10-2016-0180140, filed on Dec. 27, 2016, in the Korean Intellectual Property Office, the disclosure of each of which is incorporated herein in its entirety by reference.

BACKGROUND

Inventive concepts relate to an integrated circuit (IC) device and a method of manufacturing the same, and more particularly, to an IC device including a field-effect transistor (FET) and a method of manufacturing the same.

Due to the development of electronic technology, IC devices have lately been downscaled at a rapid speed. Since semiconductor devices may require not only a high operating speed but also the accuracy of operations, a wide variety of pieces of research has been conducted into methods of optimizing structures of transistors included in the semiconductor devices.

SUMMARY

Inventive concepts relate to an integrated circuit (IC) device configured to ensure differently required electrical properties according to kinds and structures of devices formed on the same substrate even if the area of a device region is reduced with the downscaling of the IC device.

Inventive concepts also relate to a method of manufacturing an IC device, by which an IC device having an efficient structure may be easily manufactured according to a kind of a unit device so that differently required electrical properties may be ensured according to kinds and structures of devices formed on the same substrate even if the area of a device region is reduced with the downscaling of the IC device.

According to some example embodiments of inventive concepts, an IC device includes a substrate including a first region and a second region. A first fin-type active region protrudes from the substrate in the first region. The first fin-type active region has a first top surface and a first recess having a first depth from the first top surface. A first source/drain region fills the first recess and has a first width. A first gate line covers the first top surface. The first gate line extends in a direction intersecting the first fin-type active region. A second fin-type active region protrudes from the substrate in the second region. The second fin-type active region has a second top surface and a second recess having a second depth from the second top surface. The second depth is greater than the first depth. A second source/drain region fills the second recess and has a second width. The second width is greater than the first width. A second gate line covers the second top surface. The second gate line extends in a direction intersecting the second fin-type active region.

According to some example embodiments of inventive concepts, an IC device including a substrate. The substrate includes a first region and a second region. A plurality of first fin-type active regions protrudes from the substrate in the first region. The plurality of first fin-type active regions extend parallel to one another. Each of the plurality of first fin-type active regions includes a first top surface and a first recess having a first depth from the first top surface. A first source/drain region fills the first recess of one first fin-type active region among the plurality of first fin-type active regions. The first source/drain region has a first width. A plurality of second fin-type active regions protrude from the substrate in the second region. The plurality of second fin-type active regions extend parallel to one another. Each of the plurality of second fin-type active regions include a second top surface and a second recess having a second depth from the second top surface. The second depth is greater than the first depth. A second source/drain region fills the second recesses of the plurality of second fin-type active regions, respectively. The second source/drain region includes a plurality of source/drain branch portions and a source/drain merged portion. The source/drain merged portion is connected to the plurality of source/drain branch portions. The source/drain merged portion extends over the plurality of second fin-type active regions across the plurality of second fin-type active regions. The second source/drain region has a second width. The second width is greater than the first width.

According to some example embodiments of inventive concepts, a method of manufacturing an IC device includes forming a first fin-type active region in a first region of a substrate and forming a second fin-type active region in a second region of the substrate, forming a spacer layer on the substrate, forming a first recess in the first fin-type active region, forming a first source/drain region to fill the first recess, forming a second recess in the second fin-type active region, and forming a second source/drain region to fill the second recess. The spacer layer covers the first fin-type active region and the second fin-type active region. The first recess has a first depth is formed in the first fin-type active region. The forming the first recess includes etching the spacer layer in the first region of the substrate while the second region of the substrate is covered with a first mask pattern. The first source/drain region has a first width. The second recess has a second depth. The forming the second recess includes etching the spacer layer in the second region of the substrate while the first region of the substrate is covered with a second mask pattern. The second depth is greater than the first depth. The second source/drain region has a second width. The second width is greater than the first width.

According to some example embodiments of inventive concepts, an integrated circuit device includes a substrate including a first region and a second region, a first fin-type active region protruding from the substrate in the first region, a first source/drain region, a first gate line crossing over the first channel region, a second fin-type active region protruding from the substrate in the second region, a second source source/drain region, and a second gate line crossing over the second channel region. The first fin-type active region includes a first channel region defined by a first recess in the first fin-type active region. The first channel region has a first height. The second fin-type active region includes a second channel region defined by a second recess in the second fin-type active region. The second channel region has a second height that is greater than the first height. The first source/drain region is in the first recess. The second source/drain region is in the second recess.

BRIEF DESCRIPTION OF THE DRAWINGS

Inventive concepts will be more clearly understood from the following detailed description taken in conjunction with the accompanying drawings in which:

FIG. 2C is a cross-sectional view taken along lines C1-C1' and C2-C2' of FIG. 1;

FIGS. 10A to 23B are cross-sectional views of sequential processes of a method of manufacturing an IC device according to some example embodiments of inventive concepts, wherein FIGS. 10A, 11A, 12A, 13A, 14A, 15A, 16A, 17A, 18A, 19A, 20A, 21A, 22A, and 23A are cross-sectional views of main components taken along lines B1-B1' and B2-B2' of FIG. 1, illustrating sequential process operations, and FIGS. 10B, 11B, 12B, 13B, 14B, 15B, 16B, 17B, 18B, 19B, 20B, 21B, 22B, and 23B are cross-sectional views of main components taken along lines C1-C1' and C2-C2' of FIG. 1, illustrating sequential process operations.

DETAILED DESCRIPTION

Figure 1:
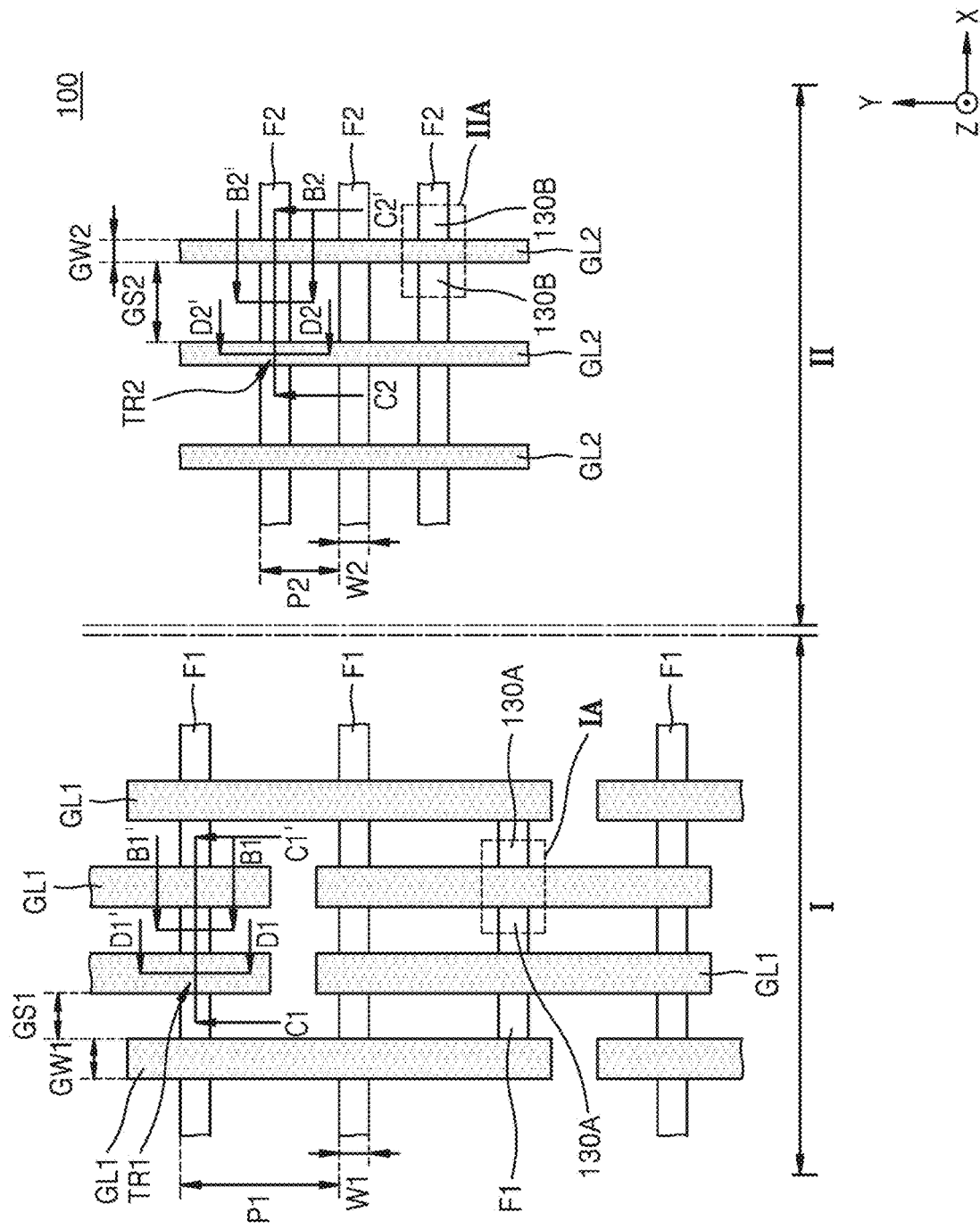
FIG. 1 illustrates the plan layout of main components of an integrated circuit (IC) device according to some example embodiments of inventive concepts.

FIG. 1 illustrates the plan layout of main components of an integrated circuit (IC) device 100 according to some example embodiments of inventive concepts.

Referring to FIG. 1, the IC device 100 may include a first region I and a second region II. The first region I and the second region II may be regions configured to implement different functions. In some embodiments, the first region I may be a memory region, and the second region II may be a non-memory region. The memory region may be a static random access memory (SRAM) region, a dynamic RAM (DRAM) region, a magnetic RAM (MRAM) region, a resistive RAM (RRAM) region, or a phase-change RAM (PRAM) region. The non-memory region may be a logic region. In some example embodiments of inventive concepts, the first region I may be a partial region of the SRAM region, and the second region II may be a partial region of the logic region.

The first region I of the IC device 100 may include a plurality of first fin-type active regions F1 and a plurality of first gate lines GL1. The plurality of first fin-type active regions F1 may extend in a first direction (X direction) and in parallel to one another. The plurality of first gate lines GL1 may extend in a second direction (Y direction) over the plurality of first fin-type active regions F1 and intersect the plurality of first fin-type active regions F1. First transistors TR1 may be respectively formed at intersections between the plurality of first fin-type active regions F1 and the plurality of first gate lines GL1. Some of the plurality of first fin-type active regions F1 may be arranged at a first pitch P1. Others of the plurality of first fin-type active regions F1 may be formed at a variable pitch so that a distance between two adjacent first fin-type active regions F1 may vary according to a position.

The second region II of the IC device 100 may include a plurality of second fin-type active regions F2 and a plurality of second gate lines GL2. The plurality of second fin-type active regions F2 may extend at a constant pitch and in parallel to one another. The plurality of second gate lines GL2 may extend over the plurality of second fin-type active regions F2 in a direction intersecting the plurality of second fin-type active regions F2. Second transistors TR2 may be respectively formed at intersections between the plurality of second fin-type active regions F2 and the plurality of second gate lines GL2. The plurality of second fin-type active regions F2 may be arranged at a second pitch P2. The second pitch P2 may be less than the first pitch P1. For example, the first pitch P1 may be about twice the second pitch P2, but inventive concepts are not limited thereto. A width W1 of each of the plurality of first fin-type active regions F1 may be equal to a width W2 of each of the plurality of second fin-type active regions F2.

Although FIG. 1 illustrates a case in which the plurality of first and second fin-type active regions F1 and F2 extend in the first direction (X direction), and the plurality of first and second gate lines GL1 and GL2 extend in the second direction (Y direction), inventive concepts are not limited thereto. A direction in which the plurality of first and second fin-type active regions F1 and F2 extend and a direction in which the first and second gate lines GL1 and GL2 extend may be variously selected.

Figure 2A:
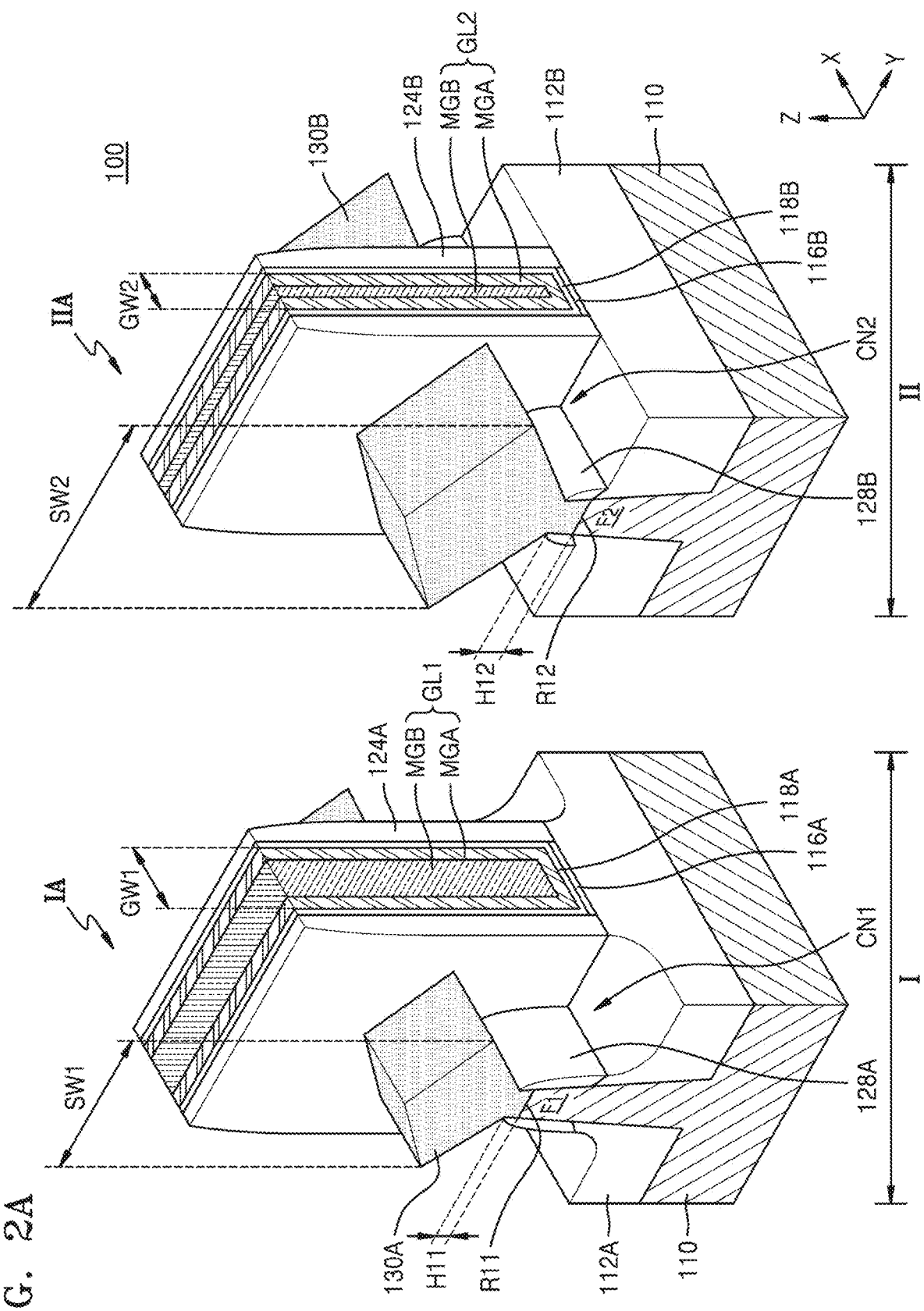
FIG. 2A is a perspective view of main components included in regions "IA" and "IIA" illustrated with dashed lines in FIG. 1.
Figure 2B:
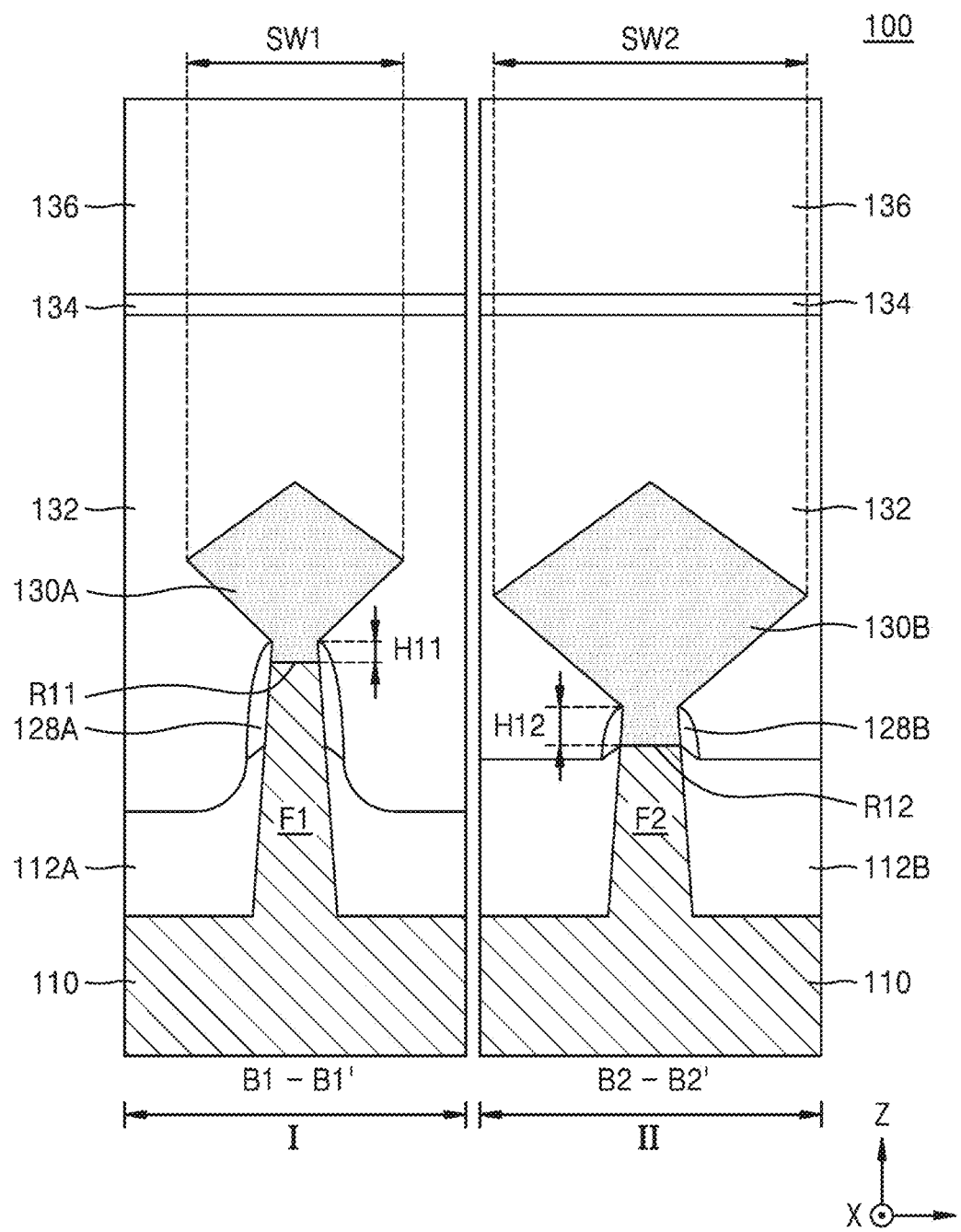
FIG. 2B is a cross-sectional view taken along lines B1-B1' and B2-B2' of FIG. 1.
Figure 2D:
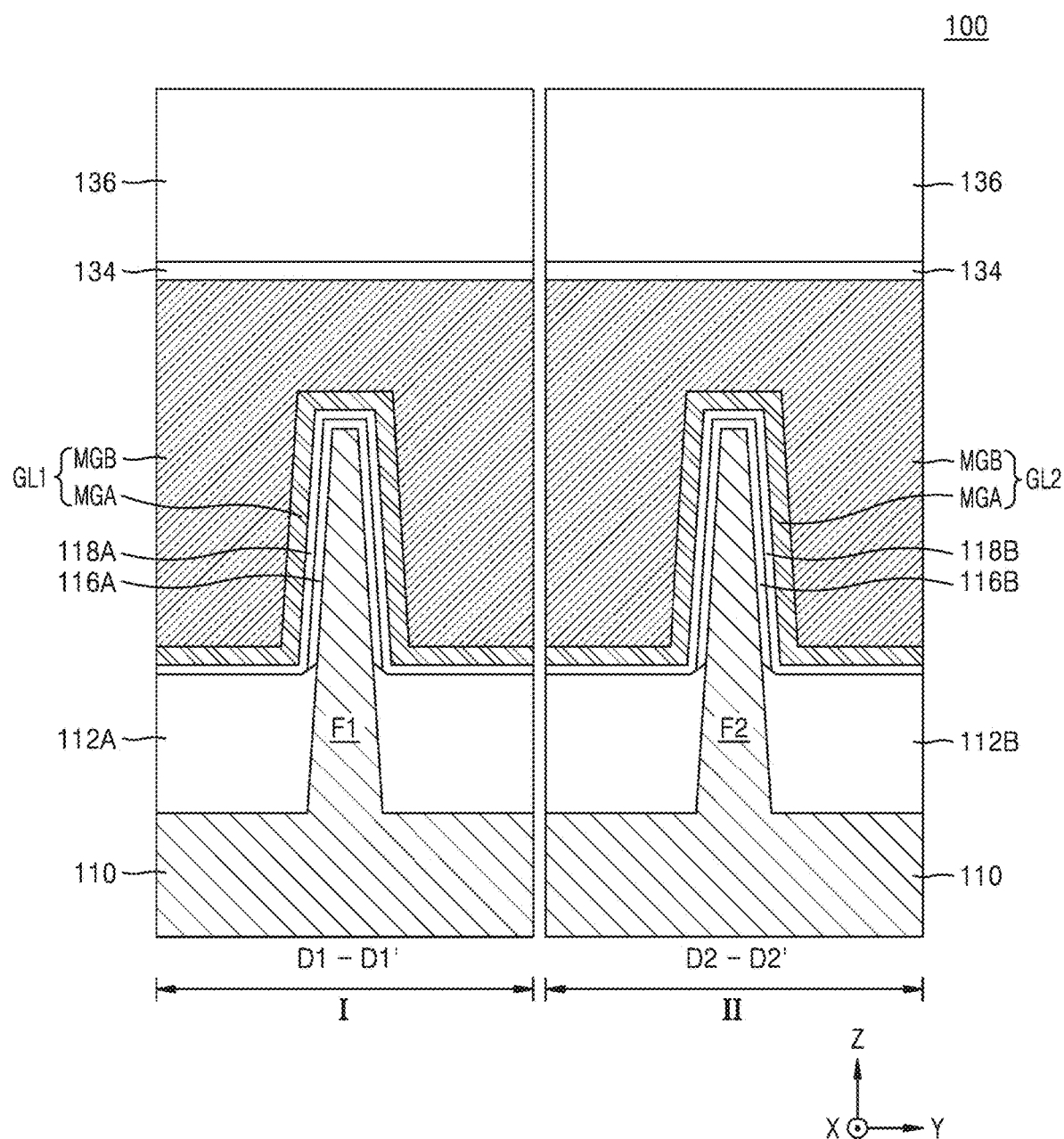
FIG. 2D is a cross-sectional view taken along lines D1-D1' and D2-D2' of FIG. 1.

FIG. 2A is a perspective view of main components included in regions "IA" and "IIA" illustrated with dashed lines in FIG. 1. FIG. 2B is a cross-sectional view taken along lines B1-B1' and B2-B2' of FIG. 1. FIG. 2C is a cross-sectional view taken along lines C1-C1' and C2-C2' of FIG. 1. FIG. 2D is a cross-sectional view taken along lines D1-D1' and D2-D2' of FIG. 1.

Referring to FIGS. 2A to 2D, the IC device 100 may include a first fin-type active region F1, which may protrude from a substrate 110 in the first region I of the substrate 110, and a second fin-type active region F2, which may protrude from the substrate 110 in the second region II of the substrate 110. In FIG. 2C, lowest levels of the first and second fin-type active regions F1 and F2 are illustrated with dashed lines BL1 and BL2, respectively.

The substrate 110 may include a semiconductor (e.g., silicon (Si) or germanium (Ge)) or a compound semiconductor (e.g., silicon germanium (SiGe), silicon carbide (SiC), gallium arsenide (GaAs), indium arsenide (InAs), or indium phosphide (InP)). The substrate 110 may include a conductive region, for example, a doped well or a doped structure.

A first channel region CH1 of the first fin-type active region F1 and a second channel region CH2 of the second fin-type active region F2 may include a single material. For example, the entire first and second fin-type active regions F1 and F2 including the first and second channel regions CH1 and CH2 may include silicon (Si). In some other embodiments, some parts of the first and second fin-type active regions F1 and F2 may include germanium (Ge), and other parts of the first and second fin-type active regions F1 and F2 may include silicon (Si).

In the first region I, both lower sidewalls of the first fin-type active region F1 may be covered with a first device isolation film 112A formed on the substrate 110, and the first channel region CH1 may protrude as a fin type over the first device isolation film 112A in a direction (Z direction) perpendicular to a main surface (X-Y plane) of the substrate 110. The first channel region CH1 may be covered with a first interface film 116A.

The first gate insulating film 118A and the first gate line GL1 may be formed on the first interface film 116A and cover the first channel region CH1 and extend in a direction intersecting the first fin-type active region F1. The first gate insulating film 118A and the first gate line GL1 may extend and cover a top surface and both sidewalls of the first fin-type active region F1 and the first device isolation film 112A. First transistors TR1 may be formed at intersections between the first fin-type active regions F1 and the first gate lines GL1.

In the second region II, both lower sidewalls of the second fin-type active region F2 may be covered with a second device isolation film 112B formed on the substrate 110, and a second channel region CH2 may protrude as a fin type over the second device isolation film 112B in the direction (Z direction) perpendicular to the main surface of the substrate 110. The second channel region CH2 may be covered with a second interface film 116B. A second gate insulating film 118B and a second gate line GL2 may be formed on the second interface film 116B and cover the second channel region CH2 and extend in a direction intersecting the second fin-type active region F2. The second gate insulating film 118B and the second gate line GL2 may extend and cover a top surface and both sidewalls of the second fin-type active region F2 and the second device isolation film 112B. Second transistors TR2 may be respectively formed at intersections between the second fin-type active regions F2 and the second gate lines GL2.

The first gate line GL1 may have a first width GW1 in the first direction (X direction), which is a direction in which the first fin-type active region F1 extends, while the second gate line GL2 may have a second width GW2 in the first direction (X direction), which is a direction in which the second fin-type active region F2 extends. The second width GW2 may be less than the first width GW1. A distance IGW1 between two adjacent first gate lines GL1 in the first region I may be less than a distance IGW2 between two adjacent second gate lines GL2 in the second region II.

The first and second interface films 116A and 116B may be obtained by oxidizing exposed surfaces of the first and second fin-type active regions F1 and F2, respectively. Each of the first and second interface films 116A and 116B may include a low-k material film having a dielectric constant of about 9 or lower, for example, a silicon oxide film, a silicon oxynitride film, or a combination thereof.

The first and second gate insulating films 118A and 118B may include a silicon oxide film, a high-k dielectric film, or a combination thereof. The high-k dielectric film may include a material having a higher dielectric constant than a silicon oxide film. The first and second gate insulating films 118A and 118B may have a dielectric constant of about 10 to about 25. The first and second gate insulating films 118A and 118B may include, but not limited thereto, hafnium oxide, hafnium oxynitride, hafnium silicon oxide, lanthanum oxide, lanthanum aluminum oxide, zirconium oxide, zirconium silicon oxide, tantalum oxide, titanium oxide, or a combination thereof.

Each of the first and second gate lines GL1 and GL2 may include a first metal-containing layer MGA and a second metal-containing layer MGB. The function of the first metal-containing layer MGA may be to adjust a work function. The function of the second metal-containing layer MGB may be to fill a space over the first metal-containing layer MGA. The first metal-containing layer MGA may include titanium (Ti), tantalum (Ta), aluminum (Al), and a combination thereof. The first metal-containing layer MGA may include a single film or a multi-layered structure. The second metal-containing layer MGB may include an upper work-function adjusting film, a conductive barrier film, a gap-fill metal film, or a combination thereof. The upper work-function adjusting film may include titanium aluminide (TiAl), titanium aluminum carbide (TiAlC), titanium aluminum nitride (TiAlN), titanium carbide (TiC), tantalum carbide (TaC), hafnium silicide (HfSi), or a combination thereof. The conductive barrier film may include a metal nitride, for example, titanium nitride (TiN), tantalum nitride (TaN), or a combination thereof. The gap-fill metal film may include tungsten (W). At least one of the upper work-function adjusting film, the conductive barrier film, and the gap-fill metal film may be omitted. In some embodiments, each of the first and second gate lines GL1 and GL2 may include a TiAlC/TiN/W stack structure, a TiN/TaN/TiAlC/TiN/W stack structure, or a TiN/TaN/TiN/TiAlC/TiN/W stack structure.

The first and second transistors TR1 and TR2 may be three-dimensional (3D) MOS transistors in which channels are formed in top surfaces and both sidewalls of the first and second fin-type active regions F1 and F2, respectively.

In the first region I, both sidewalls of each of the first interface film 116A, the first gate insulating film 118A, and the first gate line GL1 may be covered with first gate insulating spacers 124A. In the second region II, both sidewalls of each of the second interface film 116B, the second gate insulating film 118B, and the second gate line GL2 may be covered with second gate insulating spacers 124B. The first and second gate insulating spacers 124A and 124B may include silicon nitride (SiN), silicon oxycarbonitride (SiOCN), silicon carbonitride (SiCN), or a combination thereof. In some embodiments, the first gate insulating spacers 124A may include a SiN film in contact with sidewalls of the first gate line GL1 and a SiOCN film covering the sidewalls of the first gate line GL1 with the SiN film therebetween. Also, the second fin insulating spacers 128B may include a SiN film in contact with sidewalls of the second gate line GL2 and a SiOCN film covering the sidewalls of the second gate line GL2 with the SiN film therebetween.

In the first region I, first recesses R11 may be formed on both sides of the first gate line GL1 in the first fin-type active region F1 and filled with first source/drain regions 130A. The first source/drain region 130A may be insulated from the first gate line GL1 by the first gate insulating spacer 124A therebetween. The first source/drain region 130A may include a semiconductor layer, which may be epitaxially grown from the surface of the first fin-type active region F1 that forms an inner wall of the first recess R11. The first source/drain region 130A may have a top surface T1 at about the same level as a first top surface FT1 of the first fin-type active region F1. The first recess R11 may have a first depth RD11 from the first top surface FT1 of the first fin-type active region F1. A bottom surface of the first recess R11 may provide an interface between the first source/drain region 130A and the first fin-type active region F1. Accordingly, the interface between the first source/drain region 130A and the first fin-type active region F1 may have the first depth RD11 from the first top surface FT1 of the first fin-type active region F1. As used herein, the term "depth" refers to a length in a direction (e.g., −Z direction) vertical to a main surface (X-Y plane) of the substrate 110. The first depth RD11 may correspond to a height of the first channel region CH1.

In the second region II, second recesses R12 may be formed on both sides of the second gate line GL2 in the second fin-type active region F2 and filled with second source/drain regions 130B. The second source/drain region 130B may be insulated from the second gate line GL2 by a second gate insulating spacer 124B therebetween. The second source/drain region 130B may include a semiconductor layer, which is epitaxially grown from the surface of the second fin-type active region F2 that forms an inner wall of the second recess region R2. The second source/drain region 130B may have a top surface T2, which is at about the same level as a second top surface FT2 of the second fin-type active region F2. The top surface T2 of the second source/drain region 130B may be at about the same level as the top surface T1 of the first source/drain region 130A. A second depth RD12 from the second top surface FT2 of the second fin-type active region F2 to a bottom surface of the second recess R12 may be deeper than the first depth RD11. The bottom surface of the second recess R12 may provide an interface between the second source/drain region 130B and the second fin-type active region F2. Accordingly, the interface between the second source/drain region 130B and the second fin-type active region F2 may have the second depth RD12 from the second top surface FT2 of the second fin-type active region F2. Also, a height from the bottom surface of the first recess R11 to the first source/drain region 130A may be less than a height from the bottom surface of the second recess R12 to the second source/drain region 130B. As used herein, the term "height" refers to a vertical length in a direction (e.g., Z direction) perpendicular to the main surface of the substrate 110. The second channel region CH2 may have a height corresponding to the second depth RD12.

As shown in FIG. 2C, a width RW1 of the first recess R11 in the direction in which the first fin-type active region F1 extends may be less than a width RW2 of the second recess R12 in the direction in which the second fin-type active region F2 extends.

In some embodiments, each of the first and second source/drain regions 130A and 130B may have an embedded SiGe structure including a plurality of epitaxially grown SiGe layers. The plurality of SiGe layers may have different Ge contents. In some other embodiments, the first and second source/drain regions 130A and 130B may include an epitaxially grown Si layer or an epitaxially grown SiC layer. Although FIGS. 2A to 2C illustrate a case in which each of the first and second source/drain regions 130A and 130B has a specific sectional shape, inventive concepts are not limited thereto. For example, each of the first and second source/drain regions 130A and 130B may have one of various sectional shapes, for example, a polygonal shape (e.g., a tetragonal shape, a pentagonal shape, and a hexagonal shape), a circular shape, or an elliptical shape.

A size of the first source/drain region 130A formed in the first region I may be less than a size of the second source/drain region 130B formed in the second region II. For example, a width SW1 of the first source/drain region 130A in a direction in which the first gate line GL1 extends may be less than a width SW2 of the second source/drain region 130B in a direction in which the second gate line GL2 extends.

In the first region I and the second region II, an inter-gate dielectric film 132 may be between adjacent ones of the plurality of first gate lines GL1 and between adjacent ones of the plurality of second gate lines GL2. The inter-gate dielectric film 132 may cover the first and second source/drain regions 130A and 130B between adjacent ones of the plurality of first and second gate lines GL1 and GL2. The inter-gate dielectric film 132 may include a silicon oxide film.

In the first region I, a pair of first fin insulating spacers 128A may cover both sidewalls of a portion of the first fin-type active region F1 in which the first recess R11 is formed. The pair of first fin insulating spacers 128A may protrude from the substrate 110 over the first device isolation film 112A to a higher level than at the interface between the first source/drain region 130A and the first fin-type active region F1 and cover both sidewalls of the first source/drain region 130A.

In the second region II, a pair of second fin insulating spacers 128B may cover both sidewalls of a portion of the second fin-type active region F2 in which the second recess R12 is formed. The pair of second fin insulating spacers 128B may protrude from the substrate 110 over the second device isolation film 112B to a higher level than at the interface between the second source/drain region 130B and the second fin-type active region F2 and cover both sidewalls of the second source/drain region 130B. The pair of first fin insulating spacers 128A may have a greater height than the pair of second fin insulating spacers 128B, but inventive concepts are not limited thereto.

A second vertical distance H12 from the interface between the second source/drain region 130B and the second fin-type active region F2 to a top portion of the second fin insulating spacer 128B may be greater than a first vertical distance H11 from the interface between the first source/drain region 130A and the first fin-type active region F1 to a top portion of the first fin insulating spacer 128A.

In the first region I, both sidewalls of a portion of the first fin-type active region F1 in which the first recess R11 is formed may be spaced apart from the inter-gate dielectric film 132 with the first fin insulating spacers 128A therebetween. In the second region II, both sidewalls of a portion of the second fin-type active region F2 in which the second recess R12 is formed may be spaced apart from the inter-gate dielectric film 132 with the second fin insulating spacers 128B therebetween.

The first and second fin insulating spacers 128A and 128B may include the same material as a material included in the first and second gate insulating spacers 124A and 124B. For example, each of the first and second fin insulating spacers 128A and 128B and the first and second gate insulating spacers 124A and 124B may include SiOCN, SiCN, or a combination thereof.

In some embodiments, the first fin insulating spacer 128A may be integrated with the first gate insulating spacer 124A.

Also, the second fin insulating spacer 128B may be integrated with the second gate insulating spacer 124B. For example, the first fin insulating spacer 128A may be integrated with the first gate insulating spacer 124A in a reentrant corner portion (refer to CN1 in FIG. 2A) formed between the first gate line GL1 and the first fin-type active region F1. Also, the second fin insulating spacer 128B may be integrated with the second gate insulating spacer 124B in a reentrant corner portion (refer to CN2 in FIG. 2A) formed between the second gate line GL2 and the second fin-type active region F2.

A top surface of the first device isolation film 112A located under the first fin insulating spacers 128A located on both sides of the first gate line GL1 in the first region I may be at a lower level than a top surface of the second device isolation film 112B located on both sides of the second gate line GL2 in the second region II.

In the first region I and the second region II, a blocking insulating film 134 may be formed on the plurality of first and second gate lines GL1 and GL2 and the inter-gate dielectric film 132. The blocking insulating film 134 may limit and/or prevent permeation of an undesired foreign material (e.g., oxygen) into the plurality of first and second gate lines GL1 and GL2. The blocking insulating film 134 may include SiN, SiON, SiOCN, or a combination thereof. An interlayer insulating film 136 may be formed on the blocking insulating film 134. The interlayer insulating film 136 may include a silicon oxide film, but is not limited thereto.

In the IC device 100 shown in FIGS. 1 to 2D, the first source/drain region 130A having a relatively small size may be grown from the bottom surface of the first recess R11 having a relatively small depth in the first region I. Thus, a size of a memory cell embodied by the first transistor TR1 may be effectively reduced in the first region I. In contrast, the second source/drain region 130B having a relatively large size may be grown from the bottom surface of the second recess R12 having a relatively great depth in the second region II. Thus, stress applied to the second channel region CH2 may be increased so as to improve the performance of the second transistor TR2. Also, the IC device 100 shown in FIGS. 1 to 2D may be effectively configured to increase the operating speed of the second transistor TR2. Furthermore, in the first region I, both sidewalls of a portion of the first fin-type active region F1 in which the first recess R11 is formed may be covered with the first fin insulating spacers 128A. In the second region II, both sidewalls of a portion of the second fin-type active region F2 in which the second recess R12 is formed may be covered with the second fin insulating spacers 128B. As a result, insulating characteristics between the first and second fin-type active regions F1 and F2 and other conductive regions adjacent thereto may be enhanced. As described above, the IC device 100 may have different structures to ensure differently required electrical properties according to kinds and structures of devices so that the performance and reliability of the IC device 100 may increase.

Figure 3:
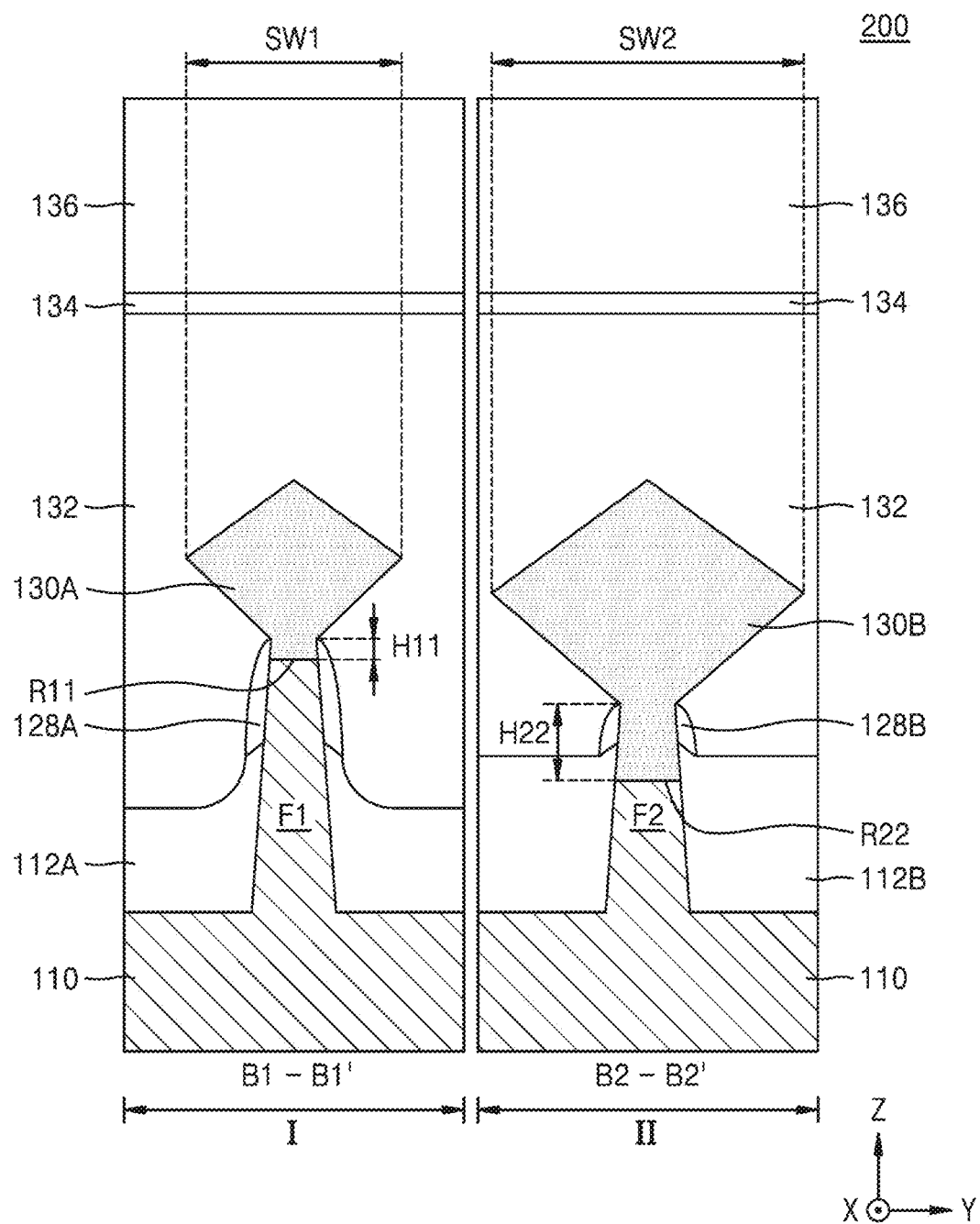
FIG. 3 is a cross-sectional view of an IC device according to some example embodiments of inventive concepts.

FIG. 3 is a cross-sectional view of an IC device 200 according to some example embodiments of inventive concepts. FIG. 3 illustrates components of a portion of the IC device 200, which correspond to the cross-sectional view taken along the lines B1-B1' and B2-B2' of FIG. 1. In FIG. 3, the same reference numerals as in FIGS. 1 to 2D are used to denote the same elements, and detailed descriptions thereof are omitted.

The IC device 200 shown in FIG. 3 may have about the same configuration as the IC device 100 shown in FIGS. 2A to 2D. In the IC device 200 shown in FIG. 3, a depth of a first recess R11 formed in a first fin-type active region F1 in a first region I may be less than a depth of a second recess R22 formed in a second fin-type active region F2 in a second region II. However, in the second region II of the IC device 200, the second device isolation film 112B may protrude over a substrate 110 on both sides of the second recess R22 further than at an interface between the second source/drain region 130B and the second fin-type active region F2. The interface between the second source/drain region 130B and the second fin-type active region F2 may be at a lower level than a top surface of the second device isolation film 112B.

A second vertical distance H22 from the interface between the second source/drain region 130B and the second fin-type active region F2 to a top portion of the second fin insulating spacer 128B in the second region II may be greater than a first vertical distance H11 from an interface between the first source/drain region 130A and the first fin-type active region F1 to a top portion of the first fin insulating spacer 128A in the first region I.

Figure 4:
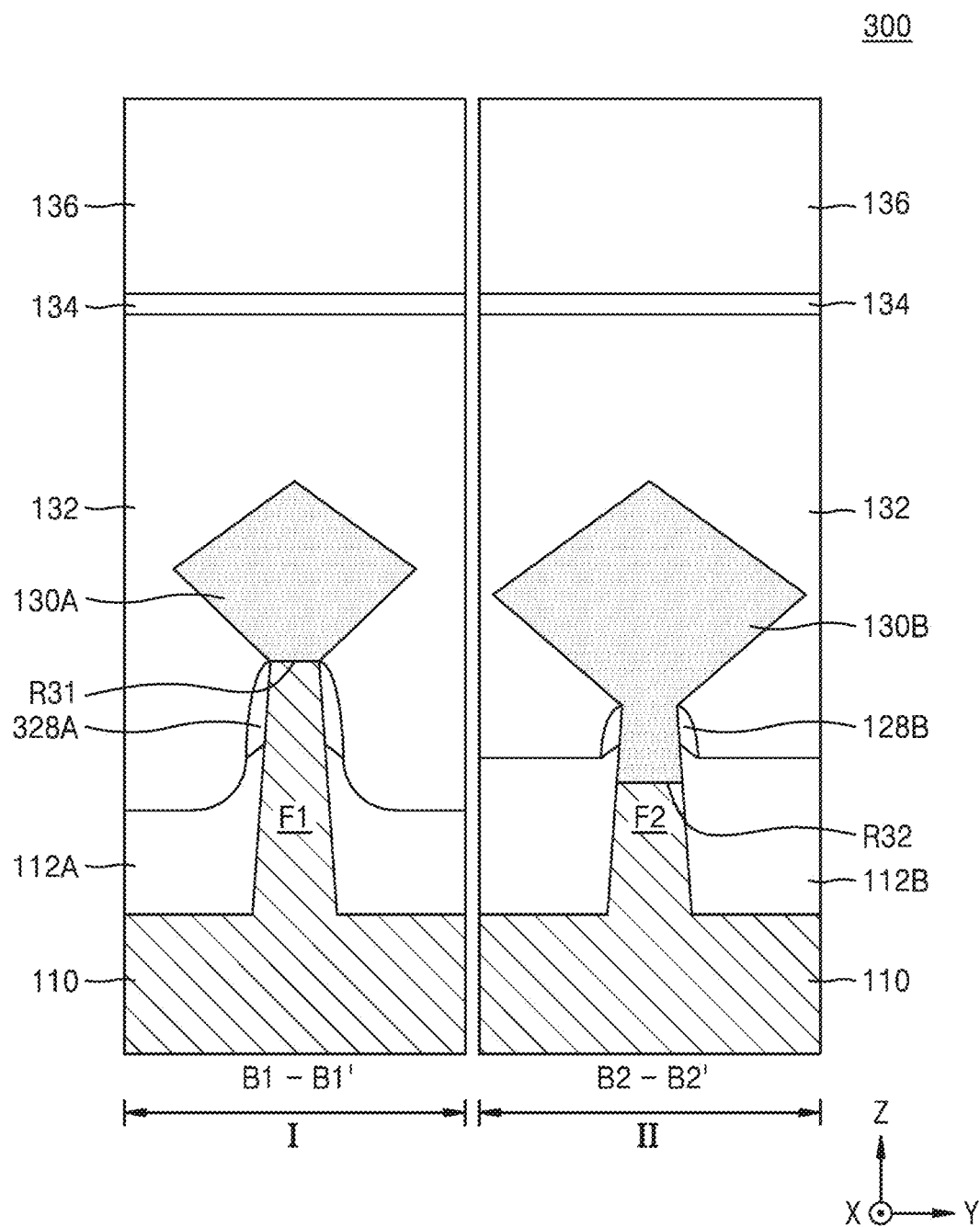
FIG. 4 is a cross-sectional view of an IC device according to some example embodiments of inventive concepts.

FIG. 4 is a cross-sectional view of an IC device 300 according to some example embodiments of inventive concepts. FIG. 4 illustrates components of a portion of the IC device 300, which correspond to the cross-sectional view taken along the lines B1-B1' and B2-B2' of FIG. 1. In FIG. 4, the same reference numerals as in FIGS. 1 to 3 are used to denote the same elements, and detailed descriptions thereof are omitted.

The IC device 300 shown in FIG. 4 may have about the same configuration as the IC device 200 shown in FIG. 3. In the IC device 300 shown in FIG. 4, a depth of a first recess R31 formed in a first fin-type active region F1 in a first region I may be less than a depth of a second recess R32 formed in a second fin-type active region F2 in a second region II. However, top portions of a pair of second fin insulating spacers 128B may be at a higher level than an interface between the second source/drain region 130B and the second fin-type active region F2 in the second region II, while top portions of a pair of first fin insulating spacers 328A may be at a level not higher than a level of an interface between the first source/drain region 130A and the first fin-type active region F1 in the first region I. A top level of the pair of first fin insulating spacers 328A may be at the same level as the interface between the first source/drain region 130A and the first fin-type active region F1, but inventive concepts are not limited thereto. Detailed descriptions of the pair of first fin insulating spacers 328A may be about the same as those of the pair of first fin insulating spacers 128A presented with reference to FIGS. 2A to 2D.

In the second region II of the IC device 300, a second device isolation film 112B may protrude over a substrate 110 on both sides of the second recess R32 further than an interface between the second source/drain region 130B and the second fin-type active region F2. The interface between the second source/drain region 130B and the second fin-type active region F2 may be at a lower level than a top surface of the second device isolation film 112B.

A size of the first source/drain region 130A in the first region I may be less than a size of the second source/drain region 130B in the second region II. For instance, a width of the first source/drain region 130A in a direction in which a first gate line GL1 extends may be less than a width of second source/drain region 130B in a direction in which a second gate line GL2 extends. Also, a height from a bottom surface of the first recess R31 to the first source/drain region 130A may be less than a height from a bottom surface of the second recess R32 to the second source/drain region 130B.

Figure 5:
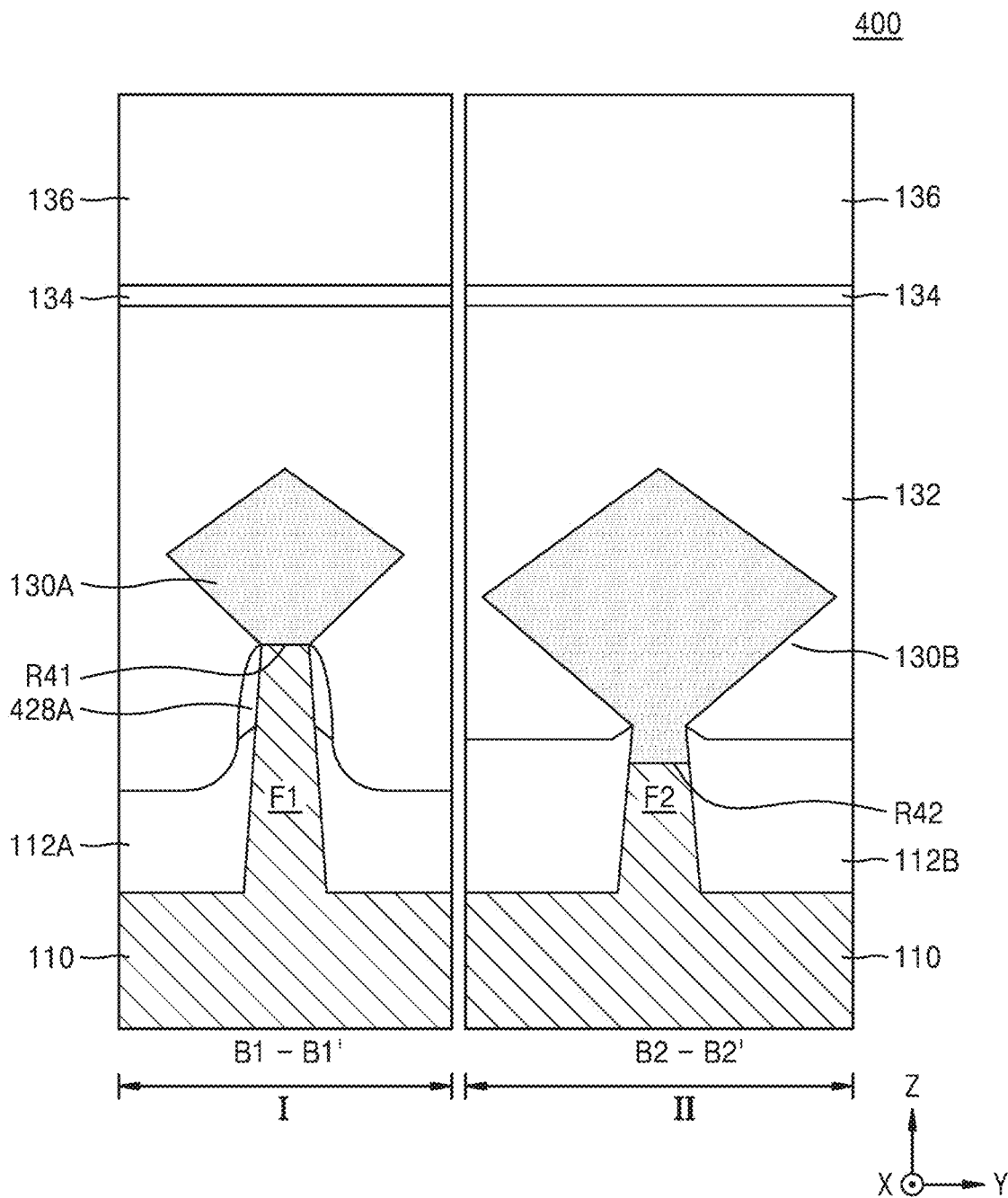
FIG. 5 is a cross-sectional view of an IC device according to some example embodiments of inventive concepts.

FIG. 5 is a cross-sectional view of an IC device 400 according to some example embodiments of inventive concepts. FIG. 5 illustrates components of a portion of the IC device 400, which correspond to the cross-sectional view taken along the lines B1-B1' and B2-B2' of FIG. 1. In FIG. 5, the same reference numerals as in FIGS. 1 to 4 are used to denote the same elements, and detailed descriptions thereof are omitted.

The IC device 400 shown in FIG. 5 may have about the same configuration as the IC device 300 shown in FIG. 4. However, the IC device 400 shown in FIG. 5 may not include fin insulating spacers covering both sidewalls of a portion of a second fin-type active region F2 in which a second recess R42 is formed, in a second region II.

A depth of a first recess R41 formed in a first fin-type active region F1 in a first region I may be less than a depth of a second recess R42 formed in the second fin-type active region F2 in the second region II. In the first region I, top portions of a pair of first fin insulating spacers 428A may be at a level not higher than a level of an interface between the first source/drain region 130A and the first fin-type active region F1. A top level of the pair of first fin insulating spacers 428A may be at about the same level as the interface between the first source/drain region 130A and the first fin-type active region F1, but inventive concepts are not limited thereto. Detailed descriptions of the pair of first fin insulating spacers 428A may be about the same as those of the pair of first fin insulating spacers 128A presented with reference to FIGS. 2A to 2D.

In the second region II, the second device isolation film 112B may protrude from a substrate 110 on both sides of the second recess R42 further than at an interface between the second source/drain region 130B and the second fin-type active region F2. The interface between the second source/drain region 130B and the second fin-type active region F2 may be at a lower level than a top surface of the second device isolation film 112B.

Figure 6:
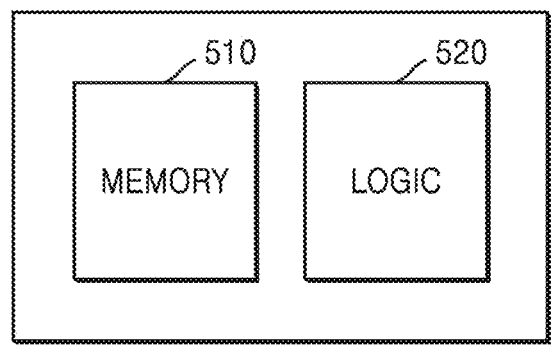
FIG. 6 is a block diagram of an IC device according to some example embodiments of inventive concepts.

FIG. 6 is a block diagram of an IC device 500 according to some example embodiments of inventive concepts.

Referring to FIG. 6, the IC device 500 may include a memory region 510 and a logic region 520.

The memory region 510 may include at least one of the configurations of the first region I, which have been described above with reference to FIGS. 1 to 5. The memory region 510 may include at least one of SRAM, DRAM, MRAM, RRAM, and PRAM. The logic region 520 may include at least one of the configurations of the second region II, which have been described above with reference to FIGS. 1 to 5. The logic region 520 may include standard cells (e.g., a counter and a buffer) configured to serve desired logic functions. The standard cells may include various kinds of logic cells including a plurality of circuit elements (e.g., transistors and registers). The logic cells may be included in, for example, an AND, a NAND, an OR, a NOR, an exclusive OR (XOR), an exclusive NOR (XNOR), an inverter (INV), an adder (ADD), a buffer (BUF), a delay (DLY), a filter (FIL), a multiplexer (MXT/MXIT), an OR/AND/INVERTER (OAI), an AND/OR (AO), an AND/OR/INVERTER (AOI), a D-flip-flop, a reset flip-flop, a master-slaver flip-flop, and/or a latch.

Figure 7:
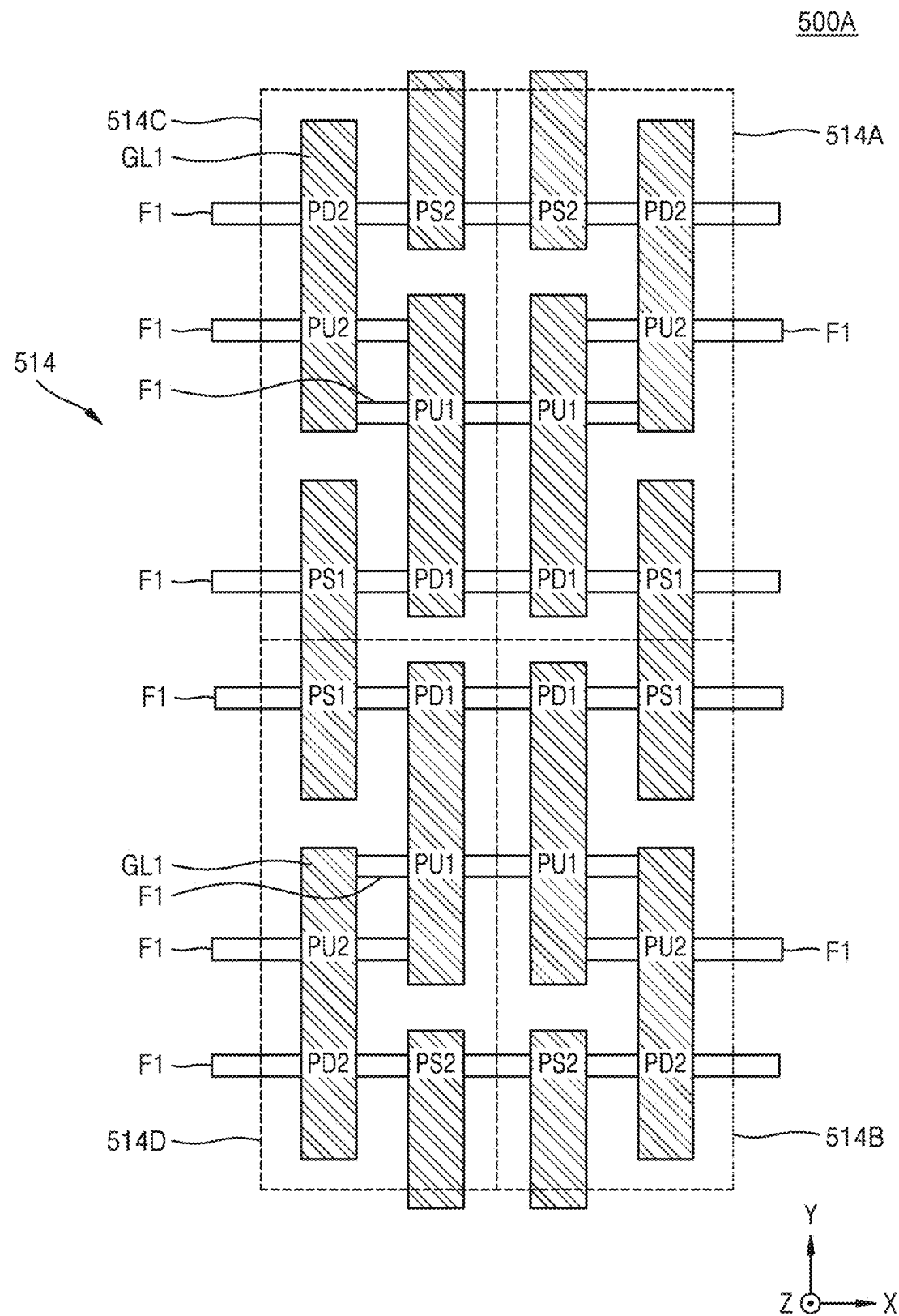
FIG. 7 is a plan view of main components of a memory device included in an IC device, according to some example embodiments of inventive concepts.

FIG. 7 is a plan view of main components of a memory device 500A included in the memory region 510 of the IC device 500 shown in FIG. 6, according to some example embodiments of inventive concepts. In FIG. 7, the same reference numerals as in FIGS. 1 to 6 are used to denote the same elements, and detailed descriptions thereof are omitted.

Referring to FIG. 7, the memory device 500A may include an SRAM array 514 including a plurality of SRAM cells (e.g., 514A, 514B, 514C, and 514D), which may be arranged in a matrix shape on a substrate. FIG. 7 illustrates four SRAM cells 514A, 514B, 514C, and 514D, each of which may include six FinFETs.

Each of the SRAM cells 514A, 514B, 514C, and 514D may include a plurality of first fin-type active regions F1, which may protrude from a substrate (refer to 110 in FIGS. 2A to 5) and extend parallel to one another in a first direction (X direction). In the plurality of SRAM cells 514A, 514B, 514C, and 514D, a plurality of first gate lines GL1 may extend on the plurality of first fin-type active regions F1 and intersect the plurality of first fin-type active regions F1.

A first pull-up transistor PU1, a first pull-down transistor PD1, a first pass transistor PS1, a second pull-up transistor PU2, a second pull-down transistor PD2, and a second pass transistor PS2, which may be included in the SRAM cells 514A, 514B, 514C, and 514D, may be embodied by a plurality of FinFET devices formed at intersections between the plurality of first gate lines GL1 and the plurality of first fin-type active regions F1. For example, in the SRAM cell 514A, transistors may be respectively formed at six intersections between the plurality of first fin-type active regions F1 and the plurality of first gate lines GL1 and include the first pass transistor PS1, the second pass transistor PS2, the first pull-down transistor PD1, the second pull-down transistor PD2, the first pull-up transistor PU1, and the second pull-up transistor PU2.

Each of the first pull-up transistor PU1 and the second pull-up transistor PU2 may be a PMOS transistor, and each of the first pull-down transistor PD1, the second pull-down transistor PD2, the first pass transistor PS1, and the second pass transistor PS2 may be an NMOS transistor.

The memory device 500A may include the same configuration as the first region I of at least one of the IC devices 100, 200, 300, and 400 described with reference to FIGS. 1 to 5.

Figure 8A:
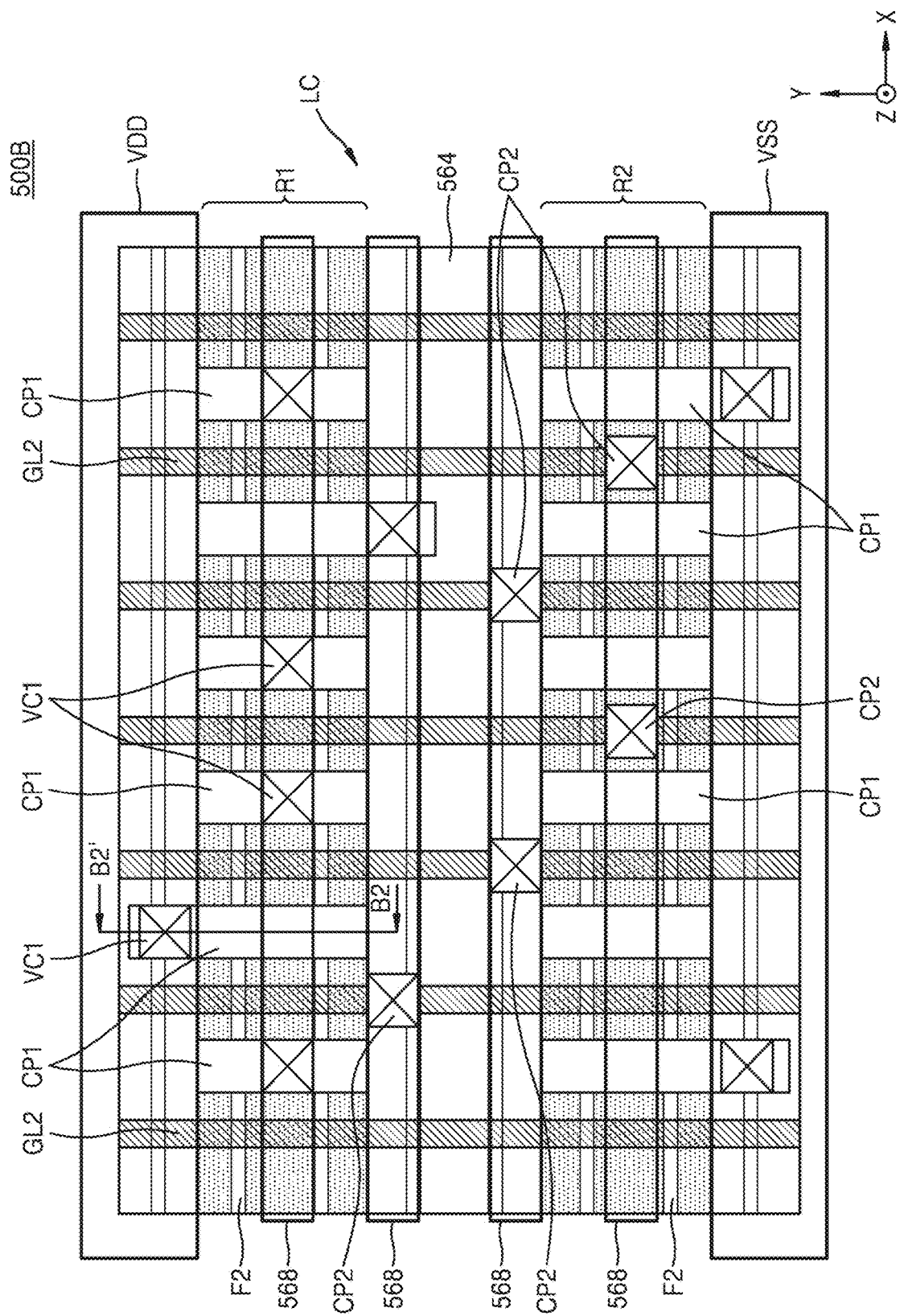
FIG. 8A is a plan view of main components of a logic device, which are included in a logic region of an IC device according to some example embodiments of inventive concepts.
Figure 8B:
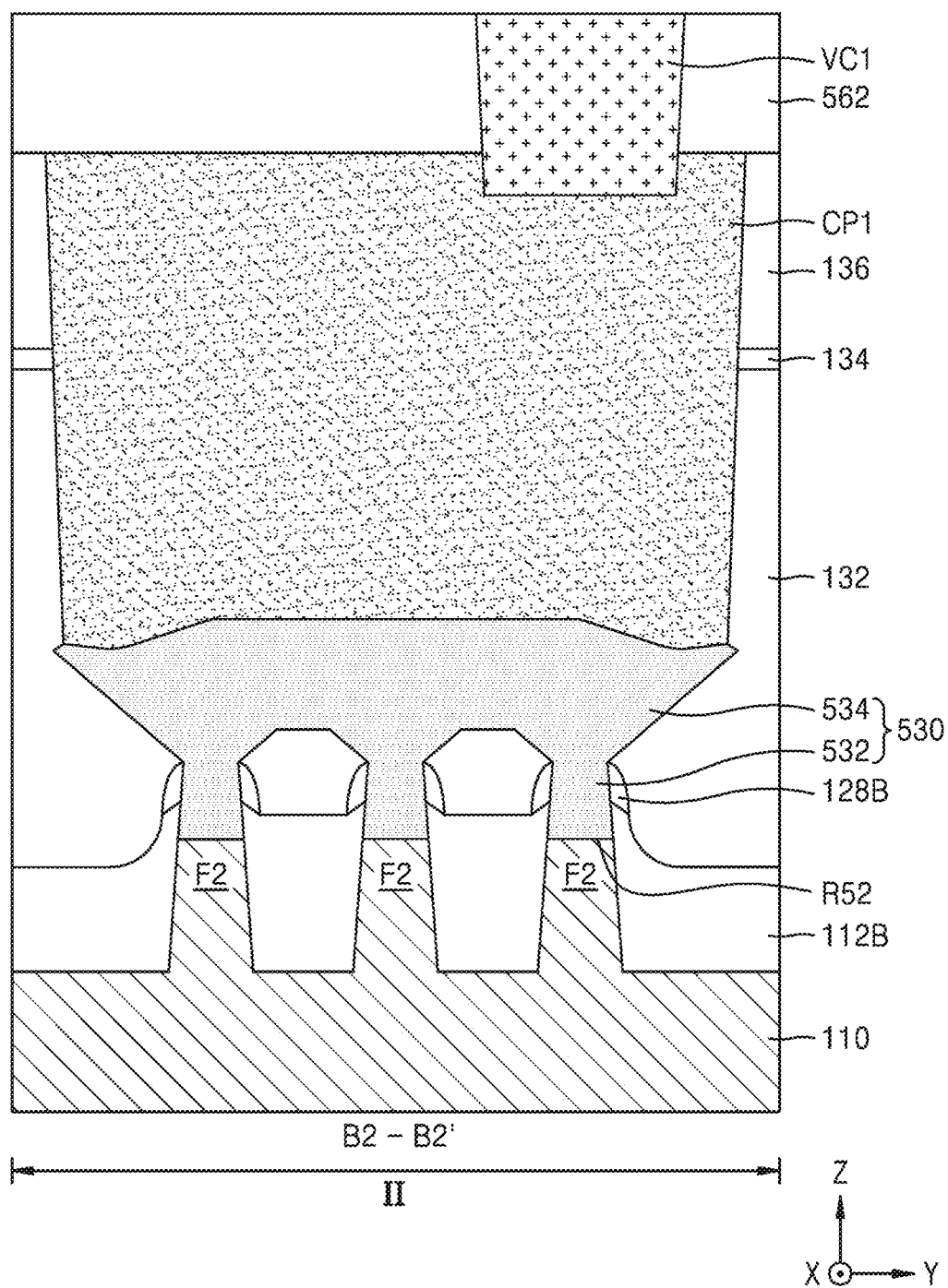
FIG. 8B is a cross-sectional view of some components, which is taken along a line B2-B2' of FIG. 8A.

FIG. 8A is a plan view of main components of a logic device 500B, which may be included in the logic region 520 of the IC device 500 shown in FIG. 6, according to some example embodiments of inventive concepts. FIG. 8B is a cross-sectional view of some components, which is taken along a line B2-B2' of FIG. 8A. In FIGS. 8A and 8B, the same reference numerals as in FIGS. 1 to 5 are used to denote the same elements, and detailed descriptions thereof are omitted.

Referring to FIGS. 8A and 8B, the logic device 500B may have a logic cell LC including at least one logic function circuit formed on a substrate (refer to 110 in FIGS. 2A to 5). The logic cell LC may include a first device region R1 and a second device region R2. A region between the first device region R1 and the second device R2 may be covered with an isolation insulating film 564 on the substrate 110. A plurality of second fin-type active regions F2 may extend in a first direction (X direction) in the first device region R1 and the second device region R2. The plurality of second fin-type active regions F2 may be formed at a constant pitch in the first device region R1 and the second device region R2.

In the logic cell LC, a plurality of second gate lines GL2 may extend in a direction that intersects the plurality of second fin-type active regions F2. Transistors may be respectively formed at intersections between the plurality of second gate lines GL2 and the plurality of second fin-type active regions F2. The plurality of second gate lines GL2 may be shared among a plurality of FinFET devices formed on the substrate 110.

In some embodiments, the logic device 500B may include the same configuration as the second region II of at least one of the IC devices 100, 200, 300, and 400 described with reference to FIGS. 1 to 5.

As described with reference to FIGS. 2A to 2D, second recesses R52 may be respectively formed in the plurality of second fin-type active regions F2 in the logic device 500B. Each of the second recesses R52 may have a bottom surface, which has a greater depth than a depth of a first recess (e.g., the first recess R11 described with reference to FIGS. 2A to 2D) formed in the first fin-type active region F1 formed in the first region I. Like the second recess R22 described with reference to FIG. 3, the second recess R52 may have a bottom surface, which is at a lower level than a top surface of a second device isolation film 112B.

The logic device 500B may include a second source/drain region 530, which may extend across the plurality of second fin-type active regions F2 and be connected to the plurality of second fin-type active regions F2. The second source/drain region 530 may include a plurality of source/drain branch portions 532 and a source/drain merged portion 534. The plurality of source/drain branch portions 532 may fill the respective second recesses R52 of the plurality of second fin-type active regions F2. The source/drain merged portion 534 may be connected to the plurality of source/drain branch portions 532 and extend across the plurality of second fin-type active regions F2 over the plurality of second fin-type active regions F2. Detailed descriptions of the second source/drain region 530 may be about the same as those of the second source/drain region 130B presented with reference to FIGS. 2A to 2D.

The second device isolation film 112B may protrude from the substrate 110 on both sides of the second recess R52 further than at interfaces between the second source/drain region 530 and the second fin-type active region F2. The interfaces between the second source/drain region 530 and the plurality of second fin-type active regions F2 may be at a lower level than a top surface of the second device isolation film 112B. Interfaces between the plurality of source/drain branch portions 532 and the plurality of second fin-type active regions F2 may be at a lower level than the interface between the first fin-type active region F1 and the first source/drain region 130A, which may be formed in the first region I as described with reference to FIGS. 2A to 2D. A bottom surface of the second recess R52 may be at a lower level than bottom surfaces of the first recesses R11, R31, and R41 described with reference to FIGS. 2A to 5.

Both sidewalls of each of the plurality of source/drain branch portions 532 may be covered with second fin insulating spacers 128B. The second fin insulating spacers 128B may protrude in a direction away from the substrate 110 to a higher level than the interfaces between the plurality of source/drain branch portions 532 and the plurality of second fin-type active regions F2.

A level of the top surface of the second device isolation film 112B may vary according to a position. As shown in FIG. 8B, the top surface of the second device isolation film 112B covering outer sidewalls of an outermost second fin-type active region F2, from among a plurality of second fin-type active regions F2 connected to one second source/drain region 530, may be at a lower level than a top surface of the second device isolation film 112B covering both sidewalls of an inner second fin-type active region F2 other than the outermost second fin-type active region F2, from among the plurality of second fin-type active regions F2 connected to the one second source/drain region 530. This configuration may be obtained due to a formation density of the plurality of second fin-type active regions F2. For example, during an etchback process for forming the second fin insulating spacers 128B, a relatively low pattern density may be exhibited outside the outermost second fin-type active region F2, from among the plurality of second fin-type active regions F2. Thus, the level of the top surface of the second device isolation film 112B may be lower outside the outermost second fin-type active region F2 than inside the outermost second fin-type active region F2.

FIG. 8B illustrates a case in which two second fin insulating spacers 128B are located between two adjacent ones of the plurality of second fin-type active regions F2, and each of the two adjacent second fin insulating spacers 128B is in contact with two adjacent ones of the plurality of source/drain branch portions 532. However, the inventive concept is not limited to the configuration shown in FIG. 8B.

A plurality of first conductive plugs CP1 and a plurality of second conductive plugs CP2 may be formed on the plurality of second fin-type active regions F2. The plurality of first conductive plugs CP1 may be connected to the second source/drain region 530, and the plurality of second conductive plugs CP2 may be connected to the second gate line GL2. A plurality of first conductive via contacts VC1 may be formed on the plurality of first conductive plugs CP1. A plurality of second conductive via contacts (not shown) may be formed on the plurality of second conductive plugs CP2.

In the logic cell LC, a power line VDD may be connected to the second fin-type active region F2 in the first device region R1, and a ground line VSS may be connected to the second fin-type active region F2 in the second device region R2. The plurality of first and second conductive plugs CP1 and CP2 may be connected to a plurality of interconnection layers 568 through the plurality of first conductive via contacts VC1 and the plurality of second conductive via contacts (not shown).

Each of the plurality of first and second conductive plugs CP1 and CP2, the plurality of first conductive via contacts VC1, the plurality of second conductive via contacts (not shown), and the plurality of interconnection layers 568 may include a metal film and a conductive barrier film surrounding the metal film. The metal film may include tungsten (W) or cobalt (Co). The conductive barrier film may include Ti, Ta, TiN, TaN, or a combination thereof.

The plurality of first conductive via contacts VC1 and the plurality of second conductive via contacts (not shown) may be insulated from one another by an upper insulating film 562. The upper insulating film 562 may include a silicon oxide film, a silicon nitride film, or a combination thereof. For example, the upper insulating film 562 may include a tetraethyl orthosilicate (TEOS) film or an ultralow K (ULK) film having an ultralow dielectric constant K of about 2.2 to about 2.4. The ULK film may include a SiOC film or a SiCOH film.

The logic device 500B shown in FIGS. 8A and 8B may include the second source/drain region 530, which is grown from the bottom surface of the second recess R52 having a relatively deep depth. Thus, stress applied to channel regions of the transistors included in the logic cell LC may increase, and sufficient contact areas may be provided between the second source/drain region 530 and the plurality of first conductive plugs CP1. As a result, the performance and operating speed of the logic cell LC may improve, thereby increasing reliability of the logic device 500B.

Figure 9A:
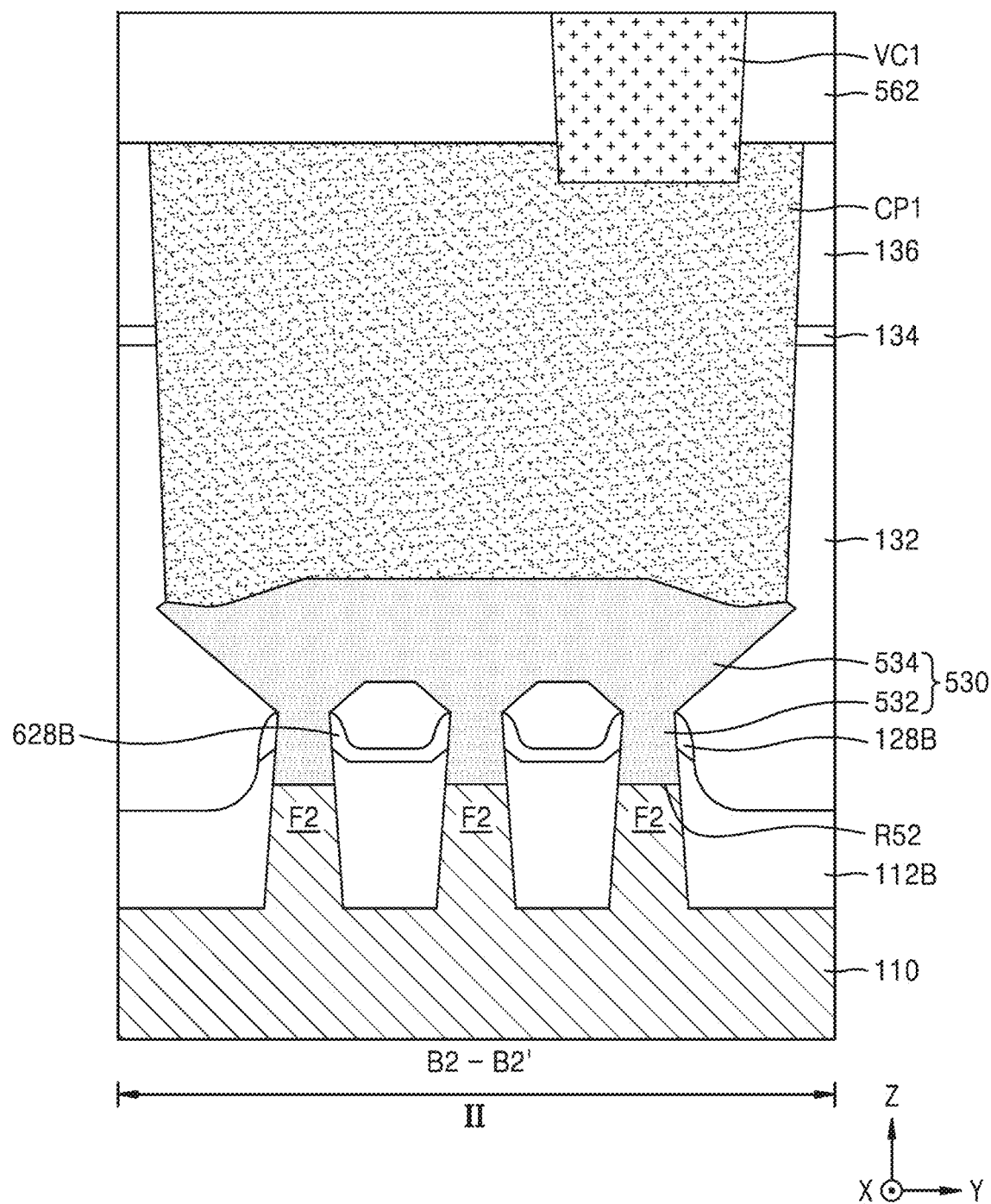
FIGS. 9A to 9C are cross-sectional views of logic devices included in an IC device according to some example embodiments of inventive concepts.
Figure 9B:
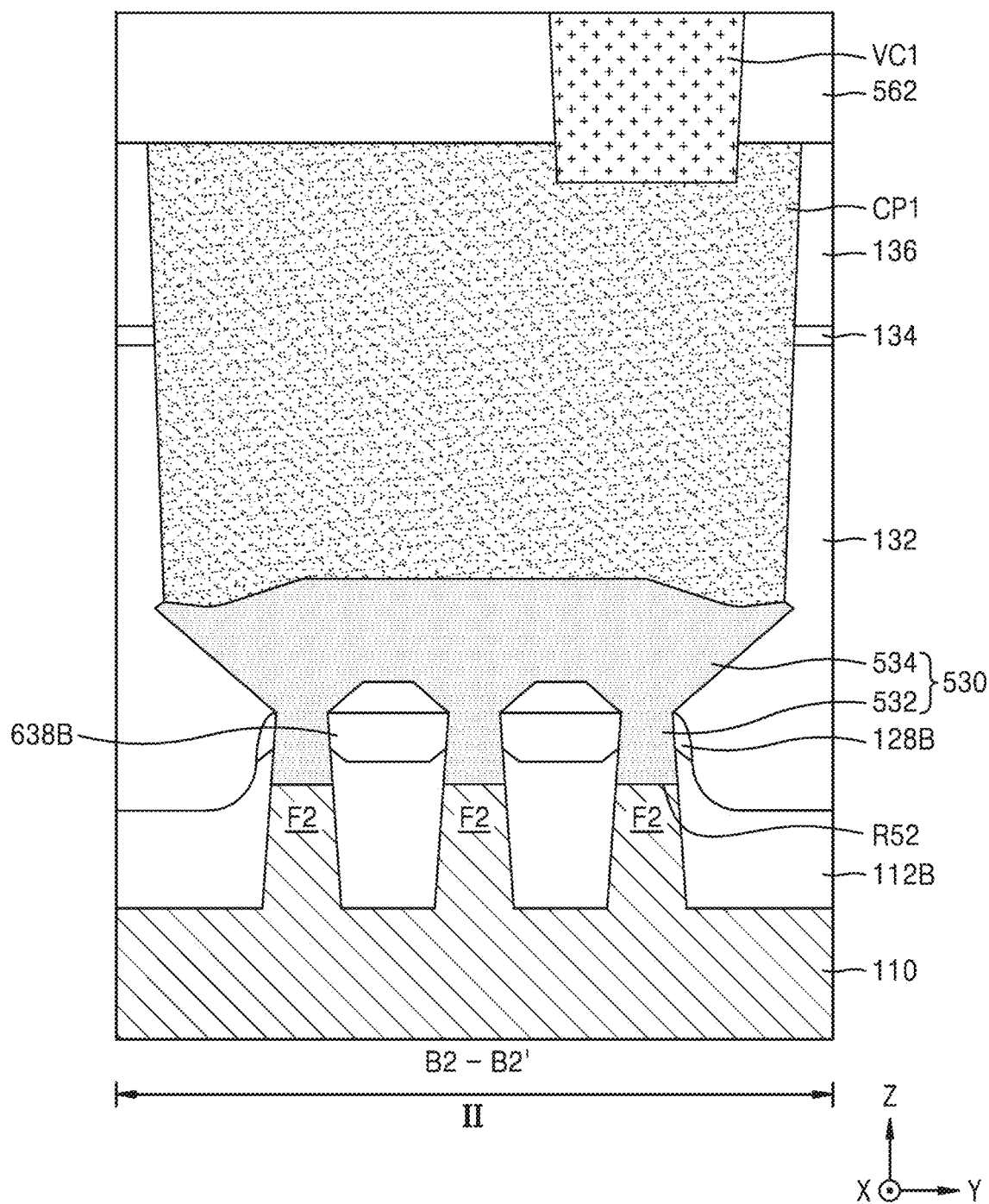
Figure 9C:
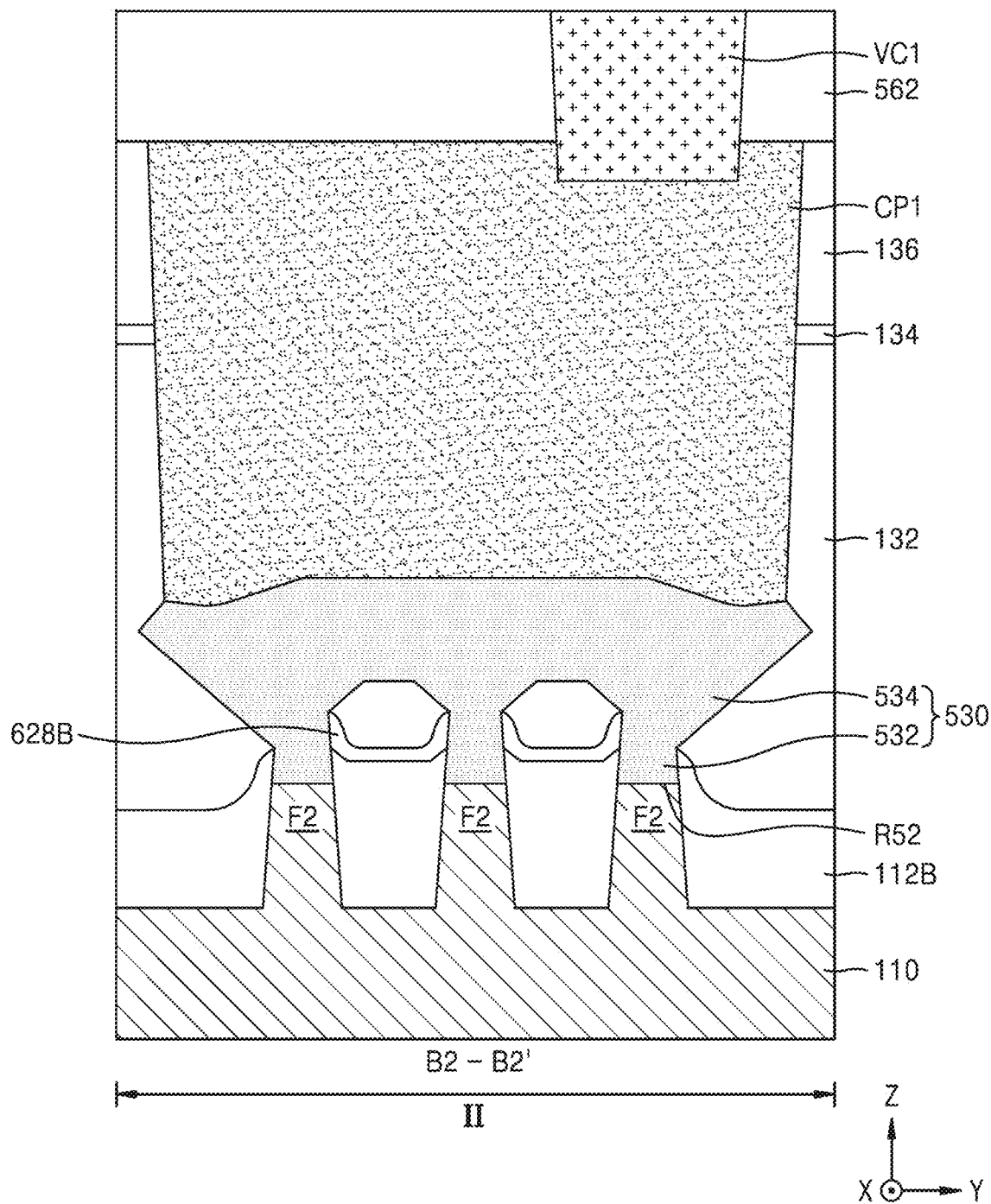

FIGS. 9A to 9C are cross-sectional views of logic devices included in an IC device according to some example embodiments of inventive concepts. FIGS. 9A to 9C are cross-sectional views of some components taken along a line B2-B2' of FIG. 8A. In FIGS. 9A to 9C, the same reference numerals as in FIGS. 1 to 8B are used to denote the same elements, and detailed descriptions thereof are omitted.

Referring to FIG. 9A, the logic region 520 of the IC device 500 shown in FIG. 6 may include a logic device 600A. The logic device 600A may generally have the same configuration as the logic device 500B described with reference to FIGS. 8A and 8B. However, the logic device 600A may include a plurality of second fin insulating spacers 628B.

The plurality of second fin insulating spacers 628B may extend over a second device isolation film 112B between two adjacent ones of a plurality of second fin-type active regions F2 connected to one second source/drain region 530, and be in contact with two adjacent ones of a plurality of source/drain branch portions 532. The plurality of second fin insulating spacers 628B may have uneven top surfaces, of which levels decrease away from the second fin-type active regions F2. Detailed descriptions of the second fin insulating spacers 628B may be about the same as those of the second fin insulating spacers 128B presented with reference to FIGS. 2A and 2D.

Referring to FIG. 9B, the logic region 520 of the IC device 500 shown in FIG. 6 may include a logic device 600B. The logic device 600B may have about the same configuration as the logic device 500B described with reference to FIGS. 8A and 8B. However, the logic device 600B may include a plurality of second fin insulating spacers 638B. Each of the plurality of second fin insulating spacers 638B may extend over a second device isolation film 112B between two adjacent ones of a plurality of second fin-type active regions F2 connected to one second source/drain region 530, and may be in contact with two adjacent ones of the plurality of source/drain branch portions 532. Each of the second fin insulating spacers 638B may generally have a planar top surface. Detailed descriptions of the second fin insulating spacers 638B may be about the same as those of the second fin insulating spacers 128B presented with reference to FIGS. 2A and 2D.

Referring to FIG. 9C, the logic region 520 of the IC device 500 shown in FIG. 6 may include a logic device 600C. The logic device 600C may have about the same configuration as the logic device 600A described with reference to FIG. 9A. However, in the logic device 600C, the second fin insulating spacers 128B shown in FIG. 9A may not be formed on the second device isolation film 112B, which may cover outer sidewalls of an outermost second fin-type active region F2 from among a plurality of second fin-type active regions F2 connected to one second source/drain region 530. This configuration may be obtained due to a density of the plurality of second fin-type active regions F2. For example, during an etchback process for forming the second fin insulating spacers 628B, the second fin insulating spacers 128B shown in FIG. 9A may not be formed outside the outermost second fin-type active region F2, from among the plurality of second fin-type active regions F2, due to a relatively low pattern density. A level of a top surface of the second device isolation film 112B may be lower outside the outermost second fin-type active region F2 than inside the outermost second fin-type active region F2.

FIGS. 10A to 23B are cross-sectional views of sequential processes of a method of manufacturing an IC device according to some example embodiments of inventive concepts. Of FIGS. 10A to 23B, FIGS. 10A, 11A, . . . , and 23A are cross-sectional views of main components taken along lines B1-B1' and B2-B2' of FIG. 1, illustrating sequential process operations. FIGS. 10B, 11B, . . . , and 23B are cross-sectional views of main components taken along lines C1-C1' and C2-C2' of FIG. 1, illustrating sequential process operations. A method of manufacturing the IC device 100 shown in FIGS. 1 to 2D, according to some example embodiments of inventive concepts, and methods of manufacturing modified and changed IC devices will be described with reference to FIGS. 10A to 23B. In FIGS. 10A to 23B, the same reference numerals as in FIGS. 1 to 9 are used to denote the same elements, and detailed descriptions thereof are omitted.

Figure 10A:
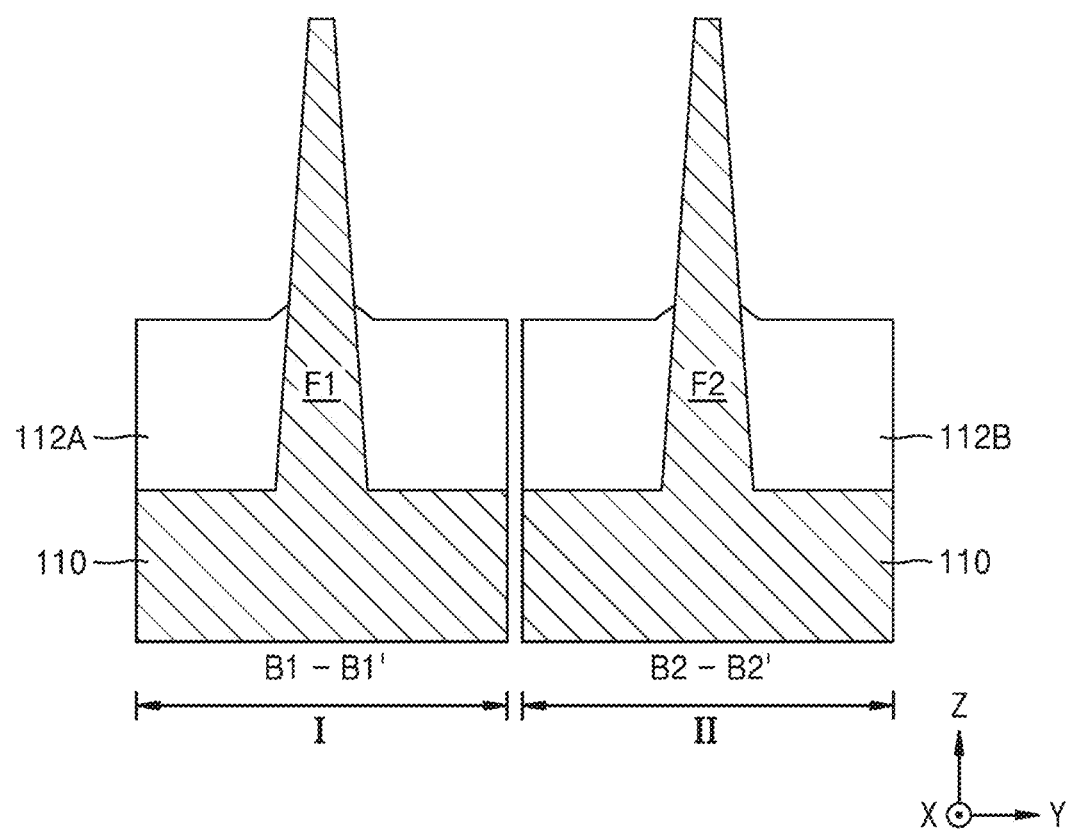
Figure 10B:
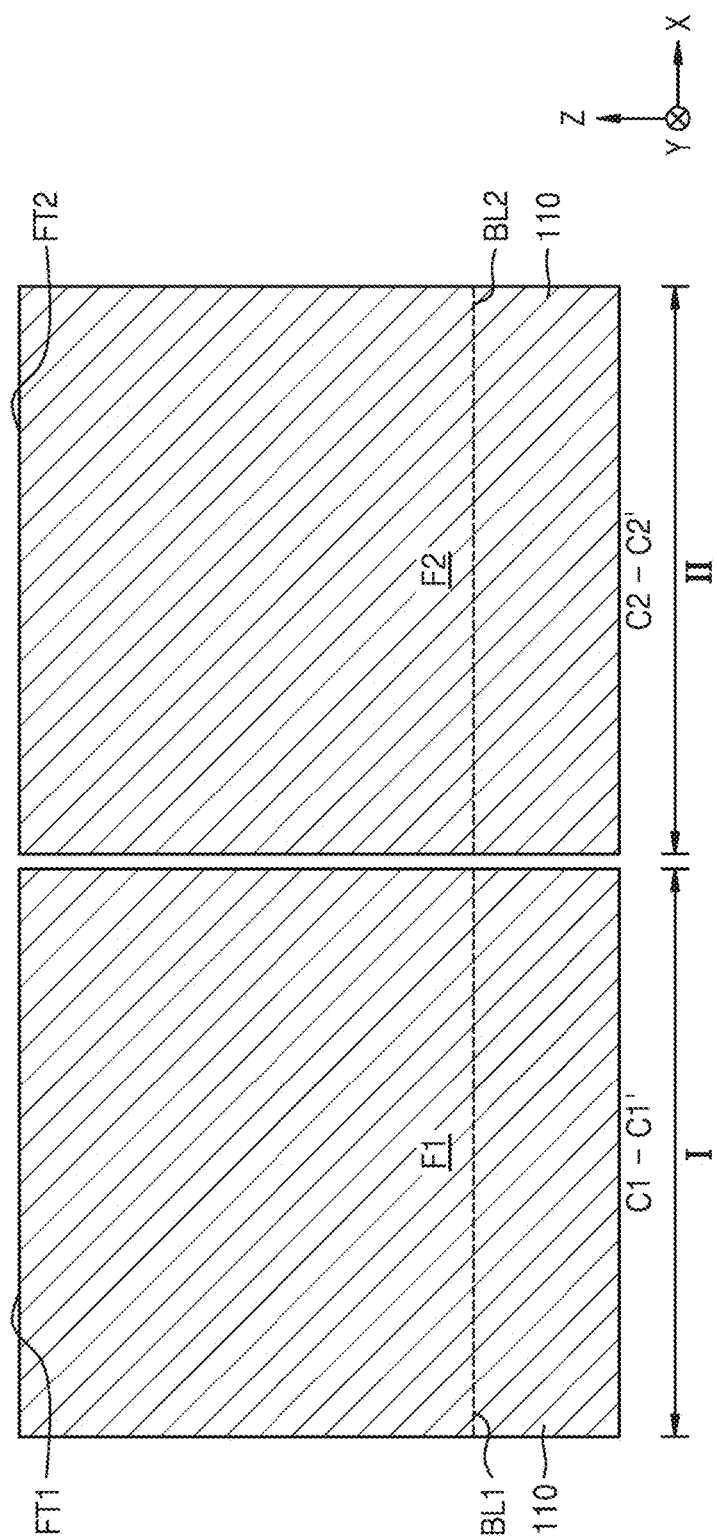

Referring to FIGS. 10A and 10B, a substrate 110 having a first region I and a second region II may be prepared. In the first region I and the second region II, the substrate 110 may have a MOS region. Each of the first region I and the second region II of the substrate 110 may include at least one of a PMOS transistor region and an NMOS transistor region.

Partial regions of the substrate 110 may be etched in the first region I and the second region II to form first and second fin-type active regions F1 and F2, which may protrude upward (e.g., in a Z direction) from a main surface (X-Y plane) of the substrate 110 and extend in a first direction (X direction). The first and second fin-type active regions F1 and F2 may have about the same width. The first fin-type active region F1 may have a first top surface FT1, and the second fin-type active region F2 may have a second top surface FT2. The first top surface FT1 and the second top surface FT2 may be at about the same level. The first and second fin-type active regions F1 and F2 may include P-type or N-type diffusion regions (not shown) according to a channel type of a MOS transistor to be formed.

After an insulating film is formed on the substrate 110 to cover the first and second fin-type active regions F1 and F2, the insulating film may be etched back to form first and second device isolation films 112A and 112B. The first and second fin-type active regions F1 and F2 may protrude over the first and second device isolation films 112A and 112B and be exposed. The first and second device isolation films 112A and 112B may include a silicon oxide film, a silicon nitride film, a silicon oxynitride film, or a combination thereof.

Figure 11A:
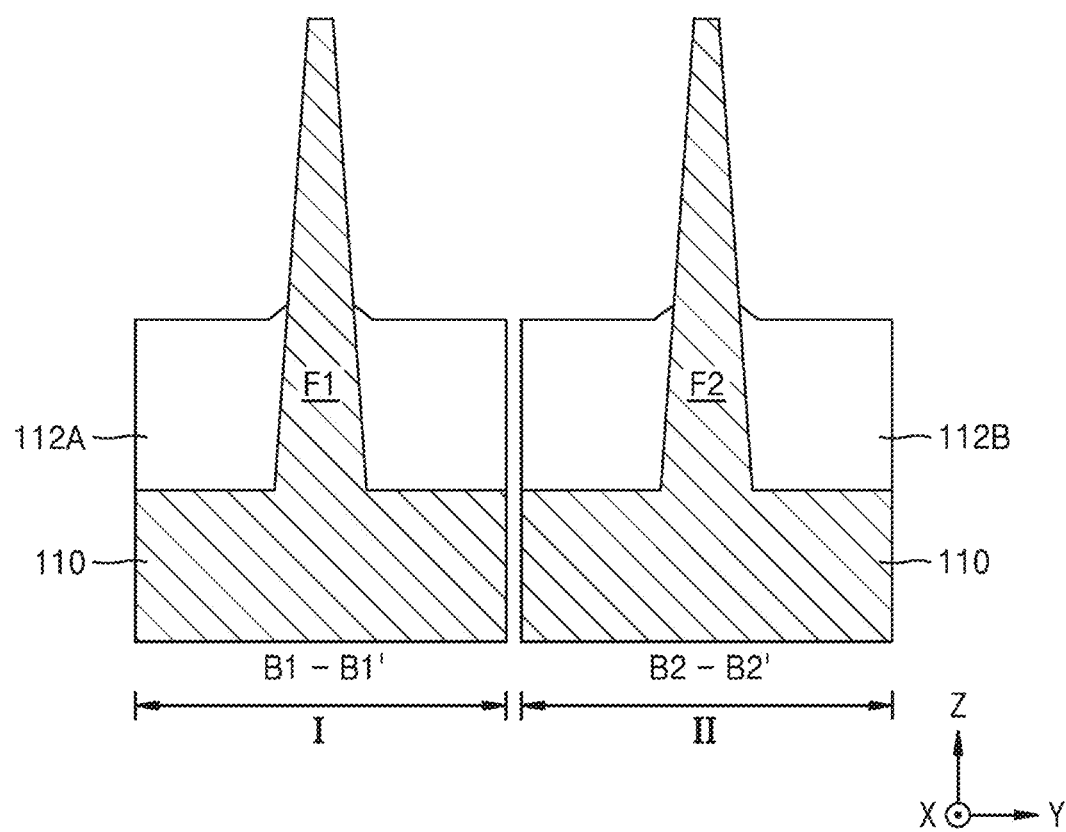
Figure 11B:
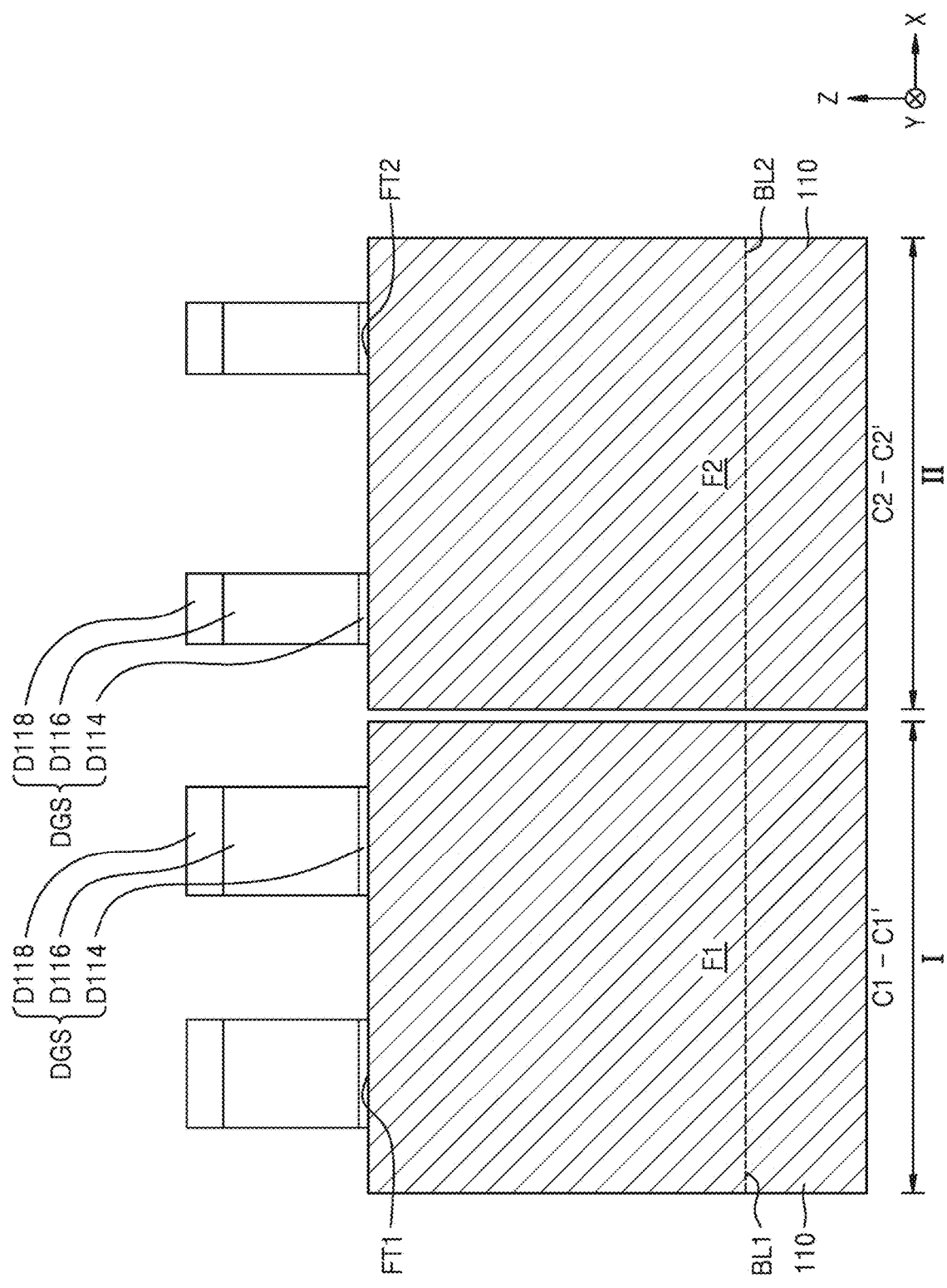

Referring to FIGS. 11A and 11B, in the first region I and second region II, dummy gate structures DGS may extend over the first and second fin-type active regions F1 and F2 and intersect the first and second fin-type active regions F1 and F2.

Each of the dummy gate structures DGS may include a dummy gate insulating film D114, a dummy gate line D116, and a dummy gate capping layer D118, which may be sequentially stacked on the first fin-type active region F1 and/or the second fin-type active region F2. The dummy gate insulating film D114 may include silicon oxide. The dummy gate line D116 may include polysilicon. The dummy gate capping layer D118 may include at least one of silicon oxide, silicon nitride, and silicon oxynitride.

Figure 12A:
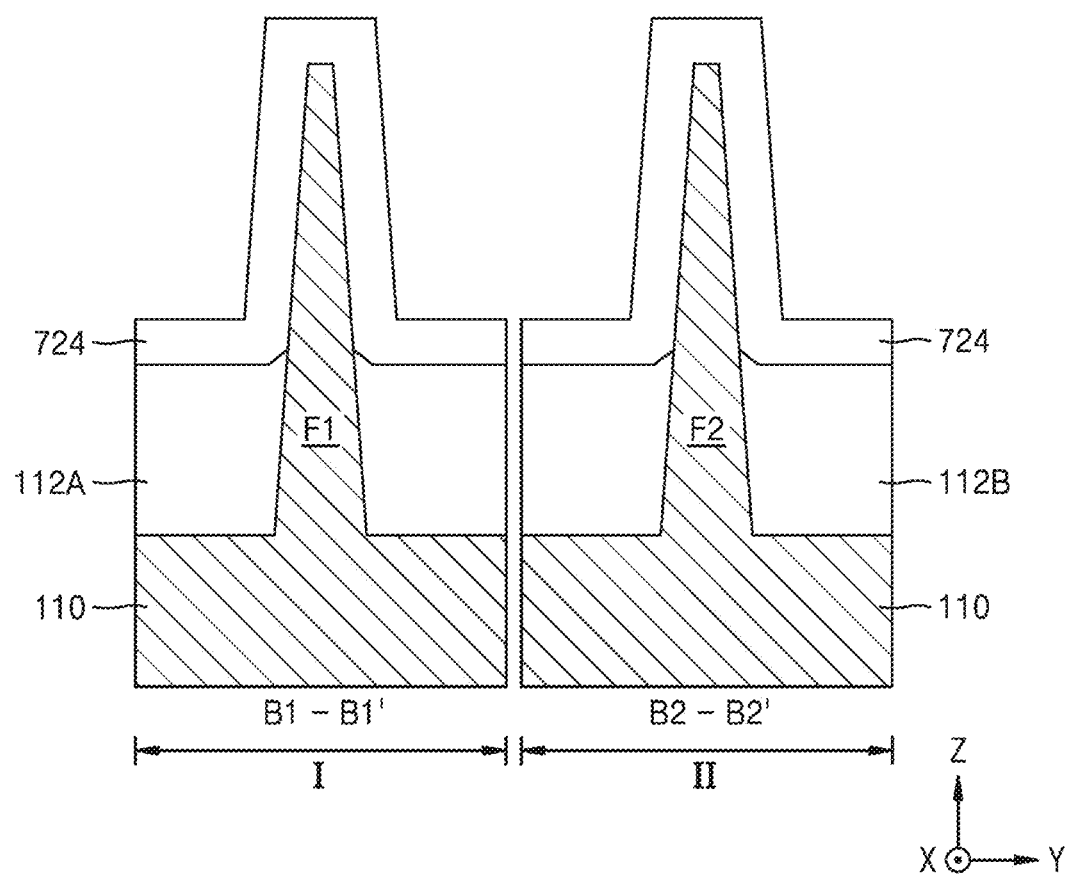
Figure 12B:
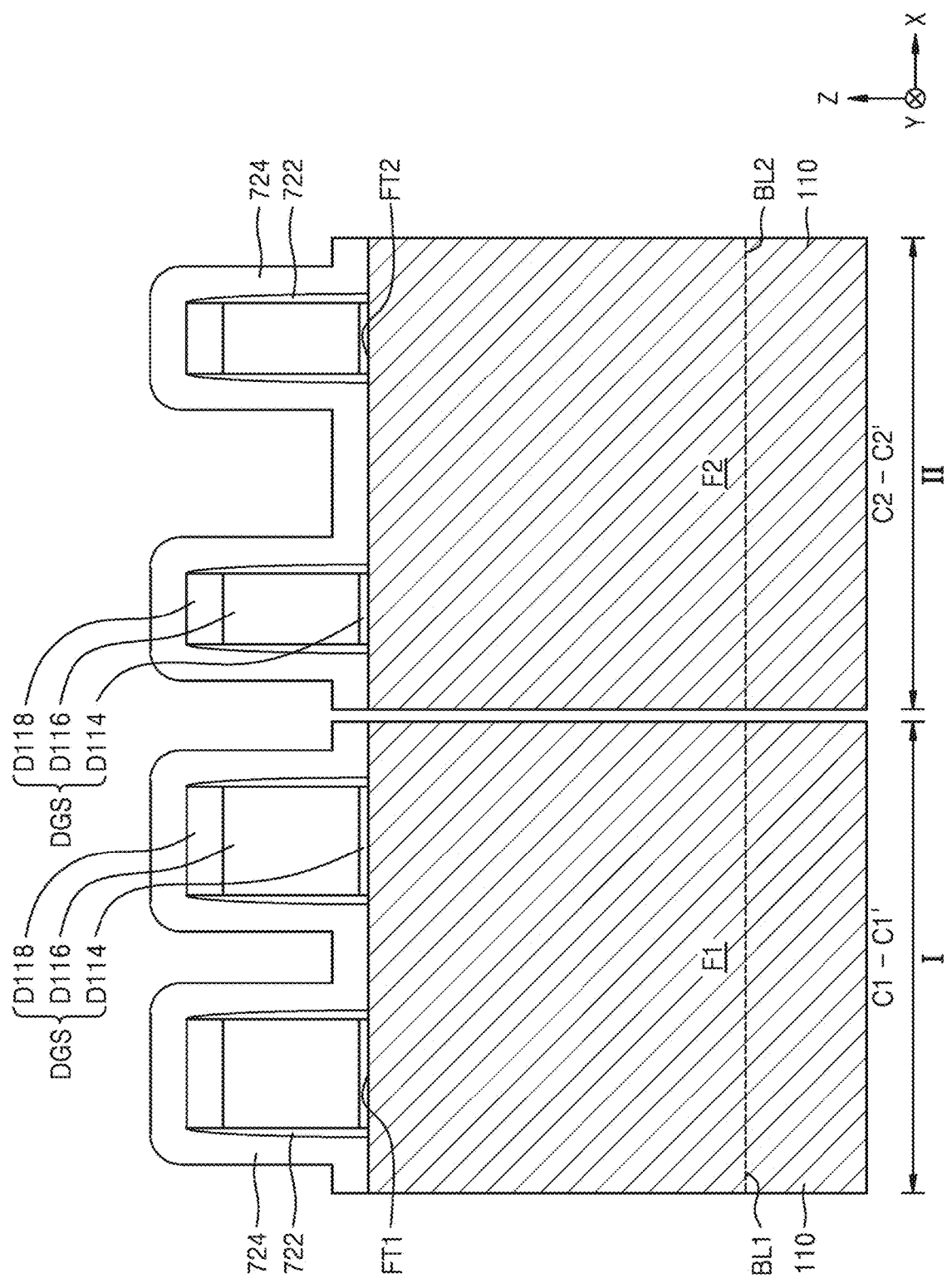

Referring to FIGS. 12A and 12B, in the first region I and the second region II, inner gate insulating spacers 722 may be formed to cover both sidewalls of each of the dummy gate structures DGS, and a spacer layer 724 may be formed to cover the first and second fin-type active regions F1 and F2, the dummy gate structures DGS, and the inner gate insulating spacers 722.

The inner gate insulating spacers 722 may include silicon nitride (SiN). The spacer layer 724 may include SiOCN, SiCN, or a combination thereof. In some embodiments, the spacer layer 724 may include a single layer including SiOCN. In some other embodiments, the spacer layer 724 may include a SiOCN film covering the inner gate insulating spacer 722 and an oxide film covering the SiOCN film.

Figure 13A:
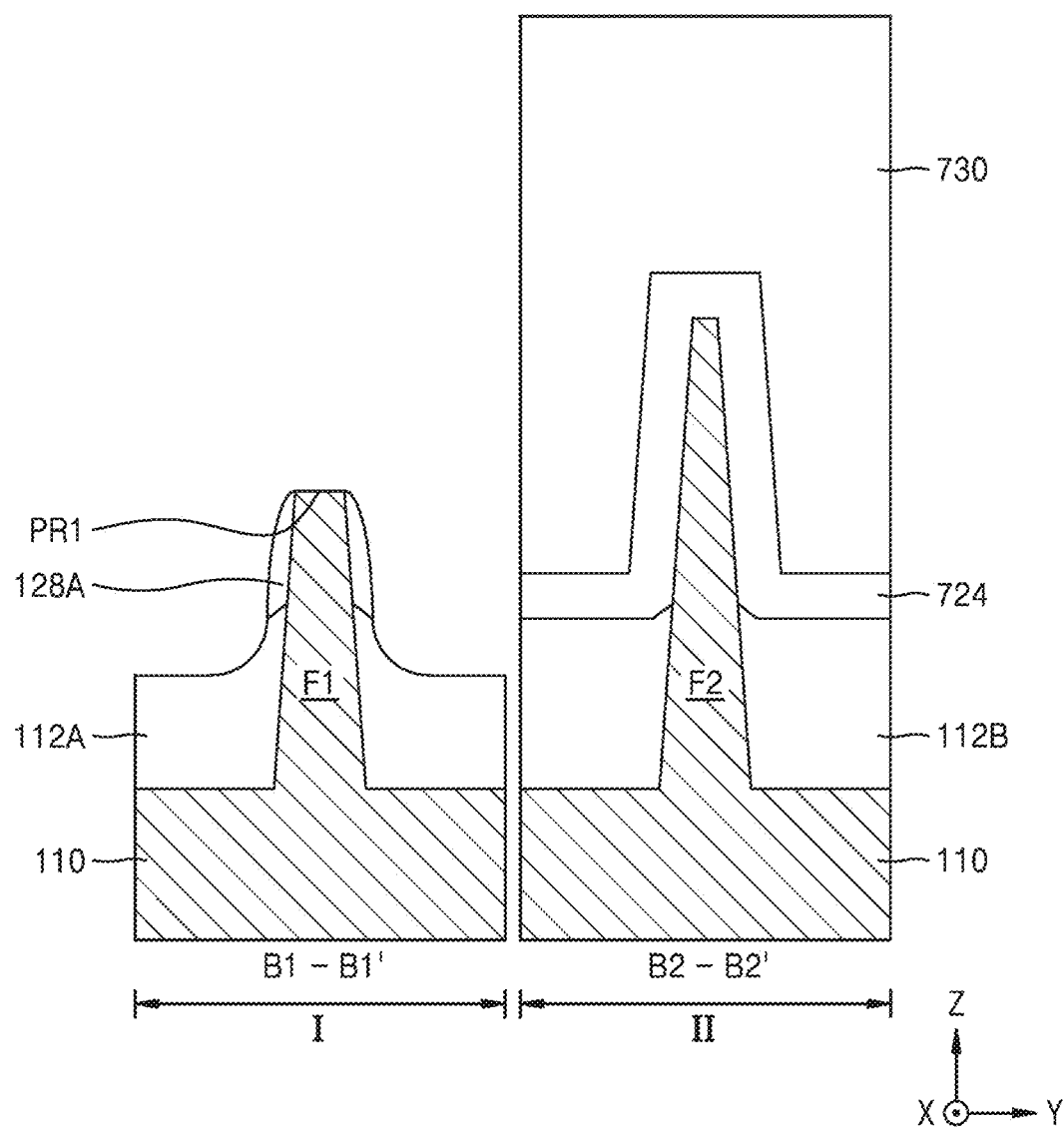
Figure 13B:
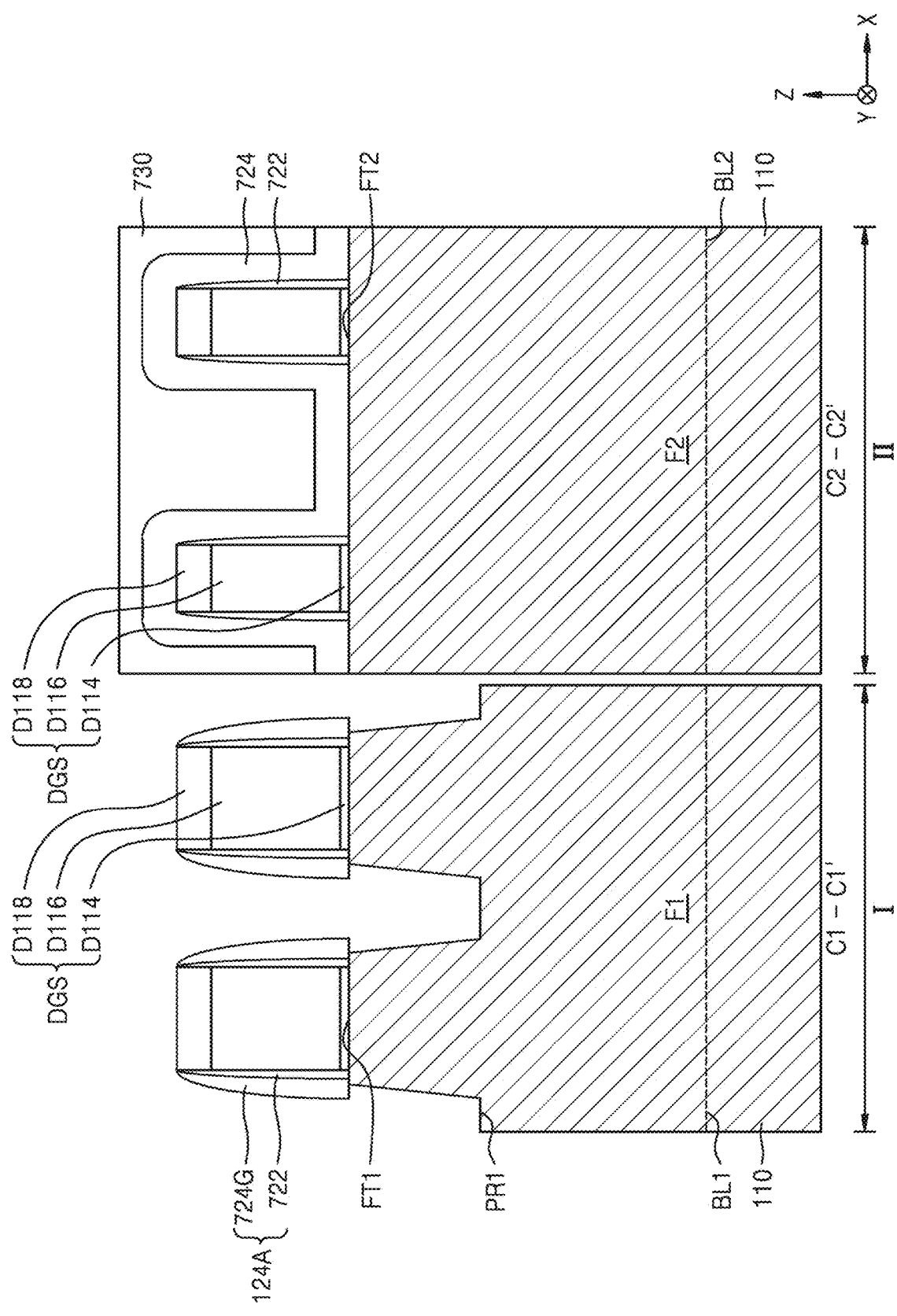

Referring to FIGS. 13A and 13B, while the second region II is covered with a first mask pattern 730, the spacer layer 724 may be partially etched in the first region I so that outer gate insulating spacers 724G may be formed on both sidewalls of the dummy gate structure DGS and cover the inner gate insulating spacers 722. In the first region I, the inner gate insulating spacers 722 and the outer gate insulating spacers 724G may constitute first gate insulating spacers 124A. In the first region I, during the formation of the outer gate insulating spacers 724G, the spacer layer 724 may be etched to expose the first fin-type active region F1. The exposed first fin-type active region F1 may also be etched along with the spacer layer 724 so that a first preliminary recess PR1 may be formed in the first fin-type active region F1 and a pair of first fin insulating spacers 128A may be formed on both sides of the first preliminary recess PR1 and cover both sidewalls of the first fin-type active region F1. In some embodiments, during the process of etching the first fin-type active region F1 to form the first preliminary recess PR1, the dummy gate capping layer D118 of the dummy gate structure DGS may be removed and have a reduced thickness.

Figure 14A:
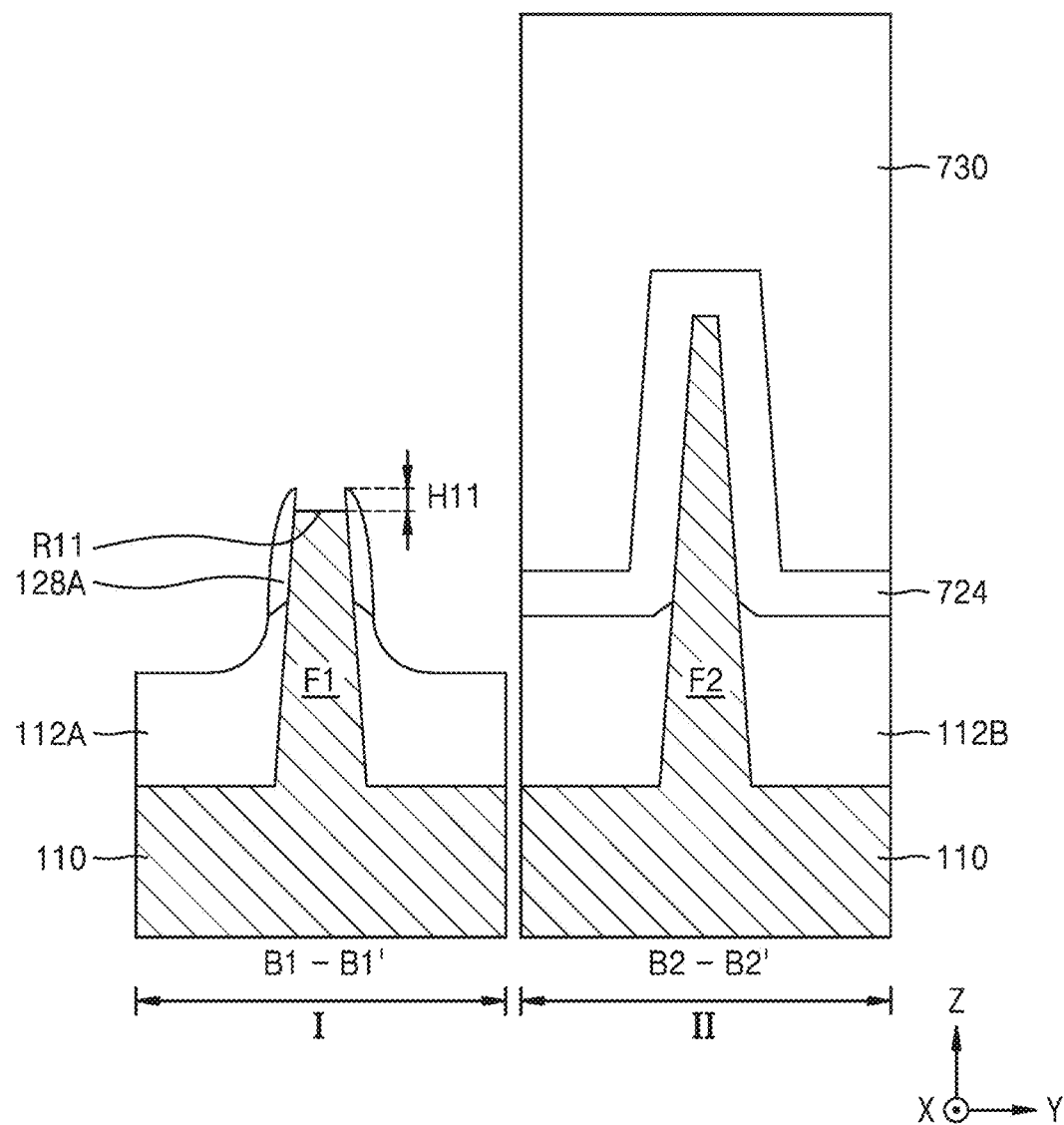
Figure 14B:
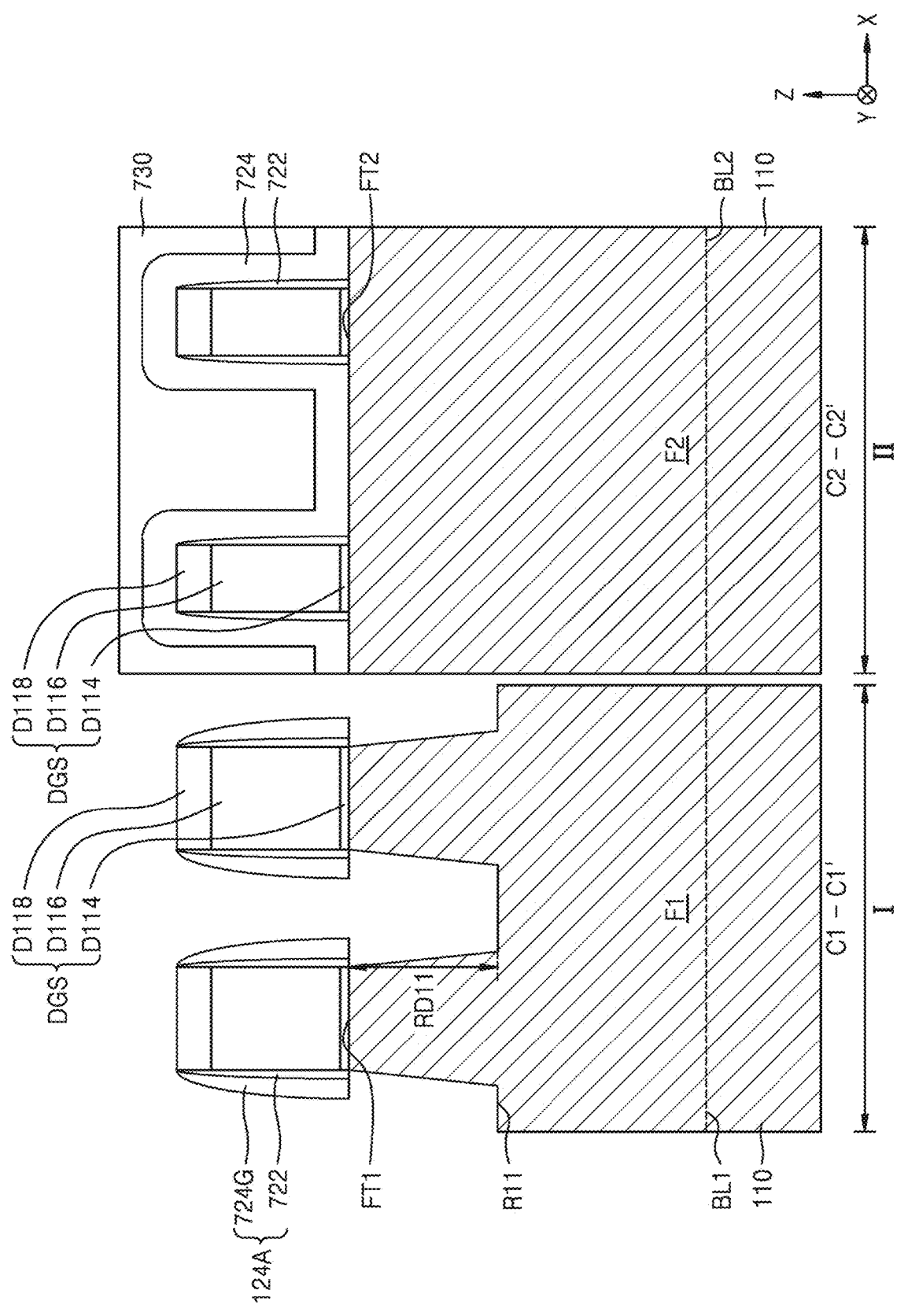

Referring to FIGS. 14A and 14B, a portion of the first fin-type active region F1, which is exposed by the first preliminary recess PR1, may be selectively removed from the resultant structure of FIGS. 13A and 13B so that a first recess R11 may be formed in the first fin-type active region F1. During the process of removing a portion of the first fin-type active region F1 to form the first recess R11, the dummy gate capping layer D118, the first gate insulating spacers 124A, and the first fin insulating spacers 128A may be used as an etch mask.

A bottom surface of the first recess R11 may be at a lower level by a first vertical distance H11 than a top portion of the first fin insulating spacer 128A. The first recess R11 may have a first depth RD11 from a first top surface FT1 of the fin-type active region F1. The bottom surface of the first recess R11 may provide an interface between the first fin-type active region F1 and a first source/drain region 130A to be formed subsequently. Accordingly, the interface between the first fin-type active region F1 and the first source/drain region 130A may have the first depth RD11 from the first top surface FT1 of the first fin-type active region F1.

In some embodiments, to manufacture the IC device 300 shown in FIG. 4 or the IC device 400 shown in FIG. 5, portions of the first fin insulating spacers 128A may also be removed during the process of removing the portion of the first fin-type active region F1 in the process described with reference to FIGS. 14A and 14B. Thus, the first recess R31 and the first fin insulating spacers 328A shown in FIG. 4 may be formed. Alternatively, the first recess R41 and the first fin insulating spacers 428A shown in FIG. 5 may be formed. In some other embodiments, the process described with reference to FIGS. 14A and 14B may be omitted.

During the processes described with reference to FIGS. 13A to 14B, a dry etching process and a wet cleaning process may be performed on the spacer layer 724 and the first fin-type active region F1 so that the outer gate insulating spacers 724G, the first fin insulating spacers 128A, and the first recess R11 may be formed in the first region I.

In some embodiments, a portion of the spacer layer 724 and a portion of the first fin-type active region F1 may be removed by using a dry etching process. As a result, a first preliminary recess (refer to PR1 in FIGS. 13A and 13B) may be formed in the first fin-type active region F1. Also, simultaneously with the formation of the first preliminary recess PR1, first fin insulating spacers 128A may be formed to cover the first device isolation film 112A and both sidewalls of the first fin-type active region F1. Thereafter, a portion of the first fin-type active region F1, which is exposed to a wet cleaning solution, may be further removed by using a wet cleaning process so that the first recess R11 may be formed in the first region I.

During the dry etching process and the wet cleaning process, sizes of the first fin insulating spacers 128A may be adjusted as needed by controlling an etching atmosphere and/or an etch selectivity. The spacer layer 724, which is also exposed to the etching atmosphere, may be partially removed during the dry etching process and/or the wet cleaning process so that outer gate insulating spacers 724G having a shape shown in FIG. 14B may be obtained.

In some embodiments, during the process of forming the spacer layer 724 described with reference to FIGS. 12A and 12B, a spacer layer 724, which may include a SiOCN film and an oxide film covering the SiOCN film, may be formed. In this case, the oxide film may be exposed to a wet cleaning solution and removed during the wet cleaning process. As a result, after the first recess R11 is obtained, the outer gate insulating spacers 724G, which may remain on the sidewalls of the dummy gate structure DGS, and the first fin insulating spacers 128A, which may remain on both sidewalls of a portion of the first fin-type active region F1 in which the first recess R11 is formed, may include not an oxide film but only the SiOCN film.

In an example of the dry etching process, a plasma etching process may be performed by using NH3, CF4, or a combination thereof as an etch gas. In an example of the wet cleaning process, an HF cleaning solution may be performed. However, inventive concepts are not limited thereto, and various changes and modifications may be made.

Figure 15A:
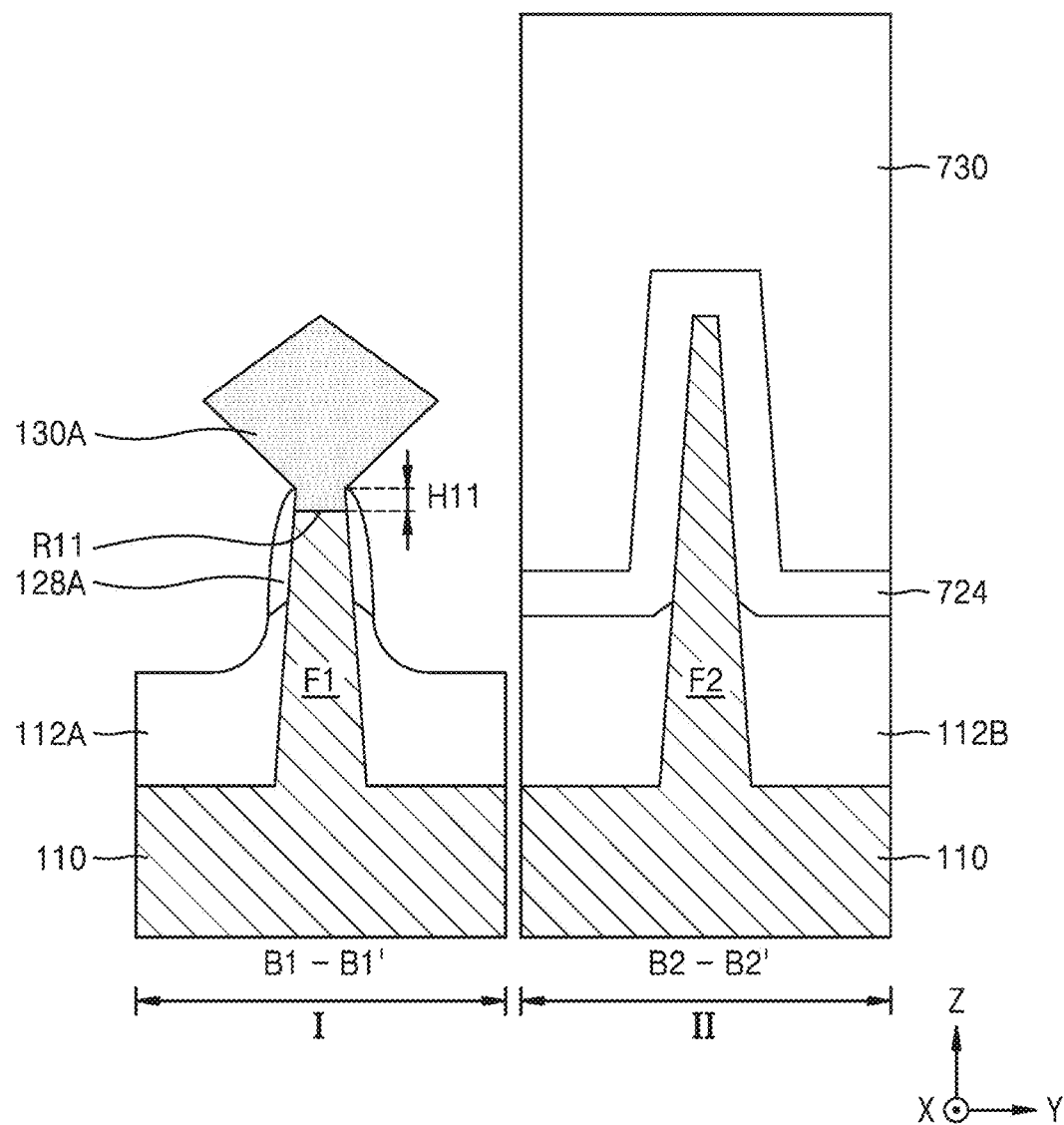
Figure 15B:
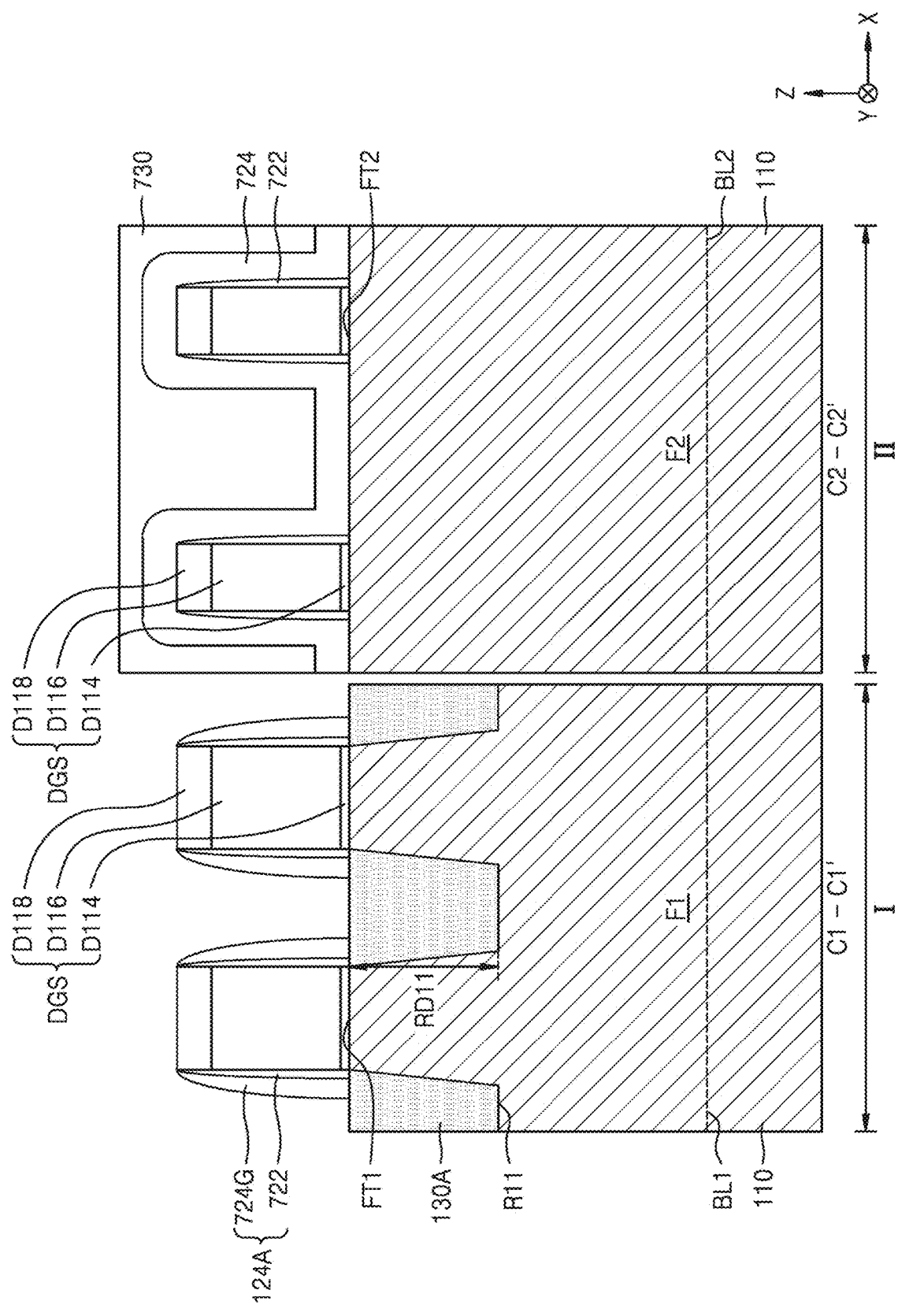

Referring to FIGS. 15A and 15B, in the first region I, a semiconductor layer may be formed by using an epitaxial growth process from the surface of the first fin-type active region F1, which is exposed by the first recess R11, to form a plurality of first source/drain regions 130A. The plurality of first source/drain regions 130A may include a doped semiconductor layer (e.g., a doped Si, SiGe, or SiC layer).

In some embodiments, when the process described with reference to FIGS. 14A and 14B is omitted, the first preliminary recess PR1 shown in FIGS. 13A and 13B may remain on the first fin-type active region F1 instead of the first recess R11. The first source/drain region 130A may be epitaxially grown from the surface of the first fin-type active region F1 exposed by the first preliminary recess PR1.

In some embodiments, the process of forming the first source/drain region 130A may not be performed as described with reference to FIGS. 15A and 15B, but be performed after a process of forming a second recess R12, as described below with reference to FIGS. 17A and 17B. In this case, after the first recess R11 is formed in the first region I as described with reference to FIGS. 14A and 14B, the process described with reference to FIGS. 15A and 15B may be omitted, and a process that will be described below with reference to FIGS. 16A and 16B may be performed.

Figure 16A:
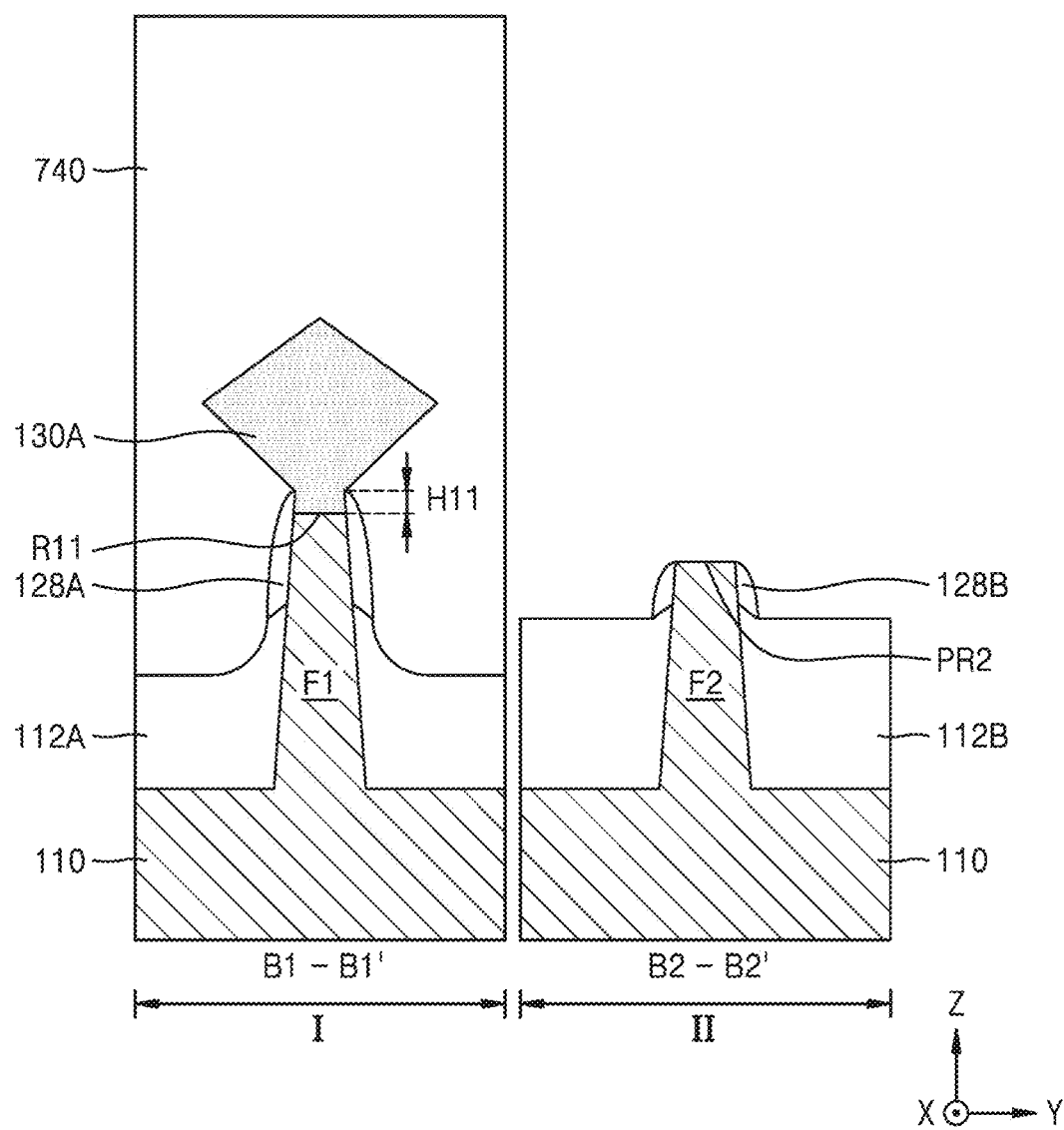
Figure 16B:
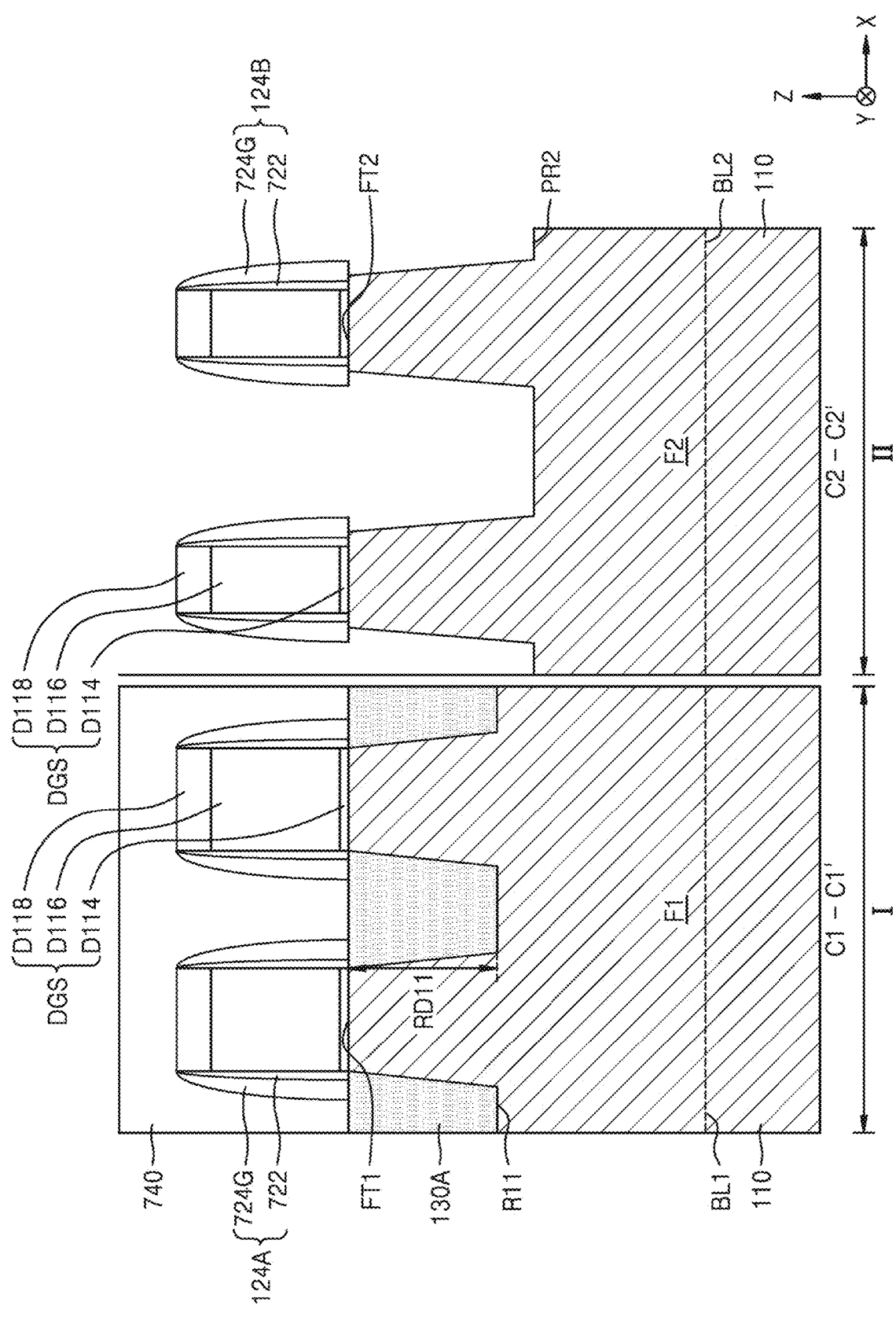

Referring to FIGS. 16A and 16B, after the first mask pattern (refer to 730 in FIGS. 15A and 15B) is removed, while the first region I is covered with a second mask pattern 740, the spacer layer 724 may be etched in the second region II so that outer gate insulating spacers 724G may be formed over both sidewalls of the dummy gate structure DGS to cover the inner gate insulating spacers 722. In the second region II, the inner gate insulating spacers 722 and the outer gate insulating spacers 724G may constitute second gate insulating spacers 124B. In the second region II, during the formation of the outer gate insulating spacers 724G, the second fin-type active region F2 may be exposed due to the etching of the spacer layer 724. Thus, the exposed second fin-type active region F2 may also be etched along with the spacer layer 724 so that a second preliminary recess PR2 may be formed in the second fin-type active region F2. In some embodiments, during the etching of the second fin-type active region F2, the dummy gate capping layer D118 of the dummy gate structure DGS may be removed and have a reduced thickness.

In the second region II, during the formation of the outer gate insulating spacers 724G and the second preliminary recess PR2, second fin insulating spacers 128B may remain as portions of the spacer layer 724 on both sidewalls of the second fin-type active region F2.

Figure 17A:
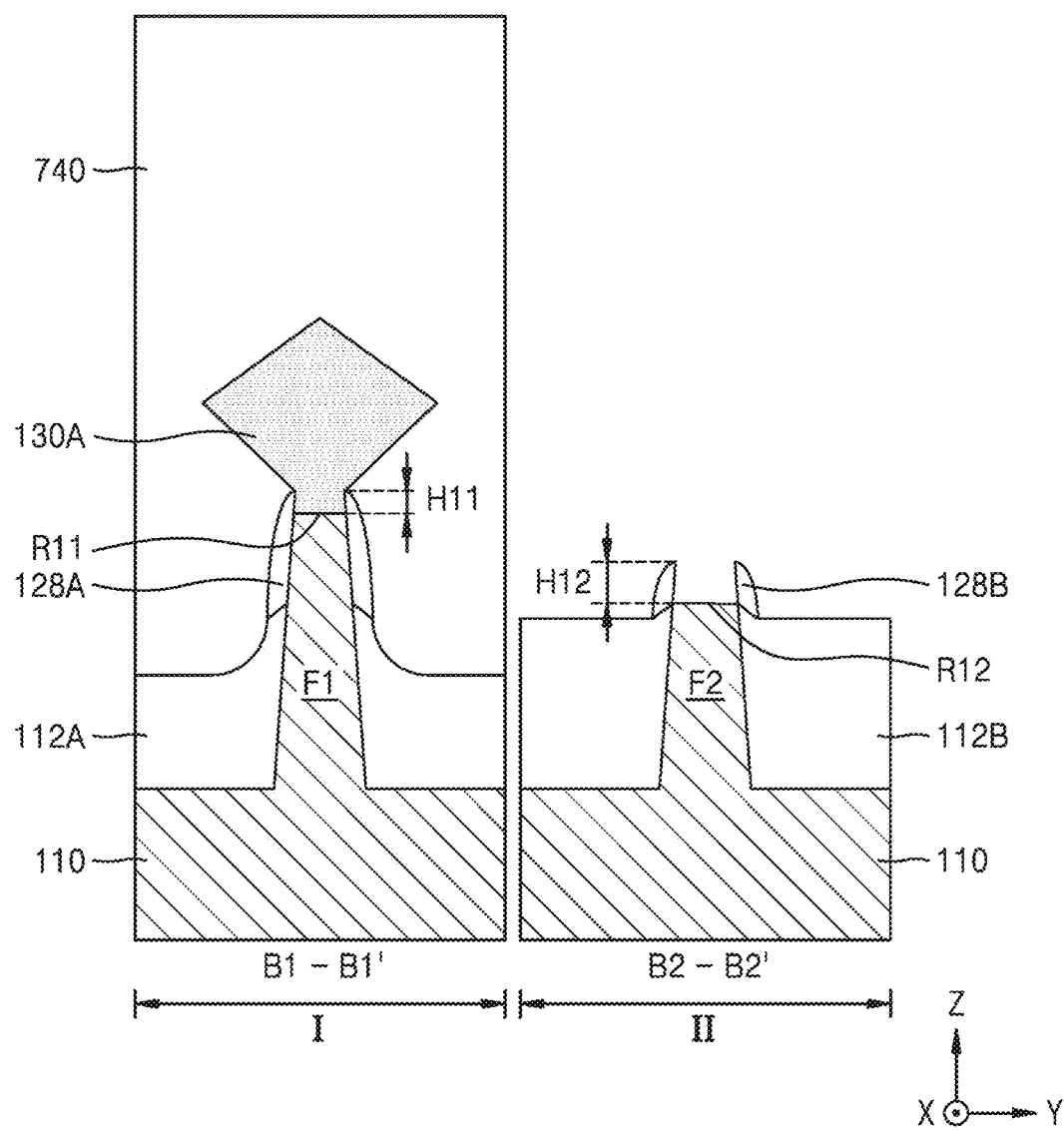
Figure 17B:
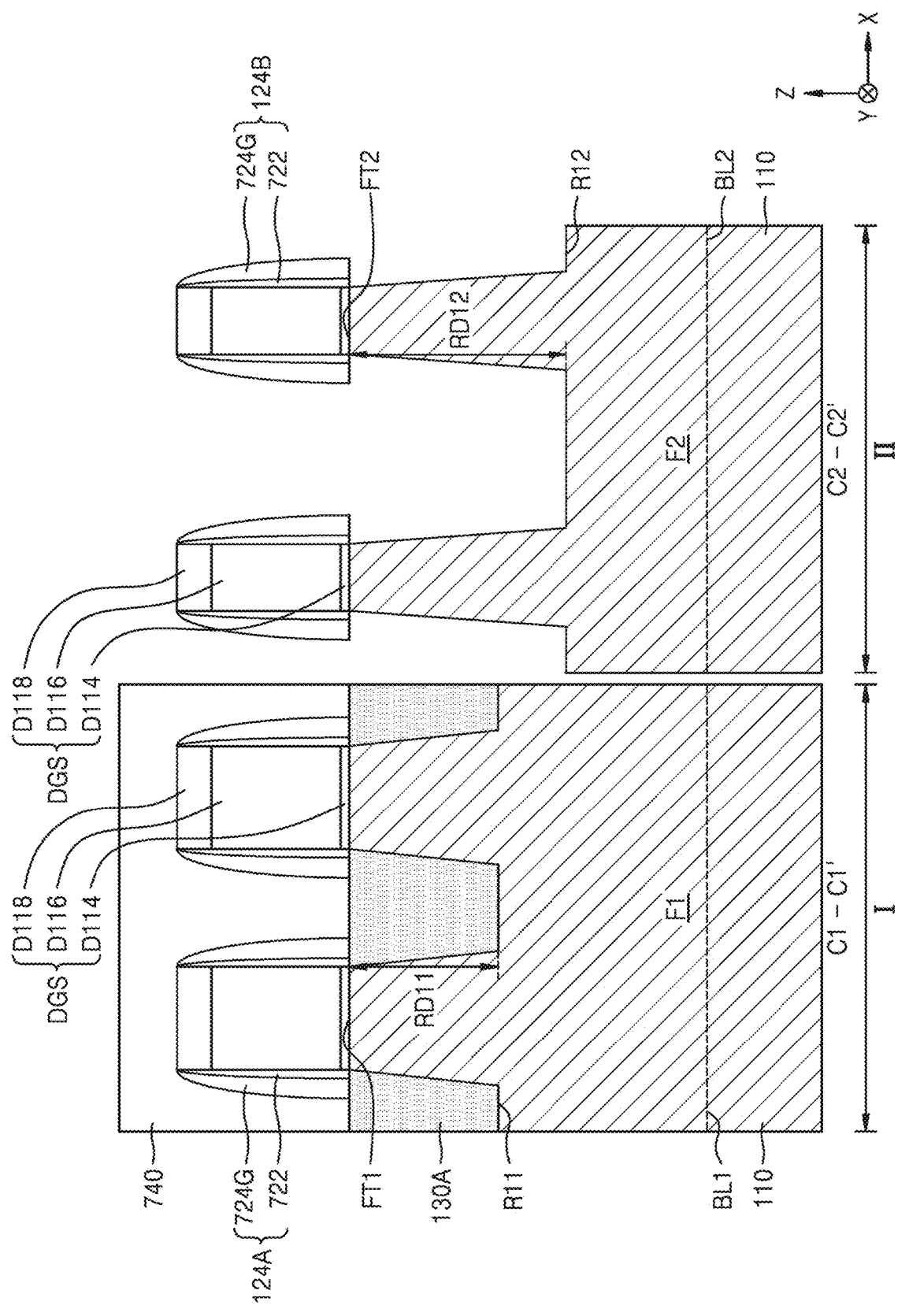

Referring to FIGS. 17A and 17B, the second fin-type active region F2 exposed by the second preliminary recess PR2 may be selectively removed from the resultant structure shown in FIGS. 16A and 16B so that a second recess R12 may be formed in the second fin-type active region F2. During the process of removing the second fin-type active region F2 to form the second recess R12, the dummy gate capping layer D118, the second gate insulating spacers 124B, and the second fin insulating spacers 128B may be used as an etch mask. A bottom surface of the second recess R12 may be at a lower level by a second vertical distance H12 than top portions of the second fin insulating spacers 128B. The second vertical distance H12 may be greater than the first vertical distance H11. The second recess R12 may have a second depth RD12 from the second top surface FT2 of the second fin-type active region F2. The bottom surface of the second recess R12 may provide an interface between the second fin-type active region F2 and a second source/drain region 130B to be formed subsequently. Accordingly, the interface between the second source/drain region 130B and the second fin-type active region F2 may have the second depth RD12 from the second top surface FT2 of the second fin-type active region F2. The second depth RD12 may be greater than the first depth RD11.

When the processes described with reference to FIGS. 16A to 17B are performed, as described with reference to FIGS. 13A to 14B, a dry etching process and a wet cleaning process may be performed on the spacer layer 724 and the second fin-type active region F2 so that the outer gate insulating spacers 724G, the second fin insulating spacers 128B, and the second recess R12 may be formed in the second region II. An etching atmosphere and/or an etch selectivity may be controlled as needed during the dry etching process and the wet cleaning process. Thus, any one of the second recesses R22, R32, R42, R52 having various depths may be formed as shown in FIGS. 3 to 5, 8B, and 9A to 9C. Alternatively, the second fin insulating spacers 128B may not remain on both sidewalls of the second fin-type active region F2 as shown in FIG. 5. Alternatively, shapes and sizes of the second fin insulating spacers 128B may be adjusted as needed to form, for example, the second fin insulating spacers 628B and 638B shown in FIGS. 9A to 9C or second insulating spacers having variously modified and changed structures within the scope.

Figure 18A:
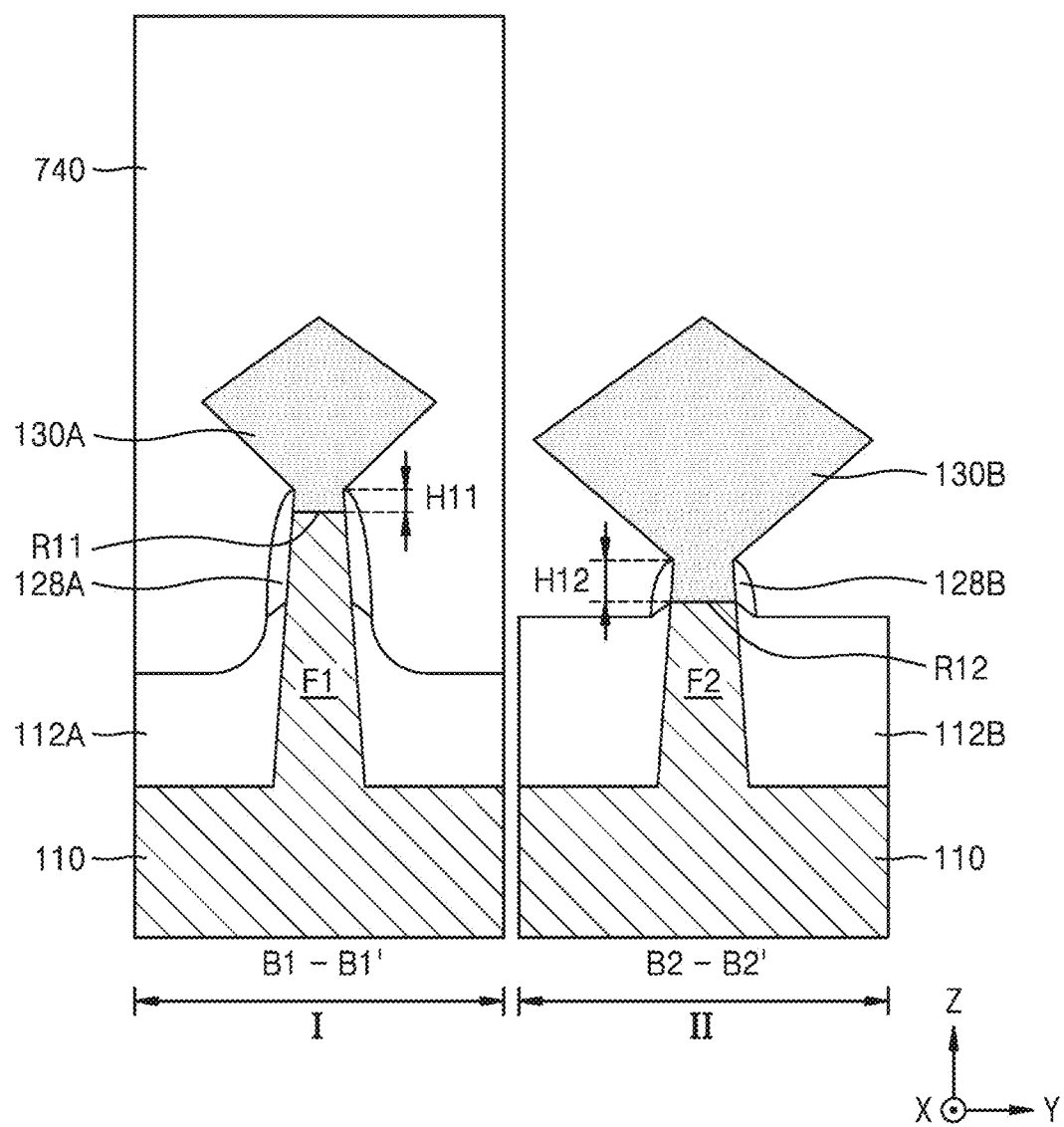
Figure 18B:
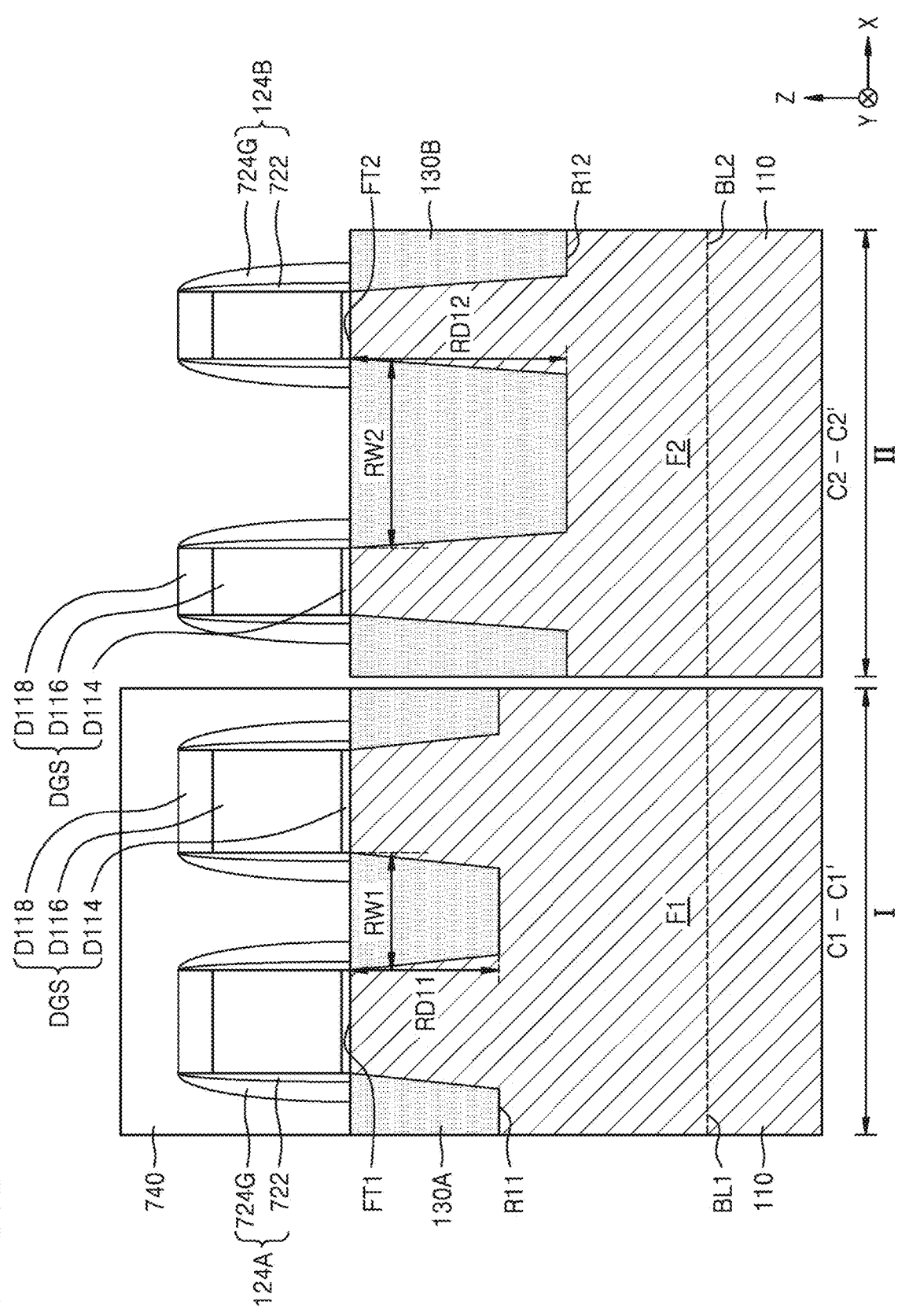

Referring to FIGS. 18A and 18B, in the second region II, a semiconductor layer may be formed by using an epitaxial growth process from the surface of the second fin-type active region F2, which is exposed by the second recess R12, to form a plurality of second source/drain regions 130B. The plurality of second source/drain regions 130B may have top surfaces T2 at a higher level than top surfaces T1 of the plurality of first source/drain regions 130A formed in the first region I.

In some embodiments, when the process described above with reference to FIGS. 15A and 15B is omitted, after the second recess R12 is formed in the second region II and the second mask pattern 740 is removed, the plurality of first source/drain regions 130A may be formed in the first region I. The plurality of first source/drain regions 130A may be formed during the formation of the plurality of second source/drain regions 130B or before or after the formation of the second source/drain regions 130B.

Figure 19A:
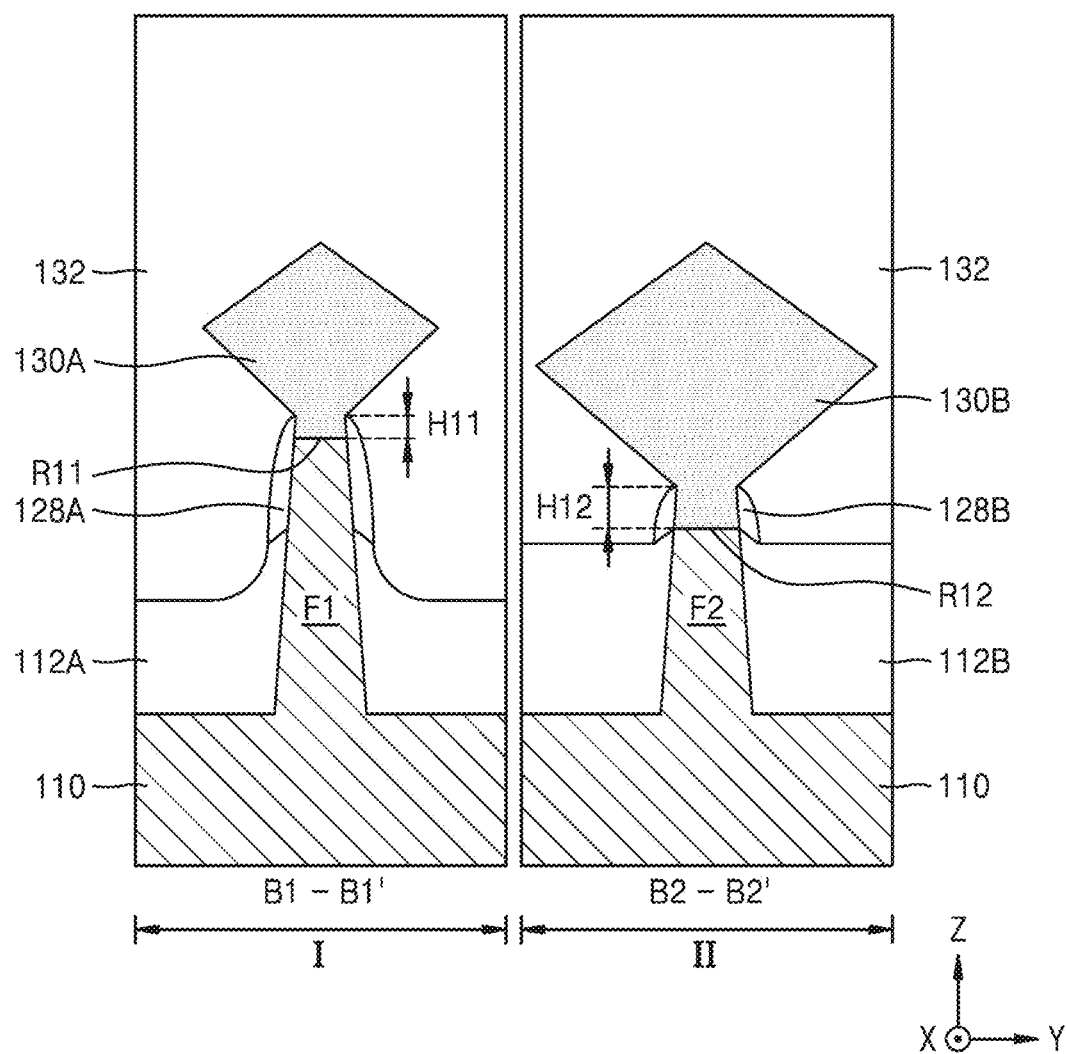

Referring to FIGS. 19A and 19B, after the second mask pattern (refer to 740 in FIGS. 18A and 18B), an inter-gate dielectric film 132 may be formed in the first region I and the second region II to cover the first and second source/drain regions 130A and 130B, the dummy gate structure DGS, and the first and second gate insulating spacers 124A and 124B.

In an example of the process of forming the inter-gate dielectric film 132, an insulating film may be formed in the first region I and the second region II to cover the first and second source/drain regions 130A and 130B, the dummy gate structure DGS, and the first and second gate insulating spacers 124A and 124B to a sufficient thickness. Thereafter, the resultant structure including the insulating film may be planarized to expose a plurality of dummy gate structures DGS so that the inter-gate dielectric film 132 may have a planarized top surface.

Figure 20A:
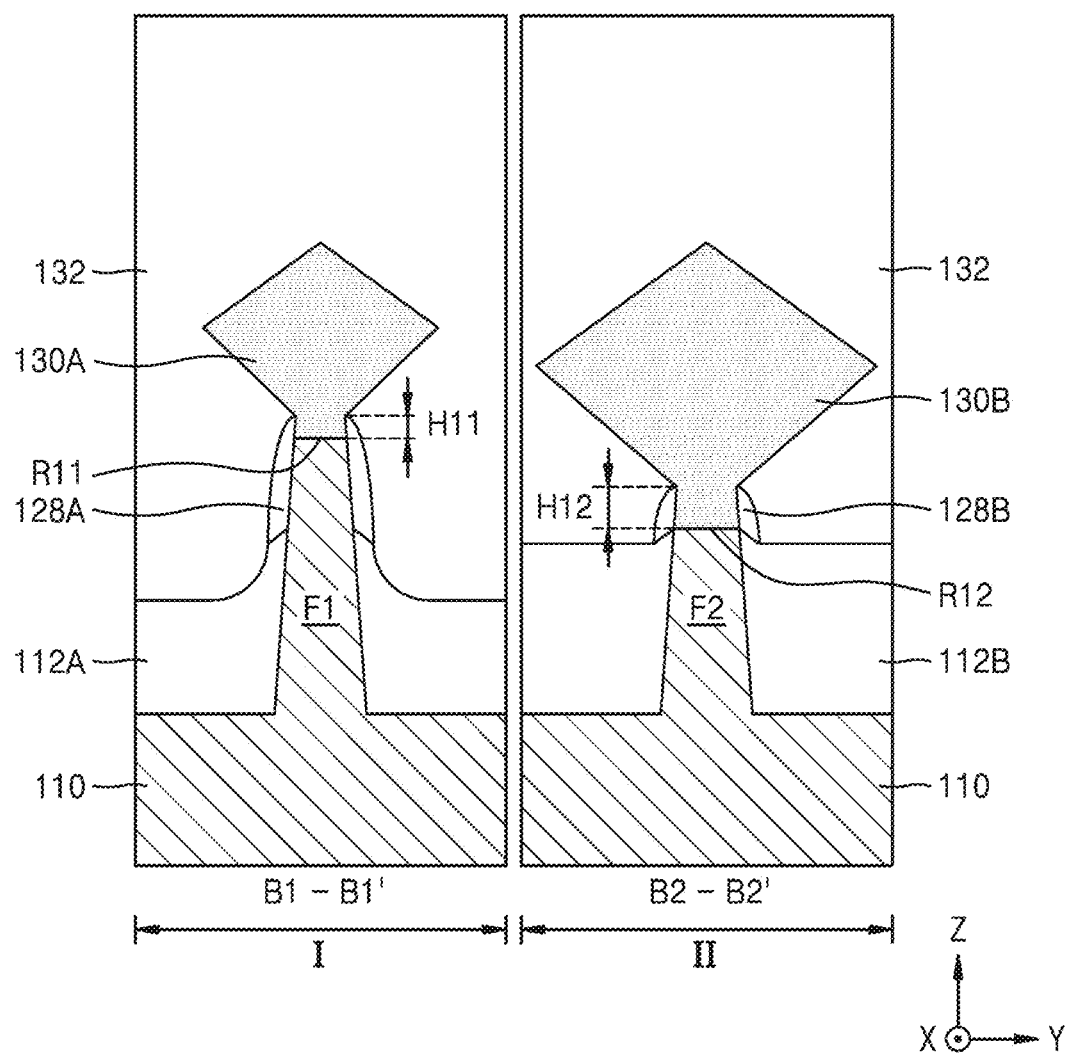
Figure 20B:
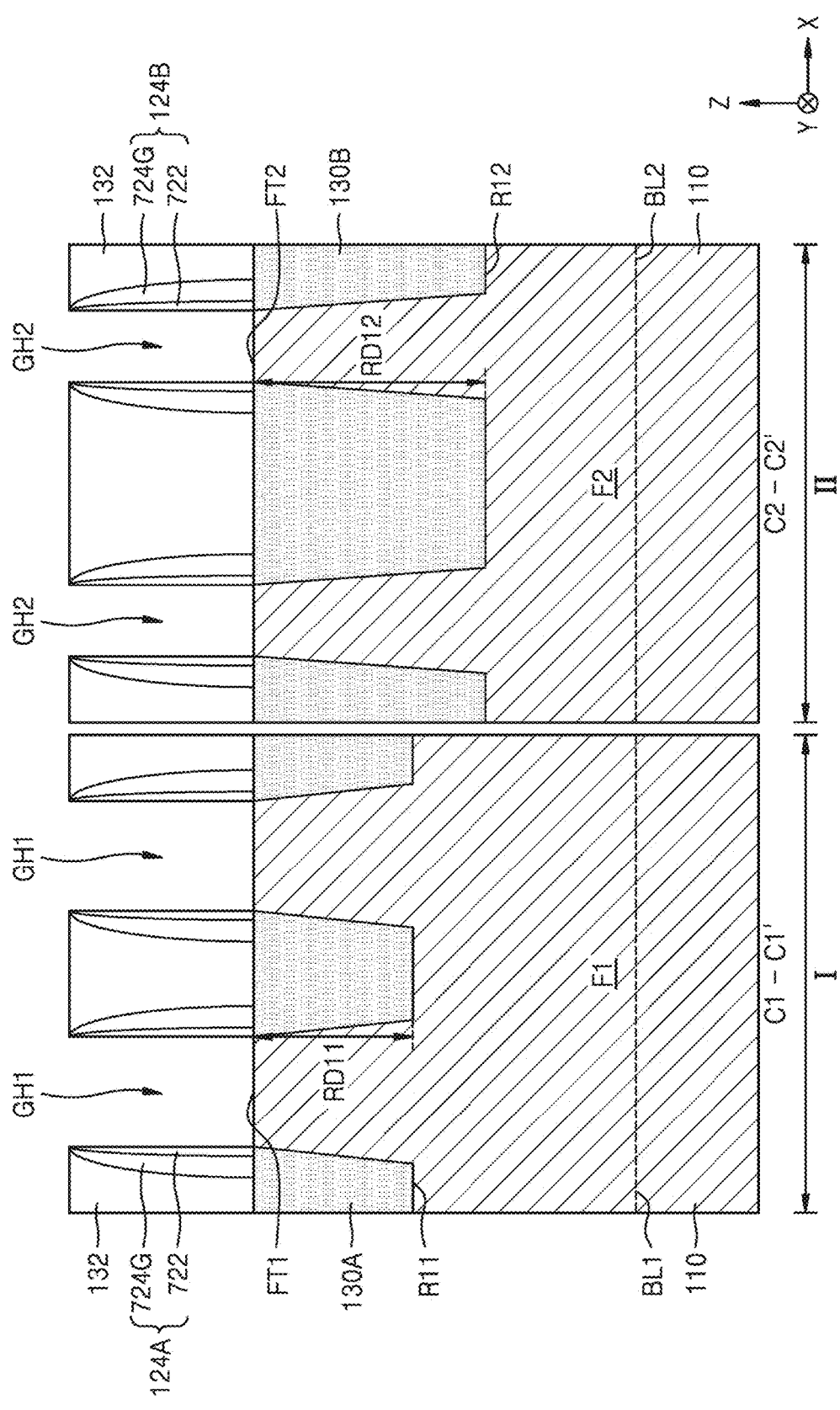

Referring to FIGS. 20A and 20B, in the first region I and the second region II, the plurality of dummy gate structures DGS exposed by the inter-gate dielectric film 132 may be removed so that a first gate space GH1 may be formed in the first region I and a second gate space GH2 may be formed in the second region II.

The first gate insulating spacers 124A and the first fin-type active region F1 may be exposed by the first gate space GH1, while the second gate insulating spacers 124B and the second fin-type active region F2 may be exposed by the second gate space GH2.

Figure 21A:
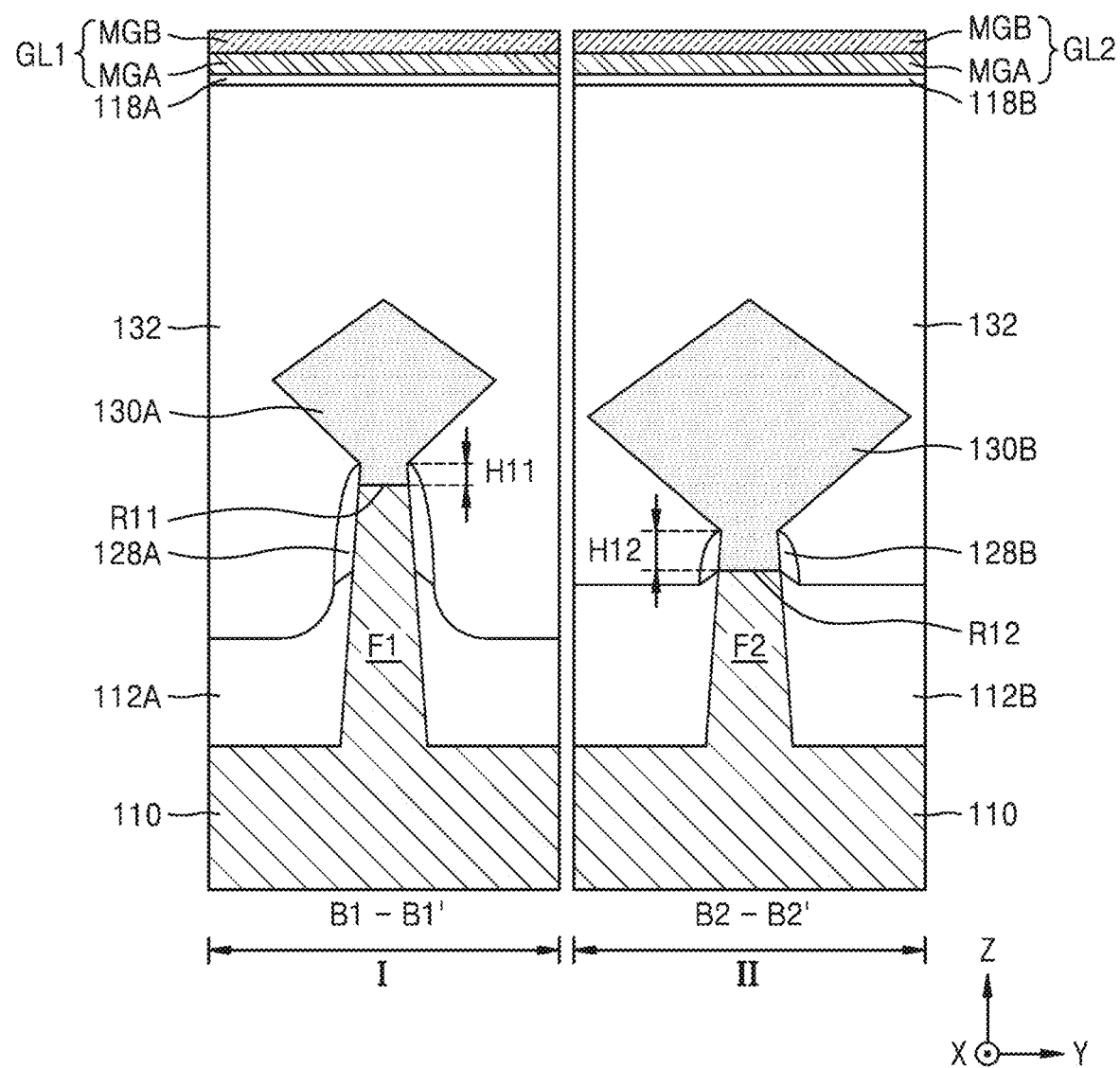
Figure 21B:
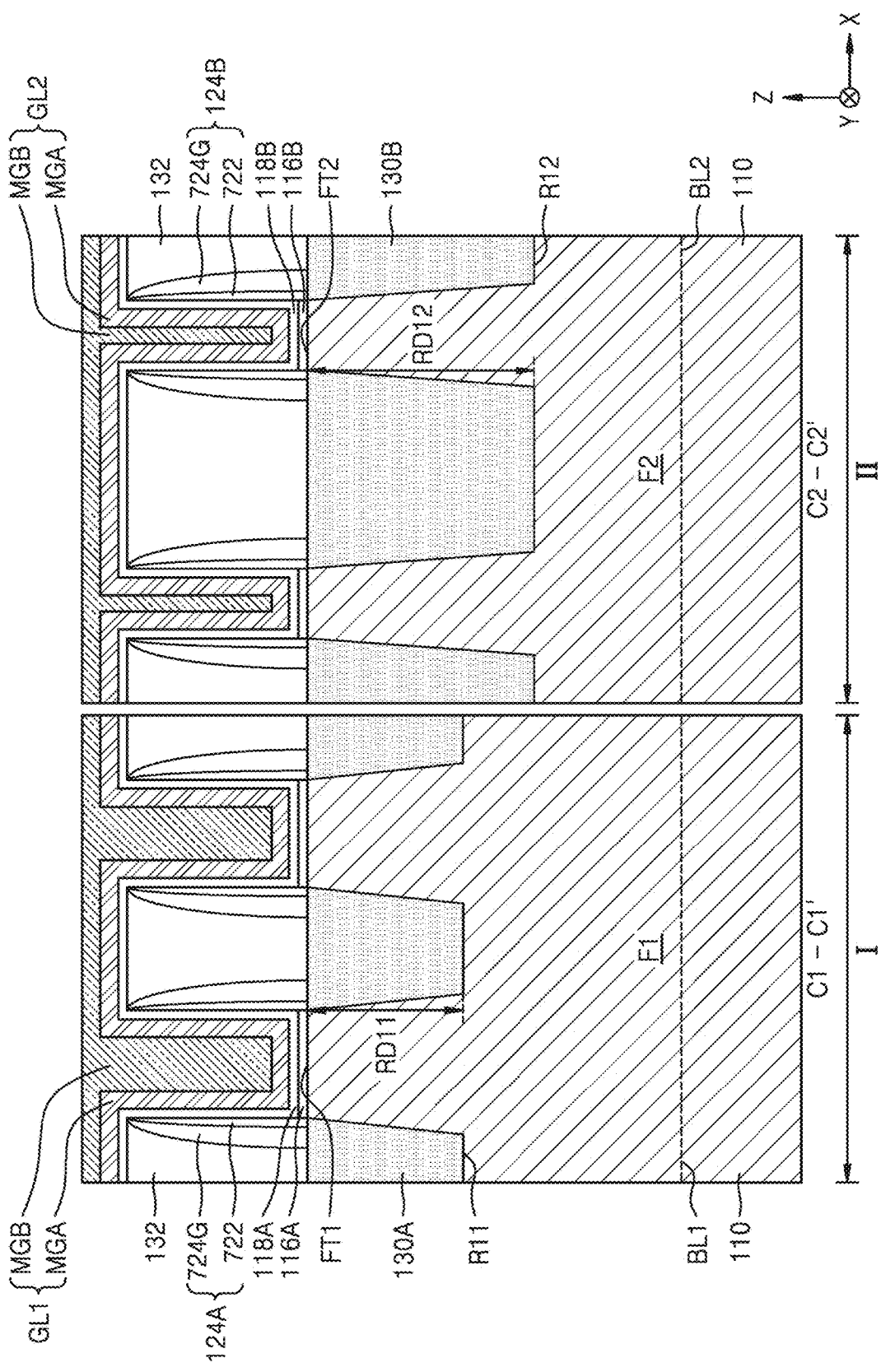

Referring to FIGS. 21A and 21B, in the first region I and the second region II, first and second interface films 116A and 116B, first and second gate insulating films 118A and 118B, and first and second gate lines GL1 and GL2 may be formed in the first and second gate spaces (refer to GH1 and GH2 in FIG. 20B). In an example of the process of forming the first and second interface films 116A and 116B, portions of the first and second fin-type active regions F1 and F2 exposed in the first and second gate spaces (refer to GH1 and GH2 in FIG. 20B) may be oxidized.

The first and second gate insulating films 118A and 118B and the first and second gate lines GL1 and GL2 may fill the first and second gate spaces (refer to GH1 and GH2 in FIG. 20B) and cover a top surface of the inter-gate dielectric film 132. The first and second gate insulating films 118A and 118B may be formed by using an atomic layer deposition (ALD) process, a chemical vapor deposition (CVD) process, or a physical vapor deposition (PVD) process.

The first and second gate lines GL1 and GL2 may be formed to a sufficient thickness to fill the first and second gate spaces GH1 and GH2. Each of the first and second gate lines GL1 and GL2 may include a first metal-containing layer MGA and a second metal-containing layer MGB. Functions and structures of the first metal-containing layer MGA and the second metal-containing layer MGB will be understood based on the descriptions presented with reference to FIGS. 2A to 2D. The formation of the first and second gate lines GL1 and GL2 may be performed by using an ALD process, a CVD process, or a PVD process.

Figure 22A:
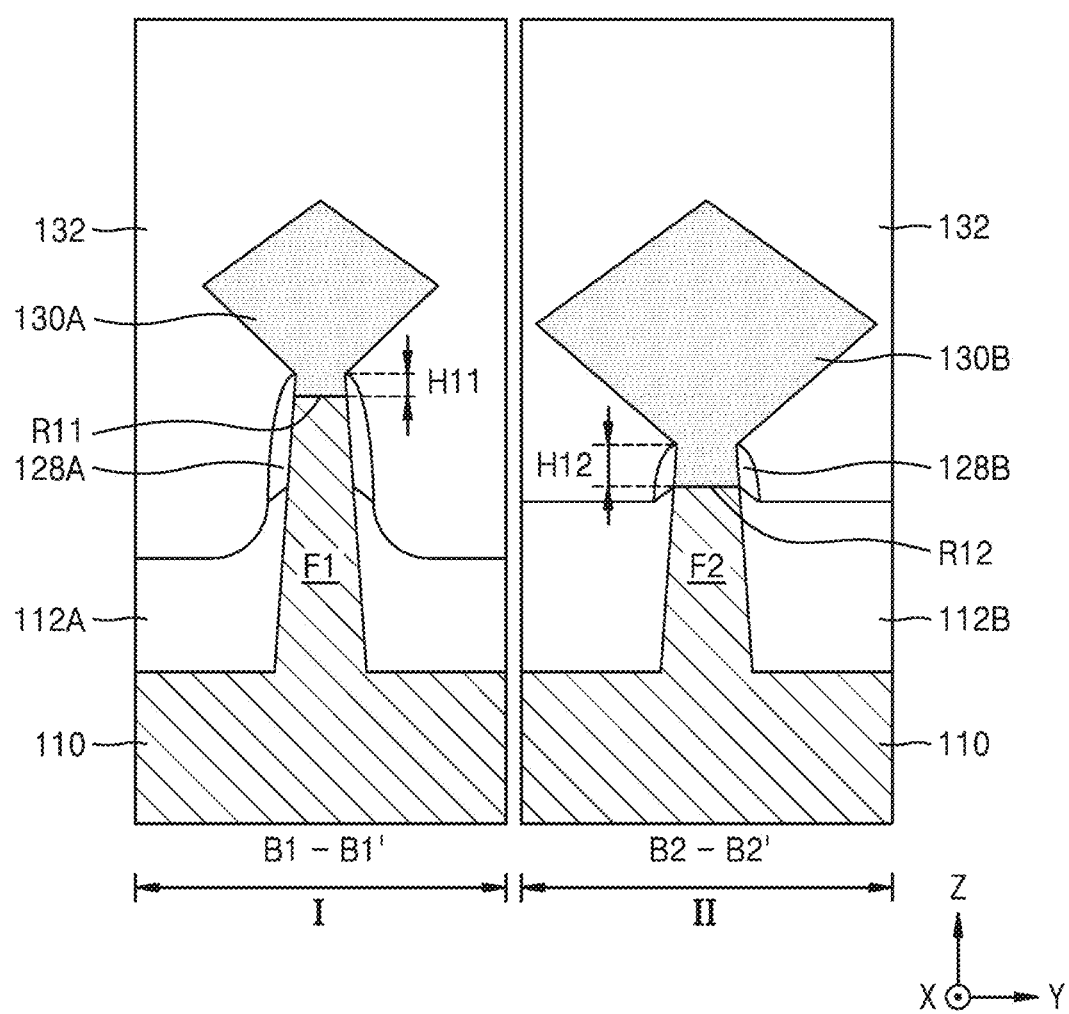
Figure 22B:
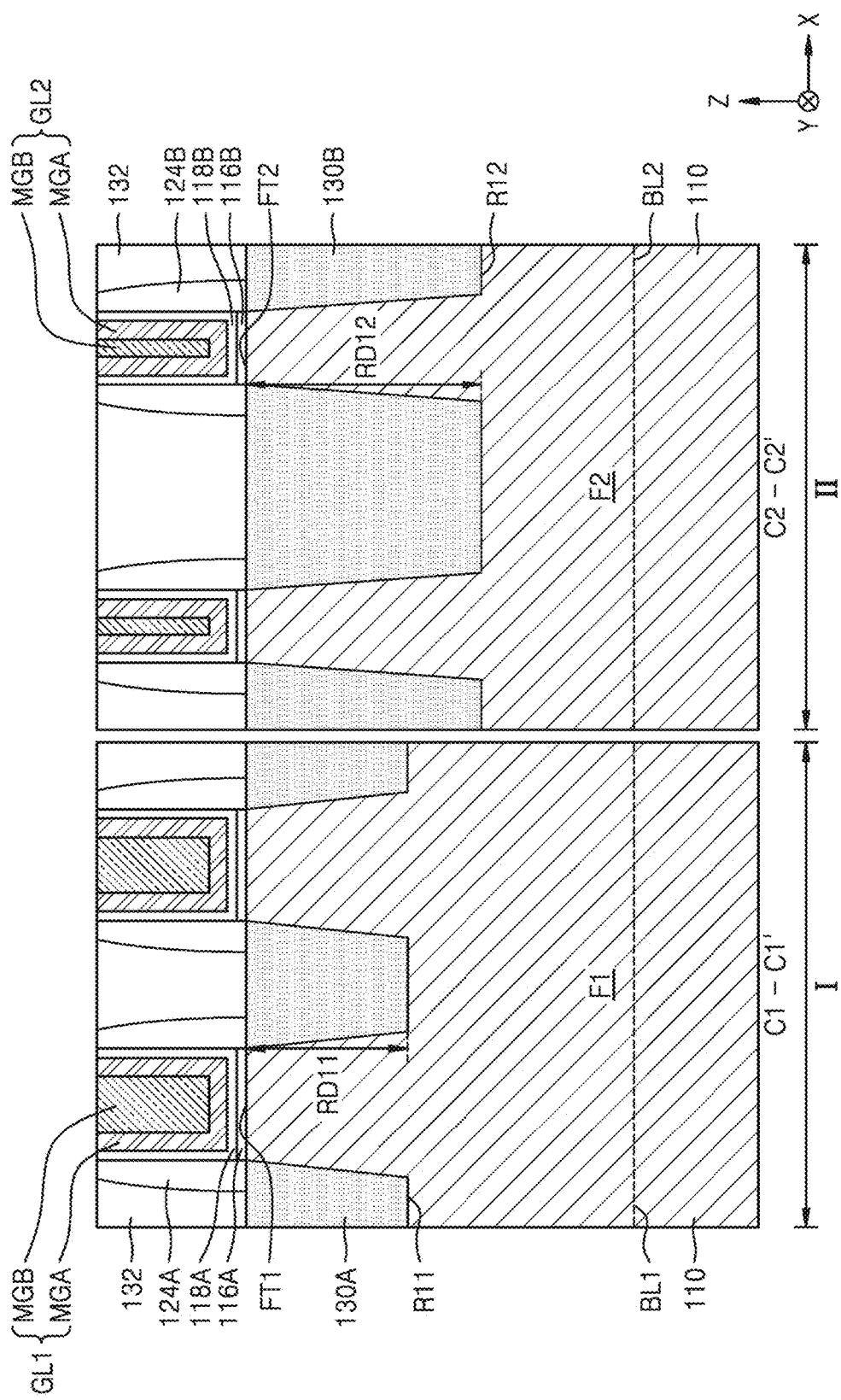

Referring to FIGS. 22A and 22B, unnecessary portions may be removed by using a planarization process from the resultant structure shown in FIGS. 21A and 21B in the first region I and the second region II so that the first and second gate lines GL1 and GL2 and the first and second gate insulating films 118A and 118B may remain only in the first and second gate spaces GH1 and GH2.

As a result of the planarization process, a top surface of each of the first and second gate insulating spacers 124A and 124B and the inter-gate dielectric film 132 may be removed by as much as a desired (and/or alternatively predetermined) thickness, so that a size (e.g., a vertical thickness) of each of the first and second gate insulating spacers 124A and 124B and the inter-gate dielectric film 132 in the Z direction may be reduced, and top surfaces of the first and second gate insulating films 118A and 118B, the top surfaces of the first and second gate insulating spacers 124A and 124B, and the top surface of the inter-gate dielectric film 132 may be exposed in the vicinity of each of top surfaces of the first and second gate lines GL1 and GL2.

Figure 23A:
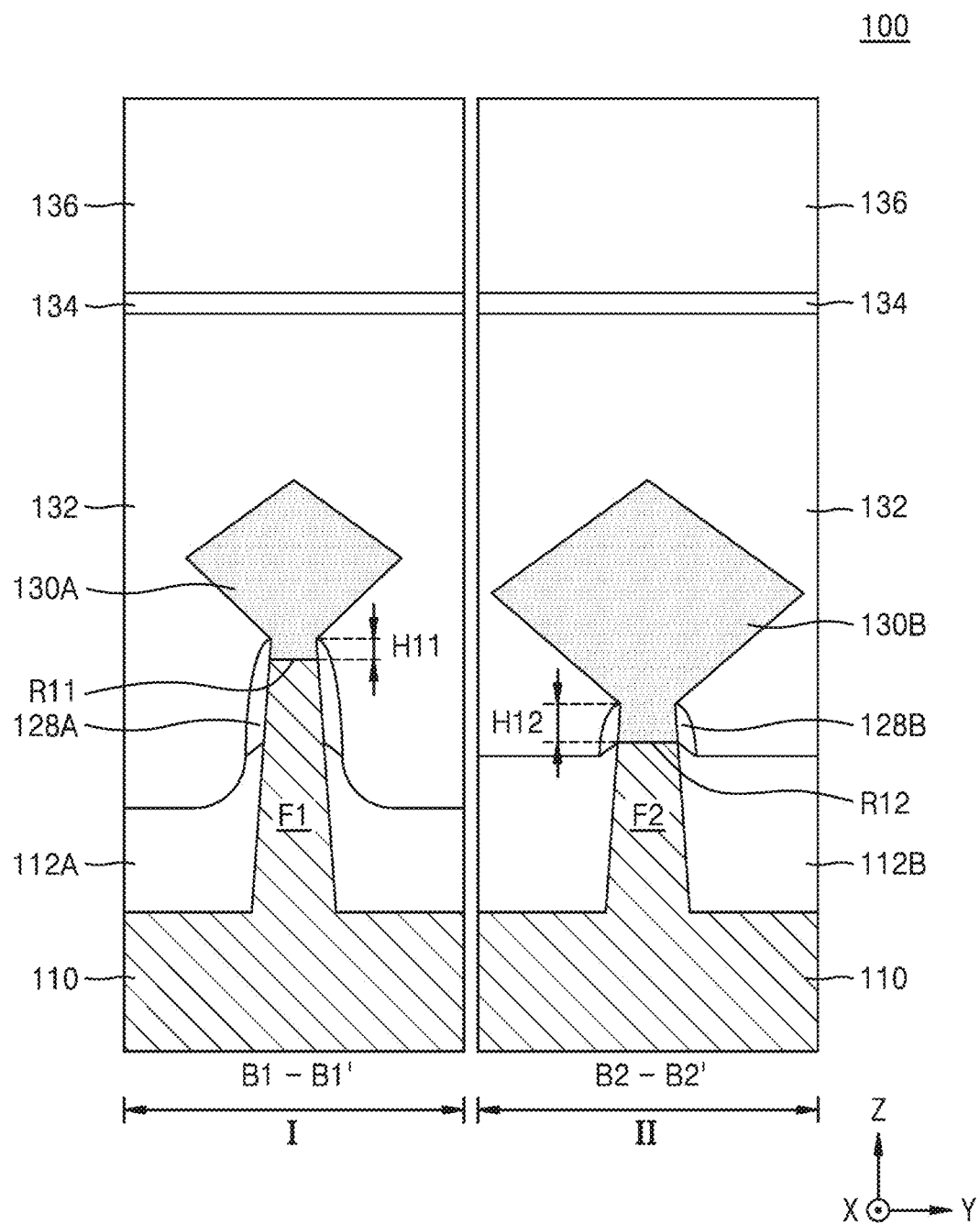
Figure 23B:
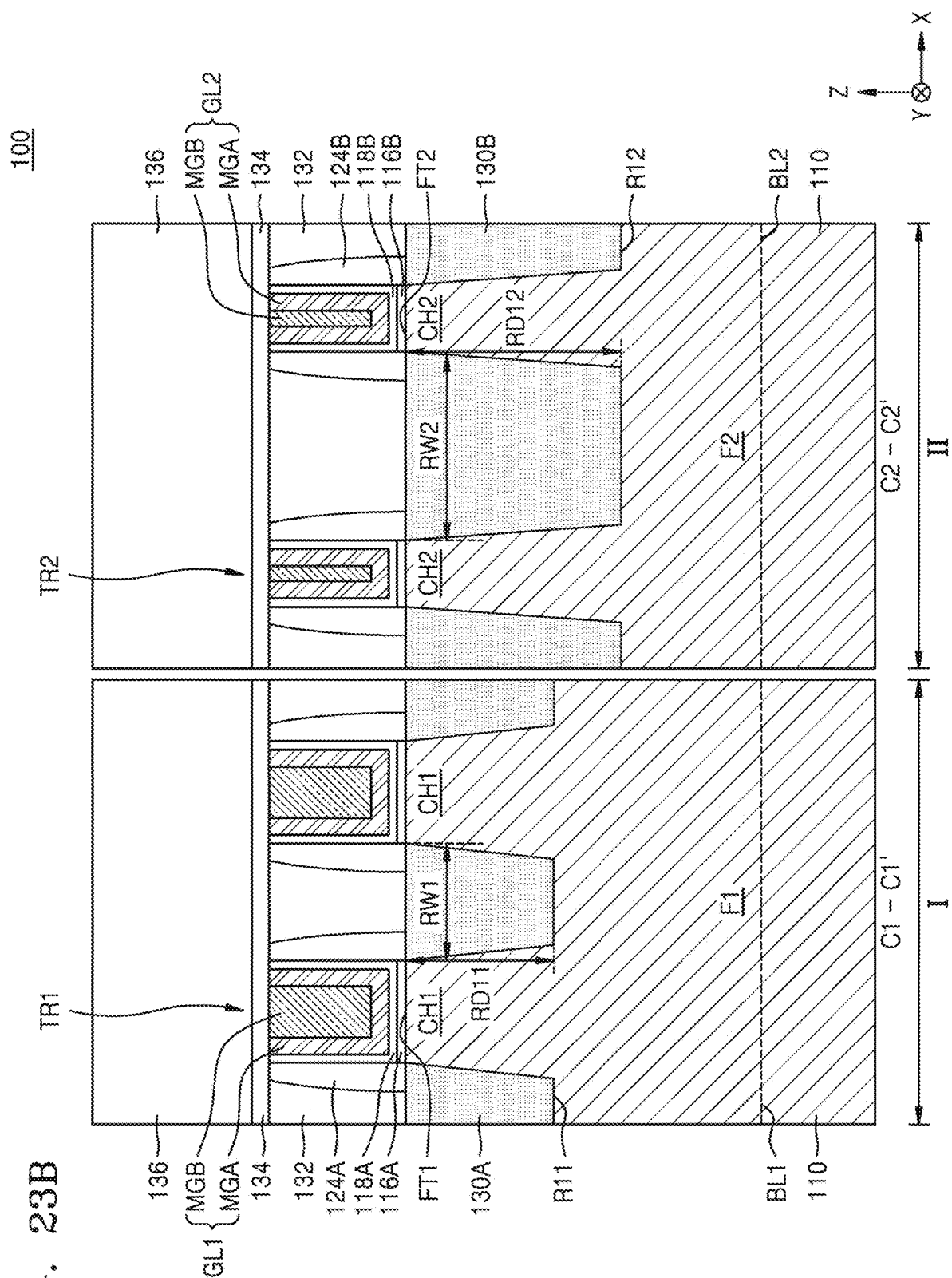

Referring to FIGS. 23A and 23B, in the first region I and the second region II, a blocking insulating film 134 and an interlayer insulating film 136 may be sequentially formed to cover the top surfaces of the first and second gate lines GL1 and GL2 and the top surface of the inter-gate dielectric film 132.

Thereafter, when necessary, after a mask pattern (not shown) is formed on the interlayer insulating film 136, the interlayer insulating film 136, the blocking insulating film 134, and the inter-gate dielectric film 132 may be sequentially etched by using the mask pattern as an etch mask so that a contact hole (not shown) may be formed through the interlayer insulating film 136, the blocking insulating film 134, and the inter-gate dielectric film 132. Afterwards, the contact hole may be filled with a conductive material to form a source/drain contact plug (not shown) to be electrically connected to the first and second source/drain regions 130A and 130B.

The present embodiment described with reference to FIGS. 10A to 23B pertains to an example in which the method of manufacturing an IC device includes forming the first recess R11 in the first region I and forming the first source/drain region 130A and subsequently, forming the second recess R12 in the second region II and forming the second source/drain region 130B, but inventive concepts are not limited thereto. For example, after forming the second recess R12 in the second region II and forming the second source/drain region 130B, the first recess R11 may be formed in the first region I and the first source/drain region 130A may be formed.

Although the method of manufacturing the IC device 100 shown in FIGS. 2A to 2D has been described as an example with reference to FIGS. 10A to 23B, the IC devices 200, 300, and 400 shown in FIGS. 3 to 5 and IC devices having variously modified and changed structures within the scope may be manufactured based on the descriptions presented with reference to FIGS. 10A to 23B. Also, to form the logic devices 500B and 600 shown in FIGS. 8A, 8B, and 9A to 9C, a plurality of second fin-type active regions F2 extending parallel to one another may be formed in the second region II during the process described with reference to FIGS. 10A and 10B. In this case, as a result of the processes described with reference to FIGS. 11A to 17B, a second recess R52 may be formed in each of the plurality of second fin-type active regions F2. In this case, by changing various process conditions, second fin insulating spacers 128B, 628B, and 638B having various structures may be formed as shown in FIGS. 8B and 9A to 9C. Alternatively, second fin insulating spacers may not be formed in partial regions.

Thereafter, by performing a similar process to the process of forming the second source/drain region 130B described with reference to FIGS. 18A and 18B, a second source/drain region 530 may be formed as shown in FIGS. 8B and 9A to 9C. That is, the second source/drain region 530 may extend across the plurality of second fin-type active regions F2 and be connected to the plurality of second fin-type active regions F2. The processes described with reference to FIGS. 19A to 23B may be performed on the resultant structure including the second source/drain region 530 so that a blocking insulating film 134 and an interlayer insulating film 136 may be sequentially formed. Afterwards, a contact hole (not shown) exposing the second source/drain region 530 may be formed through the interlayer insulating film 136, the blocking insulating film 134, and the inter-gate dielectric film 132. The contact hole may be filled with a conductive material to form a first contact plug CP1 to be connected to the second source/drain region 530. An upper insulating film 562 and a first conductive via contact VC1 may be sequentially formed on the first conductive plug CP1.

In methods of manufacturing an IC according to some example embodiments of inventive concepts, IC devices having different structures may be easily manufactured by using simple processes to ensure different electrical properties according to kinds and structures of unit devices included in the IC devices. Accordingly, IC devices having optimum reliability and performance may be easily manufactured.

While some example embodiments of inventive concepts have been particularly shown and described, it will be understood that various changes in form and details may be made therein without departing from the spirit and scope of the following claims.

What is claimed is:

1. An integrated circuit device comprising:
a substrate including a first region and a second region;
first fin-type active regions protruding from the substrate in the first region, each of the first fin-type active regions including first recesses having first depths from first top surfaces of the first fin-type active regions, respectively;
a first device isolation film covering both sidewalls of each of the first fin-type active regions, the first device isolation film having a first minimum thickness in a vertical direction;
first source/drain regions filling the first recesses, the first source/drain regions each having a first maximum width at a first level of a first vertical distance from the substrate;
second fin-type active regions protruding from the substrate in the second region, each of the second fin-type active regions including second recesses having second depths from second top surfaces of the second fin-type active regions, respectively, the second depths being greater than the first depths, a number of the first fin-type active regions being different from a number of the second fin-type active regions;
a second device isolation film covering both sidewalls of each of the second fin-type active regions, the second device isolation film having a second minimum thickness in the vertical direction, the second minimum thickness being greater than the first minimum thickness; and second source/drain regions filling the second recesses, the second source/drain regions each having a second maximum width at a second level of a second vertical distance from the substrate, the second vertical distance being smaller than the first vertical distance,
wherein the second maximum width of the second source/drain regions is greater than the first maximum width of the first source/drain regions.

2. The integrated circuit device of claim 1, wherein a pitch of the first fin-type active regions is different from a pitch of the second fin-type active regions.

3. The integrated circuit device of claim 1, wherein the first region is one selected from a logic region and a static random access memory (SRAM) region, and the second region is the other selected from the logic region and the SRAM region.

4. The integrated circuit device of claim 1, wherein at least one of the first source/drain regions and the second source/drain regions comprises SiC.

5. The integrated circuit device of claim 1, further comprising:
a first fin insulating spacer disposed on a sidewall of each of the first source/drain regions; and
a second fin insulating spacer disposed on a sidewall of each of the second source/drain regions and spaced apart from each of the second-fin type active regions that is adjacent thereto,
wherein each of the first source/drain regions laterally extend over the first fin insulating spacer that is adjacent thereto, and each of the second source/drain regions laterally extend over the second fin insulating spacer that is adjacent thereto.

6. The integrated circuit device of claim 1, further comprising:
a first fin insulating spacer disposed on a sidewall of each of the first source/drain regions; and
a second fin insulating spacer disposed on a sidewall of each of the second source/drain regions,
wherein the first fin insulating spacer and the second fin insulating spacer comprise silicon oxycarbonitride (SiOCN) or silicon carbonitride (SiCN).

7. The integrated circuit device of claim 1, further comprising:
a first fin insulating spacer disposed on a sidewall of each of the first source/drain regions;
a second fin insulating spacer disposed on a sidewall of each of the second source/drain regions;
a first gate line on the substrate, the first gate line extending in a direction intersecting the first fin-type active regions in the first region;
a first gate insulating spacer disposed on a sidewall of the first gate line;
a second gate line on the substrate, the second gate line extending in a direction intersecting the second fin-type active regions in the second region; and
a second gate insulating spacer disposed on a sidewall of the second gate line,
wherein the first fin insulating spacer and the second fin insulating spacer comprise a first material, and the first gate insulating spacer and the second gate insulating spacer comprise a second material that is the same as the first material.

8. The integrated circuit device of claim 7, wherein the first gate insulating spacer and the second gate insulating spacer comprise silicon nitride (SiN), silicon oxycarbonitride (SiOCN), or silicon carbonitride (SiCN).

9. The integrated circuit device of claim 1, further comprising:
a first gate line extending in a direction intersecting the first fin-type active regions in the first region; and
a second gate line extending in a direction intersecting the second fin-type active regions in the second region,
wherein the first gate line and the second gate line comprise titanium nitride (TiN), tantalum nitride (TaN), titanium aluminide (TiA), titanium aluminum carbide (TiAC), titanium aluminum nitride (TiAlN), titanium carbide (TiC), tantalum carbide (TaC), hafnium silicide (HfSi), or a combination thereof.

10. An integrated circuit device comprising:
a substrate including a first region and a second region;
first fin-type active regions on the substrate in the first region;
second fin-type active regions on the substrate in the second region, a number of the first fin-type active regions being different from a number of the second fin-type active regions;
a first device isolation film covering both sidewalls of each of the first fin-type active regions, the first device isolation film having a first minimum thickness in a vertical direction;
a second device isolation film covering both sidewalls of each of the second fin-type active regions, the second device isolation film having a second minimum thickness in the vertical direction, the second minimum thickness being greater than the first minimum thickness;
a first gate line on the substrate, the first gate line extending in a first direction intersecting the first fin-type active regions in the first region;
a second gate line on the substrate, the second gate line extending in a second direction intersecting the second fin-type active regions in the second region;
first source/drain regions disposed in first recesses of the first fin-type active regions, the first recesses having first depths from first top surfaces of the first fin-type active regions, respectively; and
second source/drain regions disposed in second recesses of the second fin-type active regions, the second recesses having second depths from second top surfaces of the second fin-type active regions, respectively, the second depths being greater than the first depths,
wherein each of the first source/drain regions has a first maximum width in the first direction at a first level of a first vertical distance from the substrate, each of the second source/drain regions has a second maximum width in the second direction at a second level of a second vertical distance from the substrate, the second vertical distance is smaller than the first vertical distance, and the second maximum width is greater than the first maximum width.

11. The integrated circuit device of claim 10, wherein each of the first fin-type active regions has a first width in the first direction, and
wherein each of the second fin-type active regions has a second width in the second direction, the second width being equal to the first width.

12. The integrated circuit device of claim 10, wherein the first direction and the second direction are parallel to each other.

13. The integrated circuit device of claim 10, wherein a pitch of the first fin-type active regions is different from a pitch of the second fin-type active regions.

14. The integrated circuit device of claim 10, wherein at least one of the first source/drain regions and the second source/drain regions comprises SiC.

15. The integrated circuit device of claim 10, further comprising:
a first fin insulating spacer disposed on a sidewall of each of the first source/drain regions; and
a second fin insulating spacer disposed on a sidewall of each of the second source/drain regions and spaced apart from each of the second-fin type active regions that is adjacent thereto,
wherein the first fin insulating spacer and the second fin insulating spacer comprise silicon oxycarbonitride (SiOCN) or silicon carbonitride (SiCN).

16. The integrated circuit device of claim 10, further comprising:
a first gate insulating spacer disposed on a sidewall of the first gate line; and
a second gate insulating spacer disposed on a sidewall of the second gate line,
wherein the first gate insulating spacer and the second gate insulating spacer comprise silicon nitride (SiN), silicon oxycarbonitride (SiOCN), or silicon carbonitride (SiCN).

17. The integrated circuit device of claim 10, further comprising:
first fin insulating spacers disposed on the first device isolation film, the first fin insulating spacers covering the first source/drain regions; and
second fin insulating spacers disposed on the second device isolation film, the second fin insulating spacers covering the second source/drain regions.

18. The integrated circuit device of claim 10, wherein the first gate line and the second gate line comprise titanium nitride (TiN), tantalum nitride (TaN), titanium aluminide (TiA), titanium aluminum carbide (TiAlC), titanium aluminum nitride (TiAlN), titanium carbide (TiC), tantalum carbide (TaC), hafnium silicide (HfSi), or a combination thereof.

19. An integrated circuit device comprising:
a substrate including a first region and a second region;
first fin-type active regions on the substrate in the first region;
second fin-type active regions on the substrate in the second region, a number of the first fin-type active regions is different from a number of the second fin-type active regions;
a first device isolation film covering both sidewalls of each of the first fin-type active regions, the first device isolation film having a first minimum thickness in a vertical direction;
a second device isolation film covering both sidewalls of each of the second fin-type active regions, the second device isolation film having a second minimum thickness in the vertical direction, the second minimum thickness being greater than the first minimum thickness;
a first gate line on the substrate, the first gate line extending in a first direction intersecting the first fin-type active regions;
a second gate line on the substrate, the second gate line extending in a second direction intersecting the second fin-type active regions;
first source/drain regions disposed in first recesses of the first fin-type active regions, each of the first source/drain regions having a first maximum width in the first direction at a first level of a first vertical distance from the substrate, the first recesses having first depths from first top surfaces of the first fin-type active regions, respectively;
second source/drain regions disposed in second recesses of the second fin-type active regions, each of the second source/drain regions having a second maximum width in the second direction at a second level of a second vertical distance from the substrate, the second vertical distance being smaller than the first vertical distance, the second maximum width being greater than the first maximum width, the second recesses having second depths from second top surfaces of the second fin-type active regions, respectively, the second depths being greater than the first depths;
a first fin insulating spacer disposed on a sidewall of each of the first source/drain regions; and
a second fin insulating spacer disposed on a sidewall of each of the second source/drain regions.

20. The integrated circuit device of claim 19, wherein the first fin insulating spacer and the second fin insulating spacer comprise silicon oxycarbonitride (SiOCN) or silicon carbonitride (SiCN).

* * * * *